(12) United States Patent
Suzawa et al.

(10) Patent No.: US 10,403,646 B2
(45) Date of Patent: Sep. 3, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Hideomi Suzawa, Kanagawa (JP); Yuta Endo, Kanagawa (JP); Kazuya Hanaoka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 390 days.

(21) Appl. No.: 15/041,502

(22) Filed: Feb. 11, 2016

(65) Prior Publication Data
US 2016/0247832 A1    Aug. 25, 2016

(30) Foreign Application Priority Data

Feb. 20, 2015    (JP) ................. 2015-032252

(51) Int. Cl.
*H01L 27/12* (2006.01)
*H01L 29/786* (2006.01)
(Continued)

(52) U.S. Cl.
CPC ...... *H01L 27/1225* (2013.01); *H01L 27/1207* (2013.01); *H01L 29/7869* (2013.01);
(Continued)

(58) Field of Classification Search
CPC ........... H01L 29/7869; H01L 29/78696; H01L 29/42372; H01L 29/42376; H01L 21/475; H01L 21/47573
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — David C Spalla
(74) *Attorney, Agent, or Firm* — Fish & Richardson P.C.

(57) ABSTRACT

A semiconductor device with reduced parasitic capacitance is provided. The semiconductor device includes a first insulating layer; a first oxide layer over the first insulating layer; a semiconductor layer over the first oxide layer; a source electrode layer and a drain electrode layer over the semiconductor layer; a second insulating layer over the first insulating layer; a third insulating layer over the second insulating layer, the source electrode layer, and the drain electrode layer; a second oxide layer over the semiconductor layer; a gate insulating layer over the second oxide layer; a gate electrode layer over the gate insulating layer; and a fourth insulating layer over the third insulating layer, the second oxide layer, the gate insulating layer, and the gate electrode layer.

10 Claims, 55 Drawing Sheets

(51) Int. Cl.
    *H01L 21/475*    (2006.01)
    *H01L 21/4757*   (2006.01)
(52) U.S. Cl.
    CPC ...... *H01L 29/78696* (2013.01); *H01L 21/475* (2013.01); *H01L 21/47573* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,524,752 B2 | 4/2009 | Tsutsue |
| 7,674,650 B2 | 3/2010 | Akimoto et al. |
| 7,732,819 B2 | 6/2010 | Akimoto et al. |
| 7,989,334 B2 | 8/2011 | Tsutsue |
| 8,421,068 B2 | 4/2013 | Yamazaki et al. |
| 8,421,069 B2 | 4/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0124125 A1 | 6/2005 | Jin et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0240990 A1 | 10/2011 | Yamazaki |
| 2012/0025191 A1 | 2/2012 | Yamazaki |
| 2015/0270402 A1 | 9/2015 | Endo et al. |
| 2015/0280013 A1 | 10/2015 | Yamazaki et al. |
| 2015/0372009 A1 | 12/2015 | Yamazaki |
| 2016/0218219 A1* | 7/2016 | Asami ................. H01L 29/0649 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by

(56) References Cited

OTHER PUBLICATIONS

Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1:Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and GaZO3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (GaZO3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal TRANSITION:The "Blue Phase",", Physics Letters, Sep. 10, 1973, vol. 45A, No. 2, pp. 115-116.

Cho.D et al., "21.2:AL and Sn-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and its Bending Properties,", SID Digest '09 : SID International Symposium Digest of Technical Papers, May 31, 2009, pp. 983-985.

Sakata.J et al., "Development of 4.0-in. Amoled Display With Driver Circuit Using Amorphous In—Ga—Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size Amoled,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (Zno Tfts) for Amlcds,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 33, pp. 1330-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 in. QVGA Amoled Display Using In—Ga—Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZn04,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW'08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

FIG. 7A
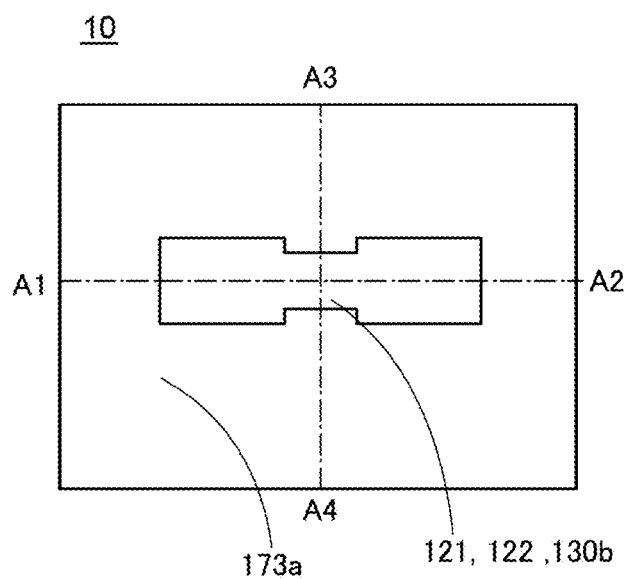
FIG. 7B
FIG. 7C
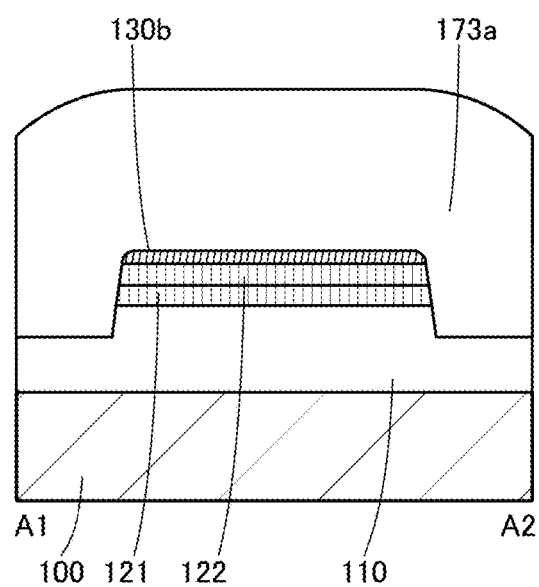
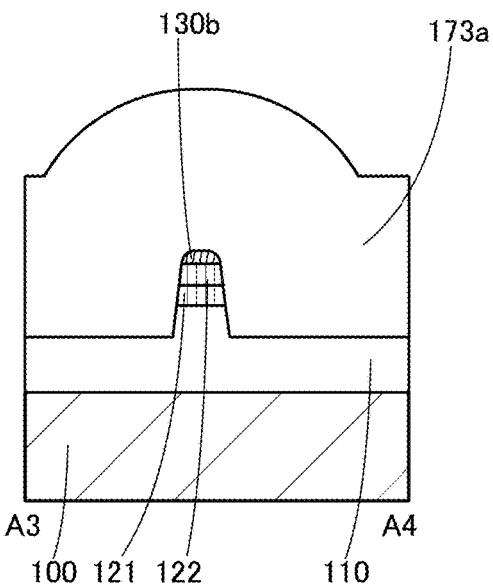

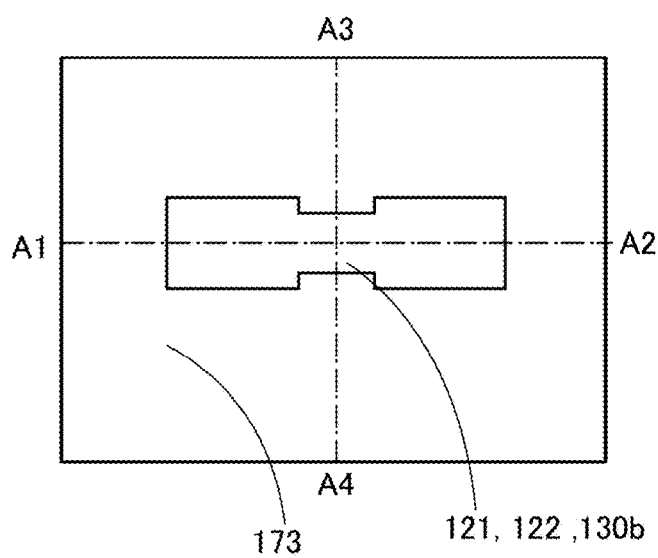
FIG. 8A
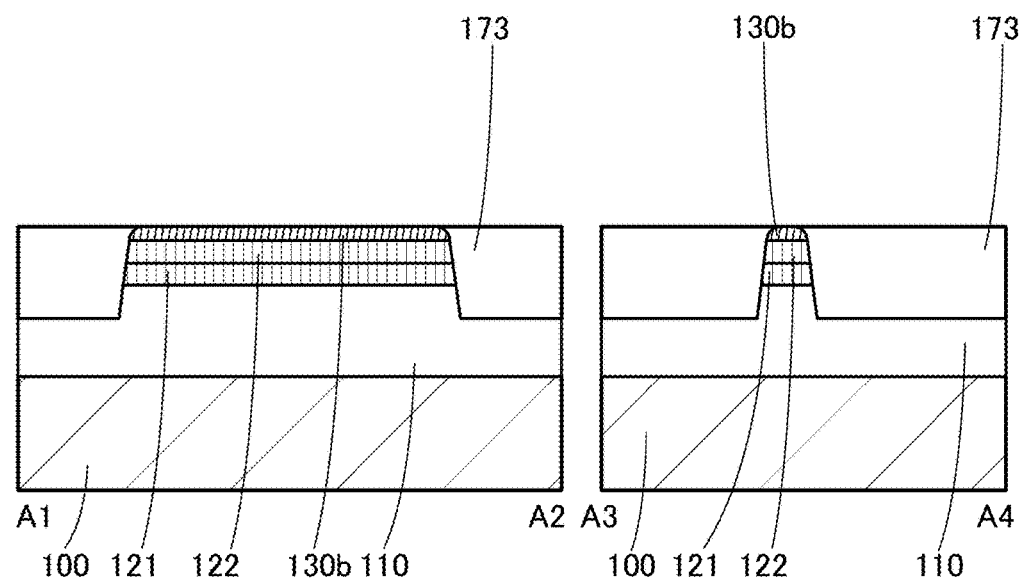
FIG. 8B
FIG. 8C

FIG. 10A
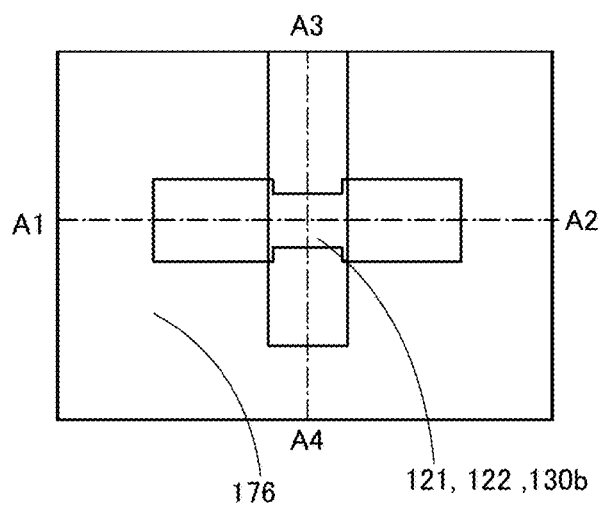
FIG. 10B    FIG. 10C
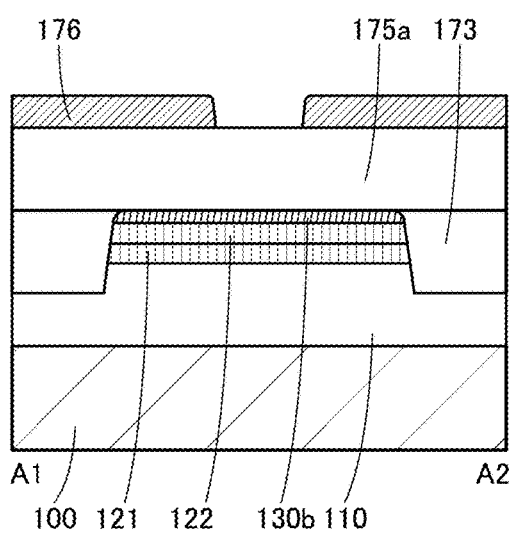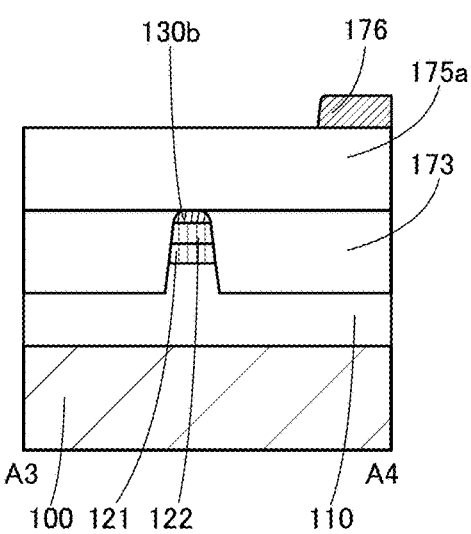

FIG. 12A
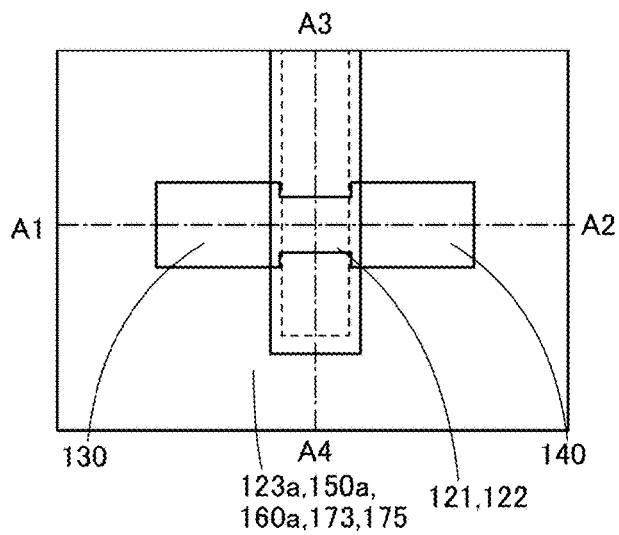
FIG. 12B
FIG. 12C
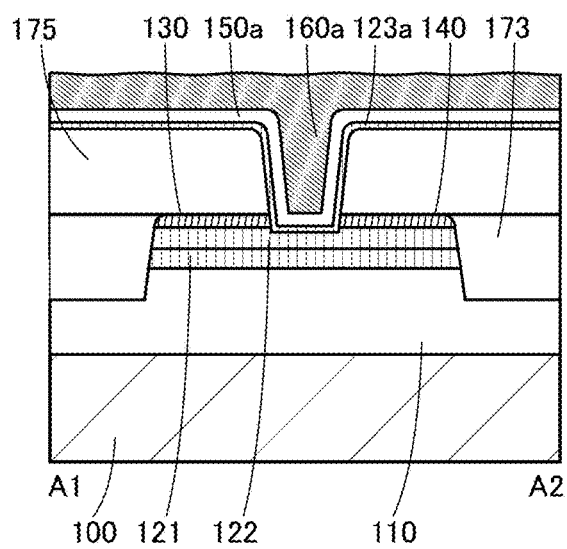 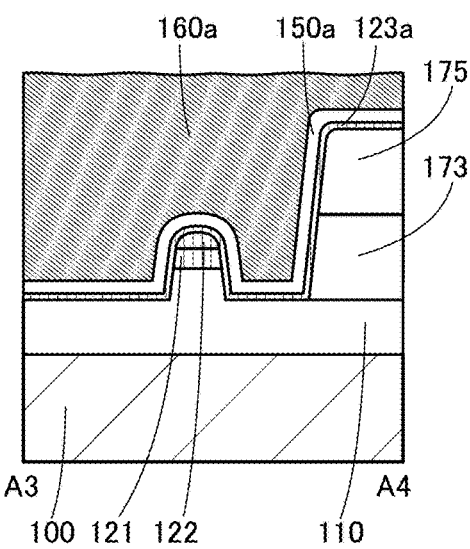

FIG. 17A
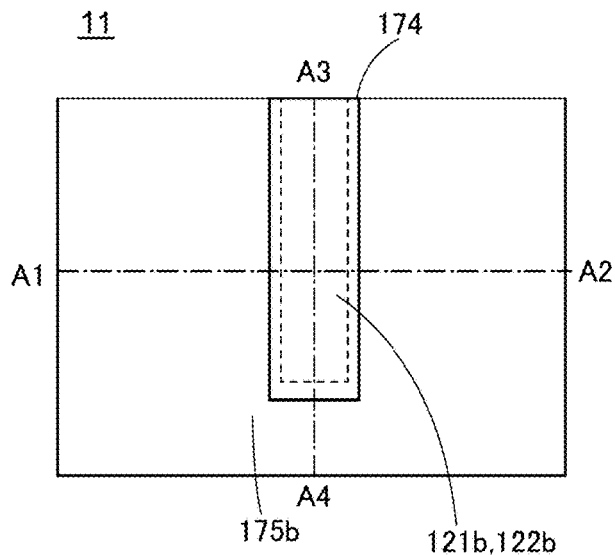
FIG. 17B
FIG. 17C
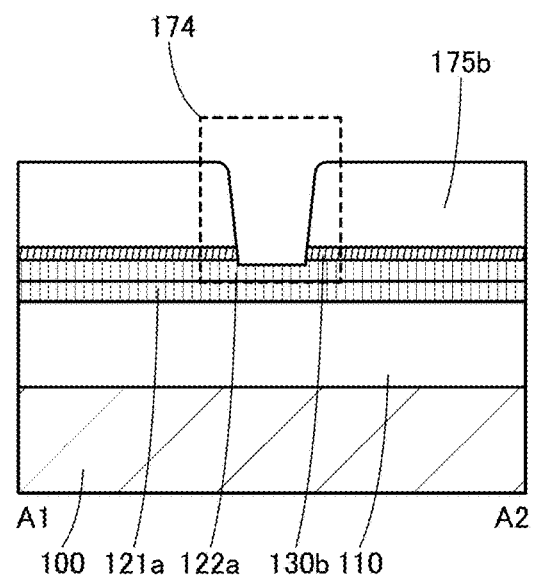
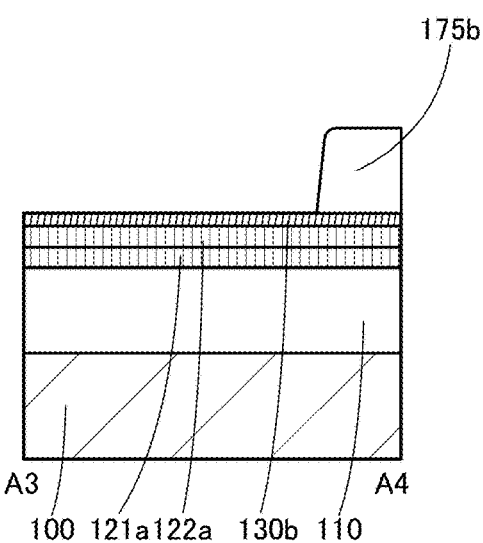

FIG. 21A
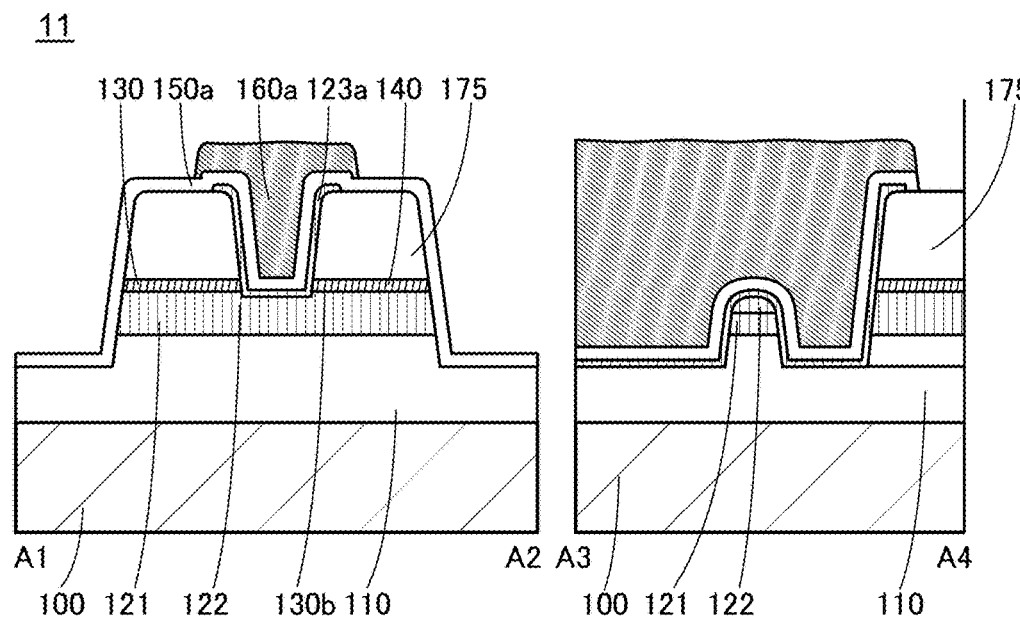
FIG. 21B
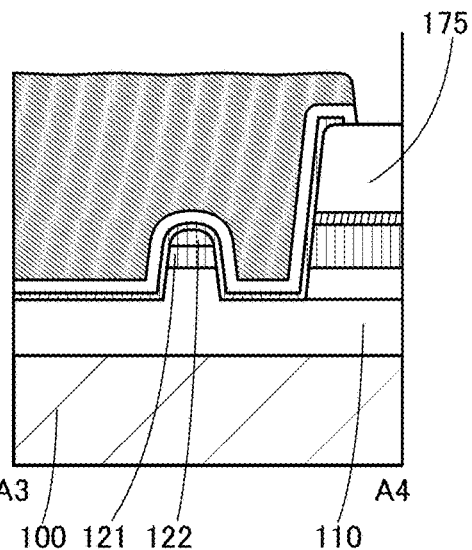
FIG. 21C
FIG. 21D
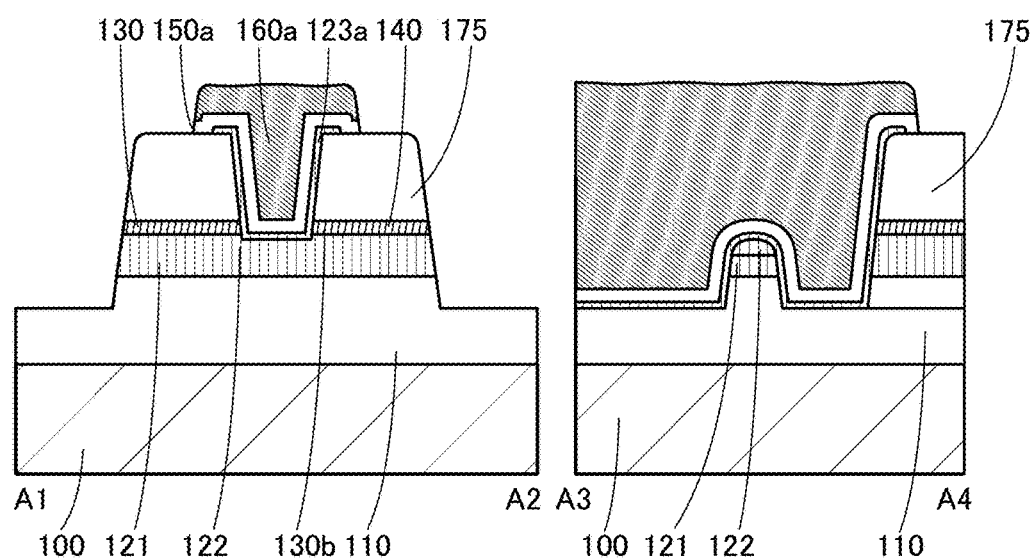

FIG. 24A
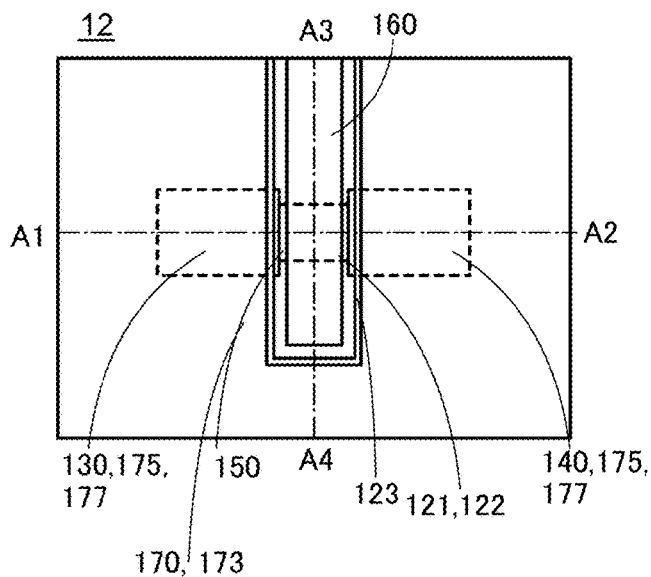
FIG. 24B
FIG. 24C
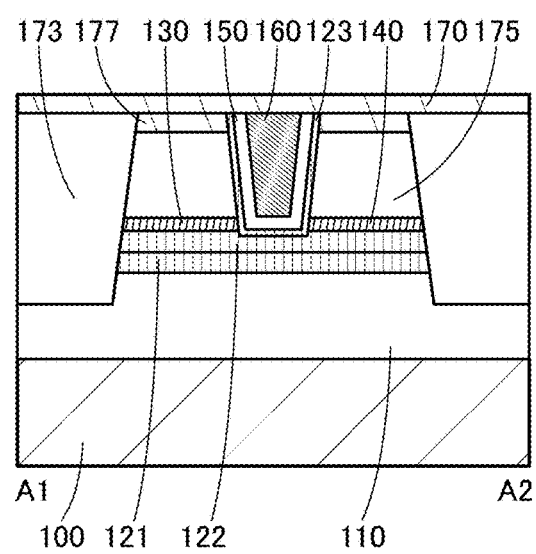
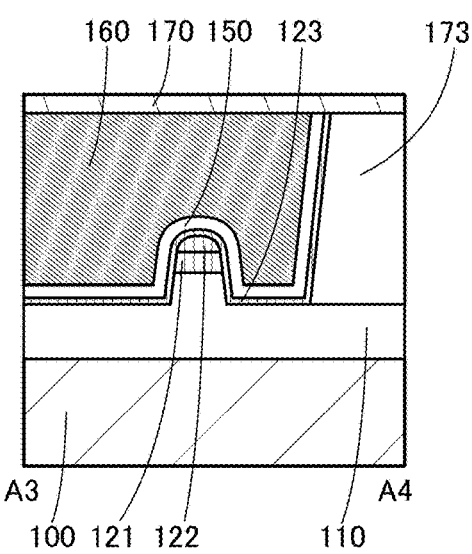

FIG. 27A
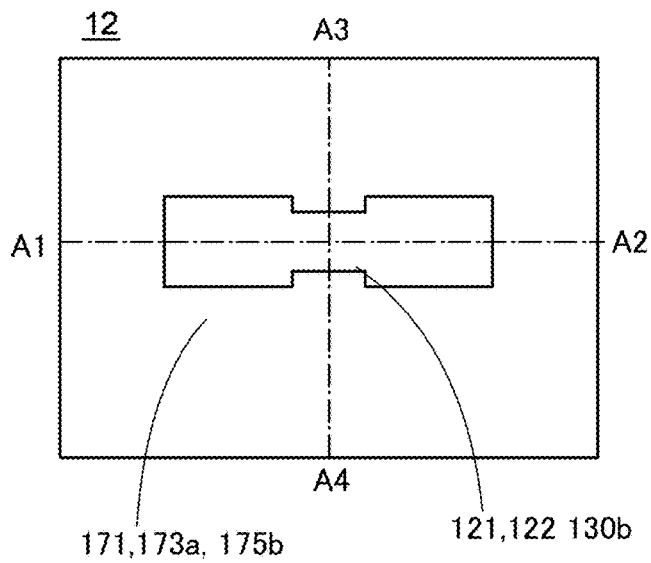
FIG. 27B  FIG. 27C
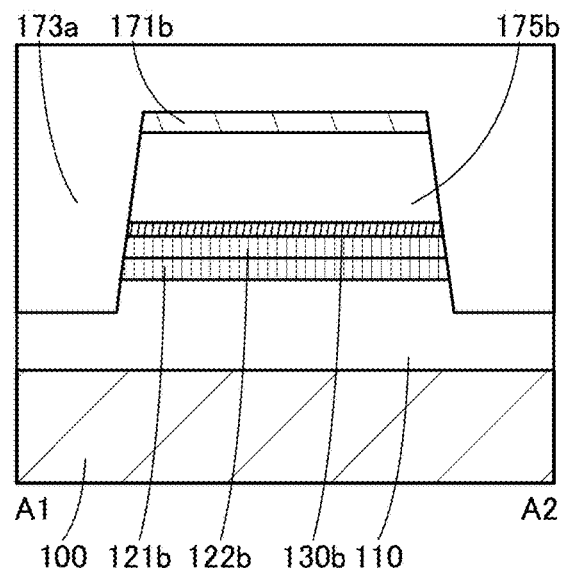 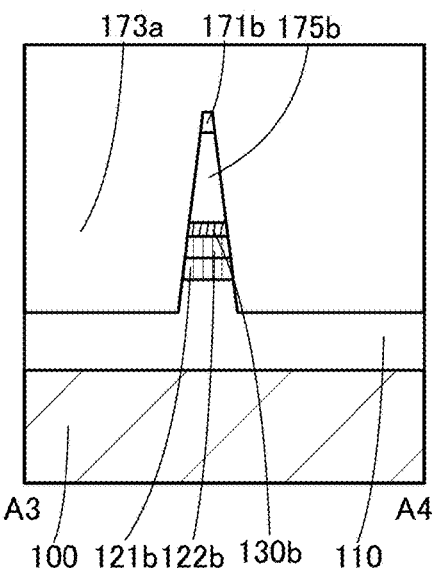

FIG. 29A
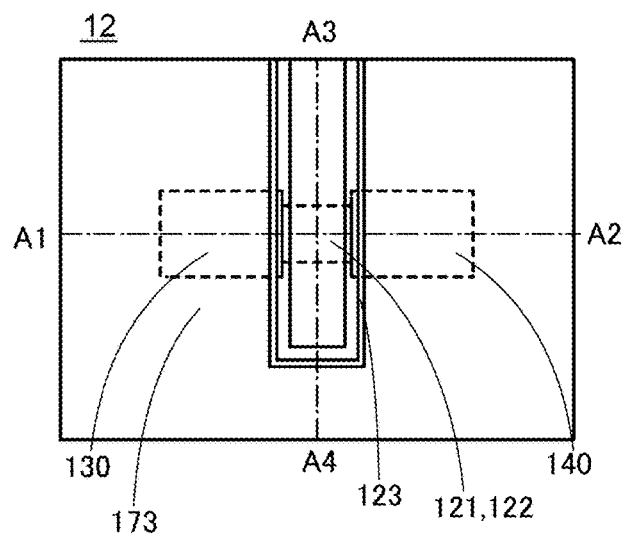
FIG. 29B
FIG. 29C
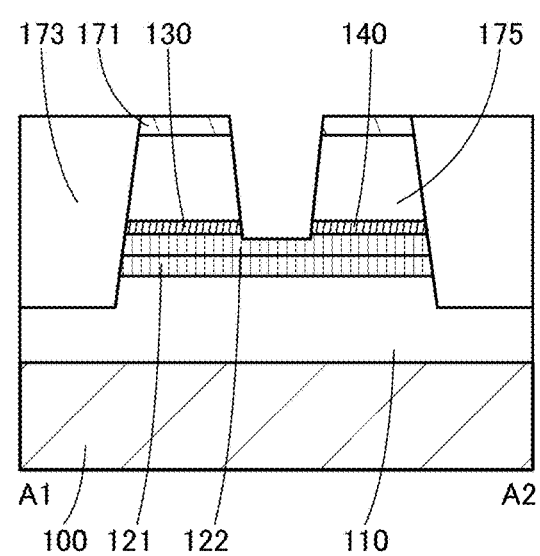 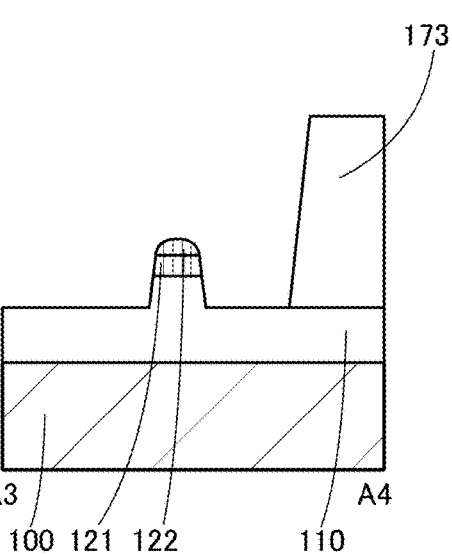

FIG. 31A
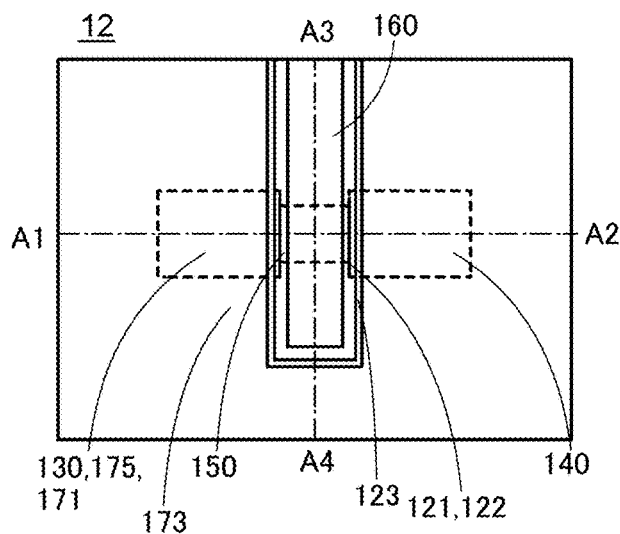
FIG. 31B
FIG. 31C
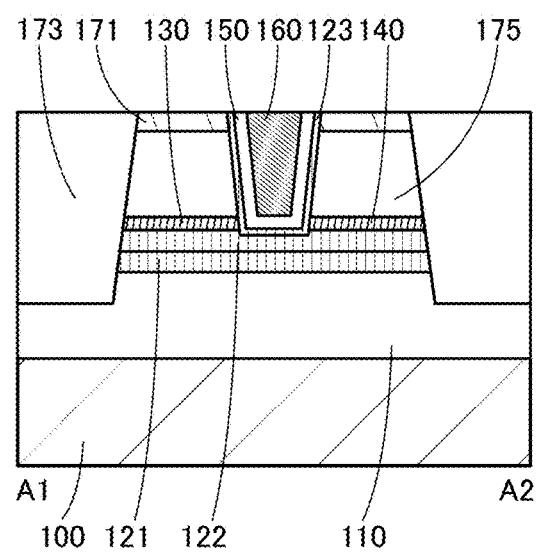
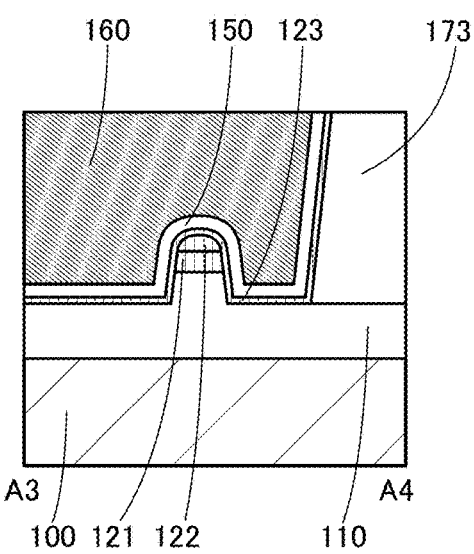

FIG. 32A
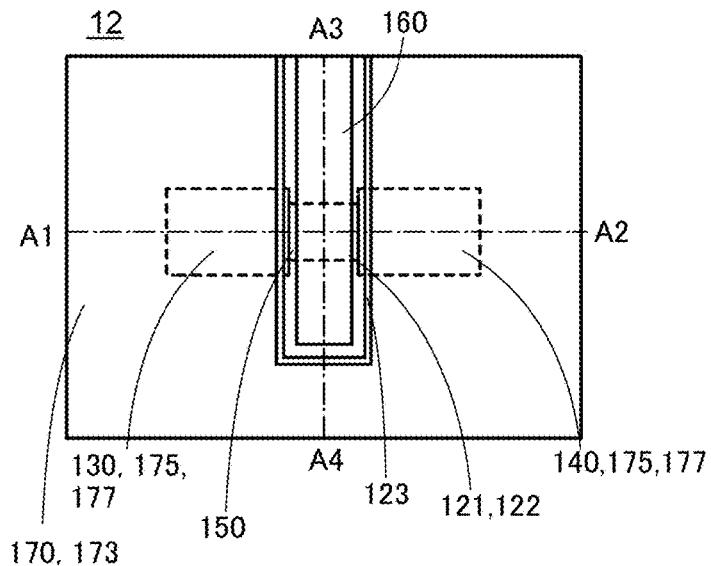
FIG. 32B
FIG. 32C
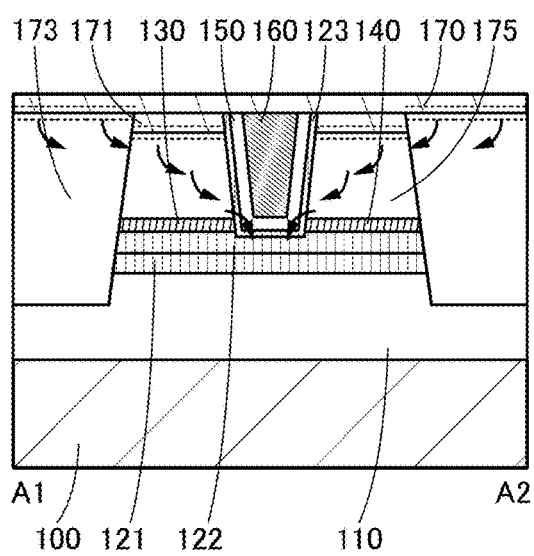
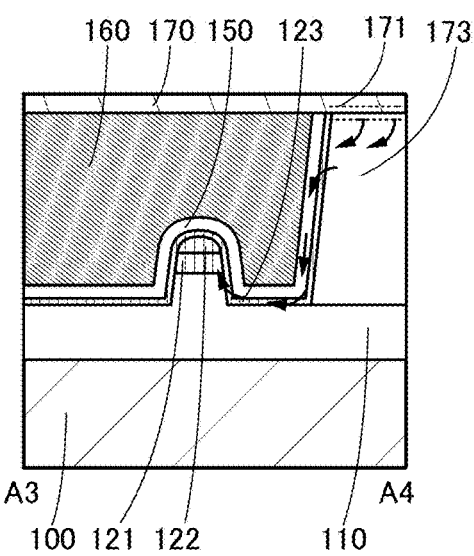

FIG. 34A
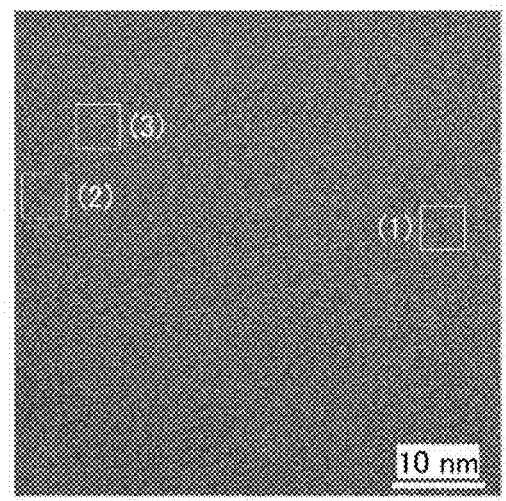
FIG. 34B          FIG. 34C          FIG. 34D
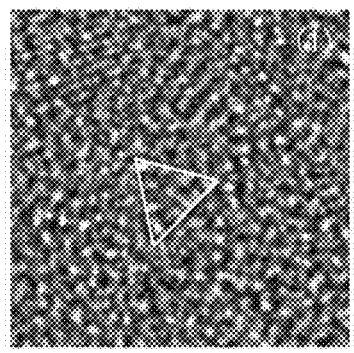 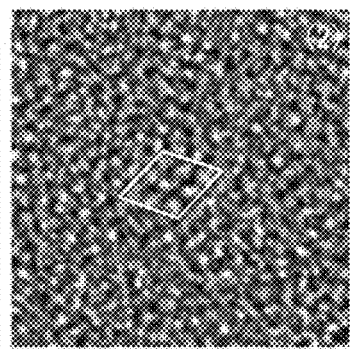 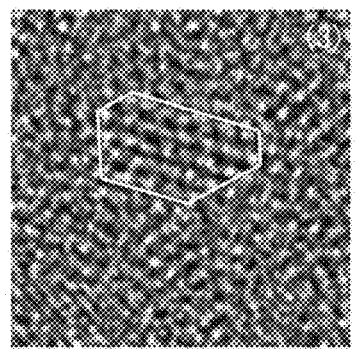

FIG. 36A
FIG. 36B
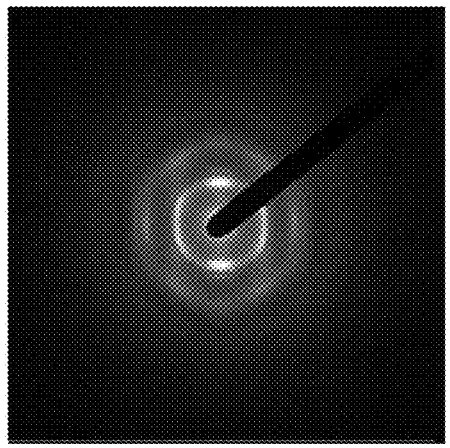
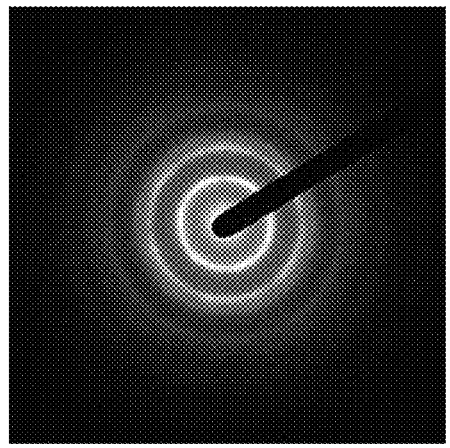

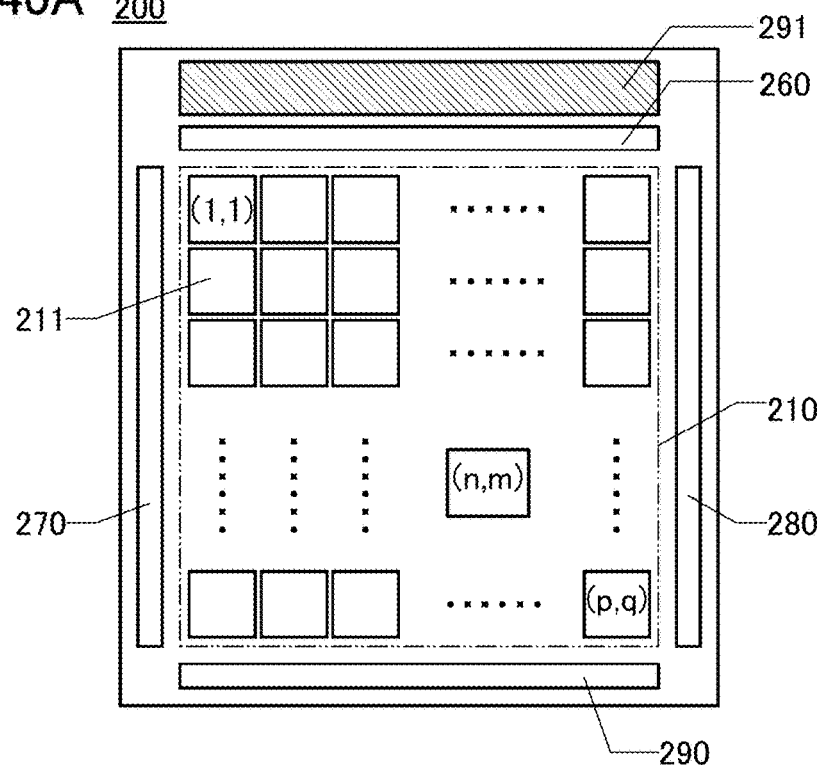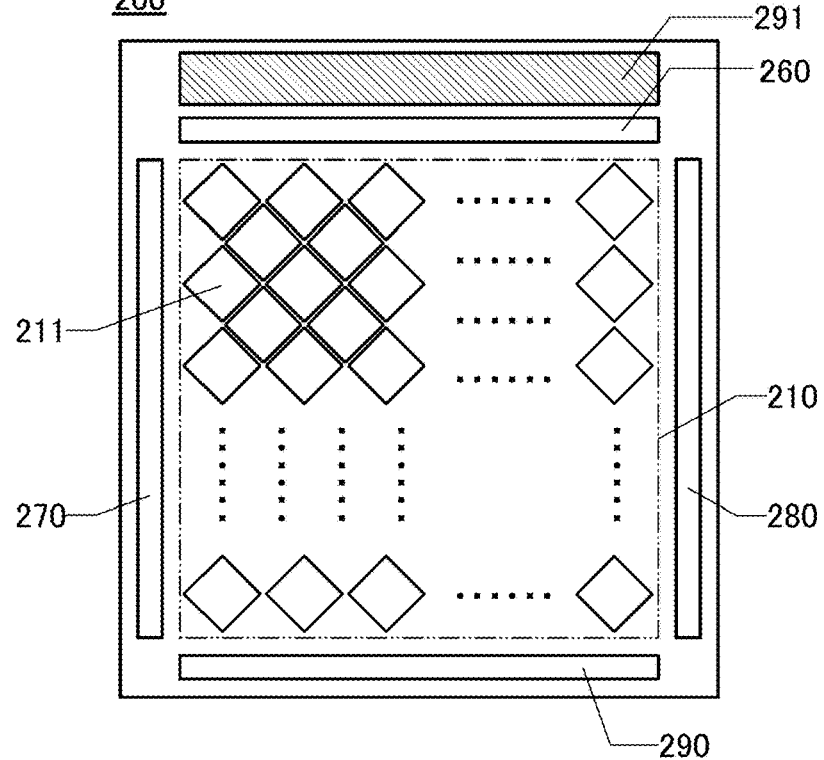

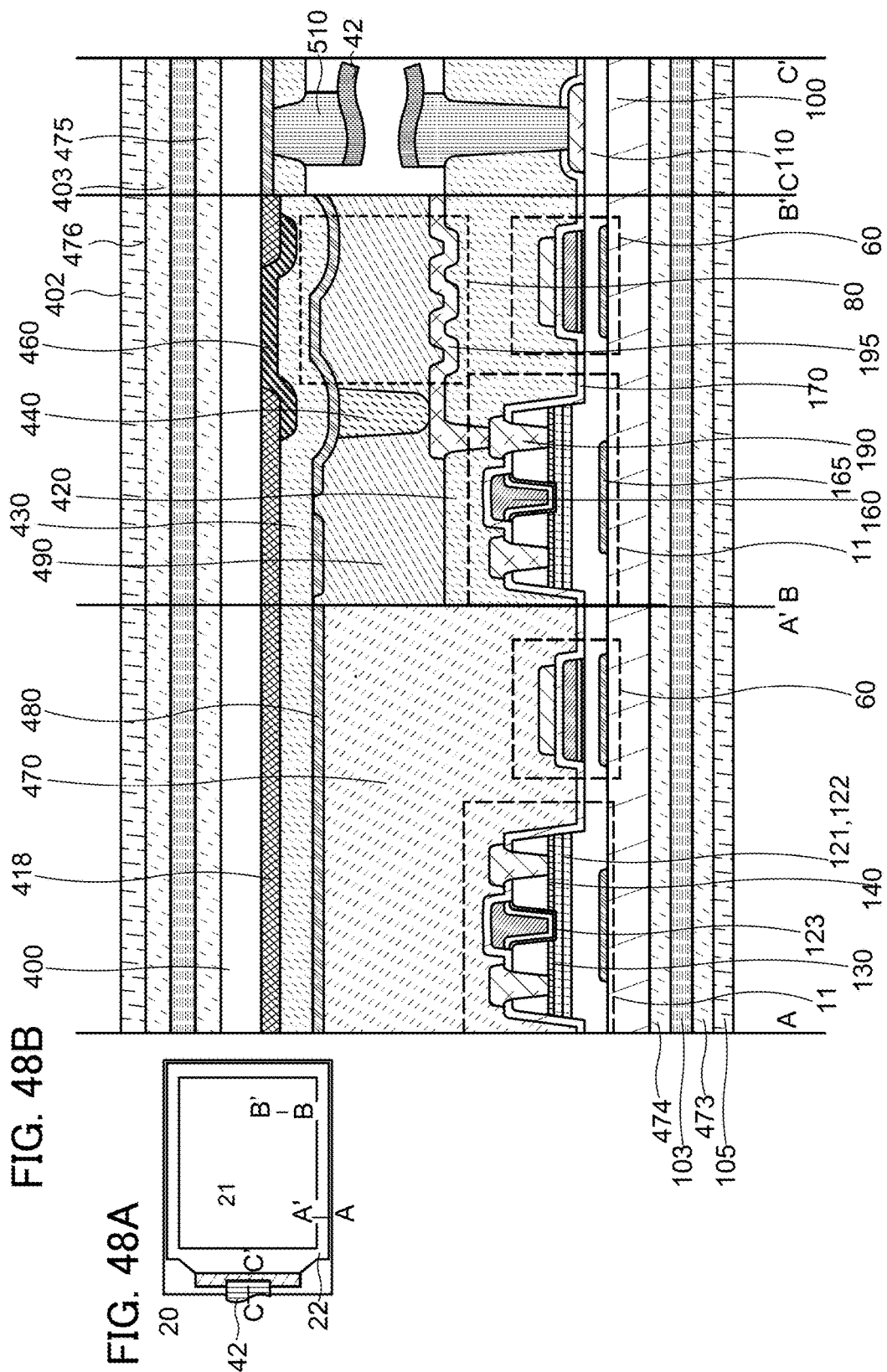

4000

4000

4000

4000

4000

4000

SEMICONDUCTOR DEVICE AND METHOD FOR MANUFACTURING THE SAME

BACKGROUND OF THE INVENTION

1. Field of the Invention

The present invention relates to an object, a method, or a manufacturing method. Further, the present invention relates to a process, a machine, manufacture, or a composition of matter. In particular, the present invention relates to, for example, a semiconductor device, a display device, a light-emitting device, a power storage device, an imaging device, a driving method thereof, or a manufacturing method thereof. In particular, one embodiment of the present invention relates to a semiconductor device or a method for manufacturing the semiconductor device.

In this specification and the like, a semiconductor device generally means a device that can function by utilizing semiconductor characteristics. A transistor and a semiconductor circuit are embodiments of semiconductor devices. In some cases, a storage device, a display device, or an electronic device includes a semiconductor device.

2. Description of the Related Art

A technique by which transistors are formed using semiconductor films formed over a substrate having an insulating surface has been attracting attention. The transistor is used in a wide range of electronic devices such as an integrated circuit (IC) or an image display device (display device). As semiconductor thin films that can be used for the transistors, silicon-based semiconductor materials have been widely known, but oxide semiconductors have been attracting attention as alternative materials.

For example, a transistor whose active layer includes an amorphous oxide semiconductor containing indium (In), gallium (Ga), and zinc (Zn) is disclosed in Patent Document 1.

REFERENCE

Patent Document

[Patent Document 1] Japanese Translation of PCT International Application No. H11-505377

SUMMARY OF THE INVENTION

In miniaturization of a semiconductor element, the parasitic capacitance generated in the vicinity of a transistor is a major problem.

In the case where parasitic capacitance exists in a channel (e.g., between a source electrode and a drain electrode) and the vicinity of the channel, a time for charging the parasitic capacitance is needed in the transistor operation; thus, not only the responsiveness of the transistor but the responsiveness of the semiconductor device is lowered.

It becomes more difficult to control various steps of manufacturing transistors (in particular, film formation, processing, and the like) as the miniaturization advances, and variations due to the manufacturing process significantly affect transistor characteristics and reliability.

In miniaturization, it becomes more difficult to process the transistors owing to higher accuracy required for the processing.

Thus, an object of one embodiment of the present invention is to reduce the parasitic capacitance in the vicinity of a transistor. Another object is to provide a semiconductor device with favorable electrical characteristics. Another object is to provide a semiconductor device with high reliability. Another object is to reduce variations in characteristics caused by a manufacturing process of a transistor or a semiconductor device. Another object is to stabilize a manufacturing process of a transistor. Another object is to provide a semiconductor device including an oxide semiconductor layer having few oxygen vacancies. Another object is to provide a semiconductor device that can be manufactured in a simple process. Another object is to provide a semiconductor device with a structure in which the density of interface states in the vicinity of the oxide semiconductor layer can be reduced. Another object is to provide a semiconductor device with low power consumption. Another object is to provide a novel semiconductor device or the like. Another object is to provide a method for manufacturing the semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulating layer; a first oxide layer over the first insulating layer; a semiconductor layer over the first oxide layer; a source electrode layer and a drain electrode layer over the semiconductor layer; a second insulating layer over the first insulating layer; a third insulating layer over the second insulating layer, the source electrode layer, and the drain electrode layer; a second oxide layer over the semiconductor layer; a gate insulating layer over the second oxide layer; a gate electrode layer over the gate insulating layer; and a fourth insulating layer over the third insulating layer, the second oxide layer, the gate insulating layer, and the gate electrode layer. The second insulating layer includes a region in contact with the side surfaces of the first oxide layer, the semiconductor layer, the source electrode layer, and the drain electrode layer. The top surface of the second insulating layer is at the same level as the top surfaces of the source electrode layer and the drain electrode layer. The second oxide layer includes a region in contact with the side surfaces of the first oxide layer, the source electrode layer, the drain electrode layer, the second insulating layer, and the third insulating layer.

Another embodiment of the present invention is a method for manufacturing a semiconductor device including the steps of forming a first insulating layer; forming a first oxide film over the first insulating layer; forming a semiconductor film over the first oxide film; forming a first conductive film over the semiconductor film; forming a first mask over the first conductive film; partly etching the first conductive film with the first mask to form a first conductive layer in an island shape; partly etching the first oxide film and the semiconductor film with the first mask and the first conductive layer serving as a mask to form a first oxide layer and a semiconductor layer in island shapes; forming a second insulating film over the first insulating layer and the first conductive layer; performing a chemical mechanical polishing process on the second insulating film until the first conductive layer is exposed to form a second insulating layer; forming a third insulating film over the first conductive layer and the second insulating layer; forming a second mask over the third insulating film; partly etching the third insulating film with the second mask to form a source electrode layer, a drain electrode layer, and a third insulating layer; forming a second oxide film over the third insulating layer and the semiconductor layer; forming a fourth insulating film over the second oxide film; forming a second conductive film over the fourth insulating film; and performing a chemical mechanical polishing process on the second conductive film, the fourth insulating film, and the second oxide film to form a second oxide layer, a gate insulating layer, and a gate electrode layer.

It is preferable that first heat treatment be performed after the semiconductor film is formed, that a fourth insulating layer containing oxygen be formed over the third insulating layer, the second oxide layer, the gate insulating layer, and the gate electrode layer, that a mixed layer of the third insulating layer and the fourth insulating layer be formed when the fourth insulating layer is formed and, at the same time, oxygen be added to the mixed layer or the first insulating layer, and that second heat treatment be performed to diffuse the oxygen to the semiconductor layer.

It is preferable that the third insulating film be an insulating film containing oxygen, and that the fourth insulating layer be formed by a sputtering method with an oxygen gas.

It is preferable that the third insulating film be a silicon oxide film, and that the fourth insulating layer be formed by a sputtering method with an oxygen gas of 50 vol % or higher and an aluminum oxide target.

It is preferable that the second heat treatment be performed at a temperature higher than or equal to 300° C. and lower than or equal to 450° C.

Another embodiment of the present invention is a method for manufacturing a semiconductor device including the steps of forming a first insulating layer; forming a first oxide film over the first insulating layer; forming a semiconductor film over the first oxide film; forming a first conductive film over the semiconductor film; forming a second insulating film over the first conductive film; forming a first mask over the second insulating film; partly etching the second insulating film and the first conductive film with the first mask to form a first conductive layer and a second insulating layer; forming a second mask over the second insulating layer and the semiconductor film; partly etching the second insulating layer, the first conductive layer, the first oxide film, and the semiconductor film with the second mask to form a first oxide layer, a semiconductor layer, a source electrode layer, a drain electrode layer, and a third insulating layer; forming a second oxide film over the first insulating layer, the third insulating layer, and the semiconductor layer; forming a third insulating film over the second oxide film; forming a second conductive film over the third insulating film; forming a third mask over the second conductive film; and partly etching the second oxide film, the third insulating film, and the second conductive film with the third mask to form a second oxide layer, a gate insulating layer, and a gate electrode layer.

It is preferable that first heat treatment be performed after the semiconductor film is formed, that a fourth insulating layer containing oxygen be formed over the first insulating layer, the third insulating layer, and the gate electrode layer, that a first mixed layer of the first insulating layer and a fourth insulating layer and a second mixed layer of the third insulating layer and the fourth insulating layer be formed when the fourth insulating layer is formed and, at the same time, oxygen be added to the first mixed layer, the second mixed layer, the first insulating layer, or the second insulating layer, and that second heat treatment be performed to diffuse the oxygen to the semiconductor layer.

It is preferable that each of the first insulating film and the second insulating film be an insulating film containing oxygen, and that the fourth insulating layer be formed by a sputtering method with an oxygen gas.

It is preferable that each of the first insulating film and the second insulating film be a silicon oxide film, and that the fourth insulating layer be formed by a sputtering method with an oxygen gas of 50 vol % or higher and an aluminum oxide target.

It is preferable that the second heat treatment be performed at a temperature higher than or equal to 300° C. and lower than or equal to 450° C.

Another embodiment of the present invention is a method for manufacturing a semiconductor device including the steps of forming a first insulating layer; forming a first oxide film over the first insulating layer; forming a semiconductor film over the first oxide film; forming a first conductive film over the semiconductor film; forming a second insulating film over the first conductive film; forming a third insulating film over the second insulating film; forming a first mask over the third insulating film; partly etching the third insulating film, the second insulating film, the first conductive film, the semiconductor film, and the first oxide film with the first mask to form a first oxide layer, a semiconductor layer, a second insulating layer, and a third insulating layer in island shapes; forming a fourth insulating film over the first insulating layer and the third insulating layer; performing a chemical mechanical polishing process on the fourth insulating film until the third insulating layer is exposed to form a fourth insulating layer; forming a second mask over the fourth insulating layer and the third insulating layer; forming a source electrode layer, a drain electrode layer, a fifth insulating layer, and a sixth insulating layer with the second mask; forming a second oxide film over the fourth insulating layer, the sixth insulating layer, and the semiconductor layer; forming a fifth insulating film over the second oxide film; forming a second conductive film over the fifth insulating film; and performing a chemical mechanical polishing process on the second conductive film, the fifth insulating film, and the second oxide film to form a second oxide layer, a gate insulating layer, and a gate electrode layer.

It is preferable that first heat treatment be performed after the semiconductor film is formed, that a mixed layer of the second insulating film and the third insulating film be formed when the third insulating film is formed and, at the same time, oxygen is added to the mixed layer or the second insulating film, that a seventh insulating layer be formed over the fourth insulating layer, the sixth insulating layer, the second oxide layer, the gate insulating layer, and the gate electrode layer, that a mixed layer of the fourth insulating layer and the seventh insulating layer be formed when the seventh insulating layer is formed and, at the same time, oxygen is added to the mixed layer or the fourth insulating layer, and that second heat treatment be performed to diffuse the oxygen to the semiconductor layer.

It is preferable that each of the second insulating film and the fourth insulating film be an insulating film containing oxygen, and that each of the third insulating film and the seventh insulating layer be formed by a sputtering method with an oxygen gas.

It is preferable that each of the second insulating film and the fourth insulating film be a silicon oxide film, and that each of the third insulating film and the seventh insulating layer be formed by a sputtering method with an oxygen gas of 50 vol % or higher and an aluminum oxide target.

It is preferable that the second heat treatment be performed at a temperature higher than or equal to 300° C. and lower than or equal to 450° C.

Any of the aforementioned semiconductor devices can be combined with a microphone, a speaker, and a housing.

According to one embodiment of the present invention, the parasitic capacitance in the vicinity of a transistor can be reduced. Alternatively, a semiconductor device with favorable electrical characteristics can be provided. Alternatively, a semiconductor device with high reliability can be provided. Alternatively, variations in characteristics caused by a manufacturing process of a transistor or a semiconductor device can be reduced. Alternatively, a manufacturing process of a transistor can be stabilized. Alternatively, a semiconductor device including an oxide semiconductor layer having few oxygen vacancies can be provided. Alternatively, a semiconductor device that can be manufactured in a simple process can be provided. Alternatively, a semiconductor device with a structure in which the density of interface states in the vicinity of the oxide semiconductor layer can be reduced can be provided. A semiconductor device with low power consumption can be provided. A novel semiconductor device or the like can be provided. A method for manufacturing the semiconductor device can be provided.

Note that the descriptions of these effects do not disturb the existence of other effects. In one embodiment of the present invention, there is no need to achieve all the effects. Other effects will be apparent from and can be derived from the description of the specification, the drawings, the claims, and the like.

BRIEF DESCRIPTION OF THE DRAWINGS

FIGS. 7A to 7C are a top view and cross-sectional views illustrating the method for manufacturing a transistor.

FIGS. 8A to 8C are a top view and cross-sectional views illustrating the method for manufacturing a transistor.

FIGS. 10A to 10C are a top view and cross-sectional views illustrating the method for manufacturing a transistor.

FIGS. 12A to 12C are a top view and cross-sectional views illustrating the method for manufacturing a transistor.

FIGS. 17A to 17C are a top view and cross-sectional views illustrating the method for manufacturing a transistor.

FIGS. 21A to 21D are cross-sectional views illustrating the method for manufacturing a transistor.

FIGS. 24A to 24C are a top view and cross-sectional views of a transistor.

FIGS. 27A to 27C are a top view and cross-sectional views illustrating the method for manufacturing a transistor.

FIGS. 29A to 29C are a top view and cross-sectional views illustrating the method for manufacturing a transistor.

FIGS. 31A to 31C are a top view and cross-sectional views illustrating the method for manufacturing a transistor.

FIGS. 32A to 32C are a top view and cross-sectional views illustrating the method for manufacturing a transistor.

FIGS. 34A to 34D are Cs-corrected high-resolution TEM images of a plane of a CAAC-OS.

FIGS. 36A and 36B show electron diffraction patterns of a CAAC-OS.

FIGS. 40A and 40B are plan views of an imaging device.

FIGS. 48A and 48B are a top view and a cross-sectional view illustrating a display device.

DETAILED DESCRIPTION OF THE INVENTION

Figure 1A:
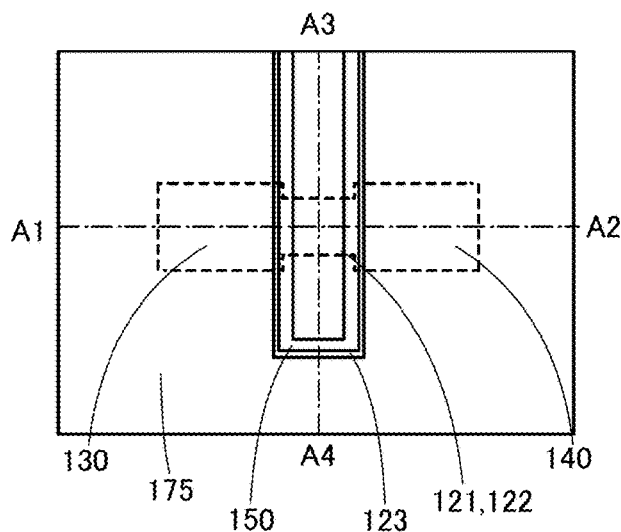
FIGS. 1A to 1C are a top view and cross-sectional views illustrating a transistor.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without being limited to a predetermined connection relation, for example, the connection relation illustrated in the drawings and the texts.

Here, X and Y each denote an object (e.g., a device, an element, a circuit, a wiring, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<Notes on the Description for Drawings>

In this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

The term "over" or "under" does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

In drawings, the size, the layer thickness, or the region is determined arbitrarily for description convenience. Therefore, embodiments of the present invention are not limited to such a scale. Note that the drawings are schematically illustrated for clarity, and embodiments of the present invention are not limited to shapes or values shown in the drawings.

In drawings such as a top view (also referred to as plan view or layout view) and a perspective view, some of components might not be illustrated for clarity of the drawings.

The expression "being the same" may refer to having the same area or the same shape or may refer to being at the same height in a perpendicular direction from a substrate surface. The same height can be restated as the same plane. In addition, the expression "being the same" include a case of "being substantially the same" because a manufacturing process might cause some differences in shape, plane, or height.

<Notes on Expressions that can be Rephrased>

In this specification or the like, in describing connections of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source.

Since the source and the drain of the transistor change depending on the structure, operating conditions, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

In this specification, ordinal numbers such as "first", "second", and "third" are used to avoid confusion among components, and thus do not limit the number of the components.

In this specification and the like, a structure in which a flexible printed circuit (FPC), a tape carrier package (TCP), or the like is attached to a substrate of a display panel, or a structure in which an integrated circuit (IC) is directly mounted on a substrate by a chip on glass (COG) method is referred to as a display device in some cases.

Note that the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

<Notes on Definitions of Terms>

The following are definitions of the terms in this specification and the like.

In this specification, the term "trench" or "groove" refers to a depression with a narrow belt shape.

In this specification, a silicon oxynitride film is described as $SiO_xN_y$ in some cases, for example. At this time, x and y may be natural numbers or decimals.

<<Connection>>

In this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, a semiconductor device which is one embodiment of the present invention and a manufacturing method thereof will be described with reference to drawings.

Figures 1B, 1C:
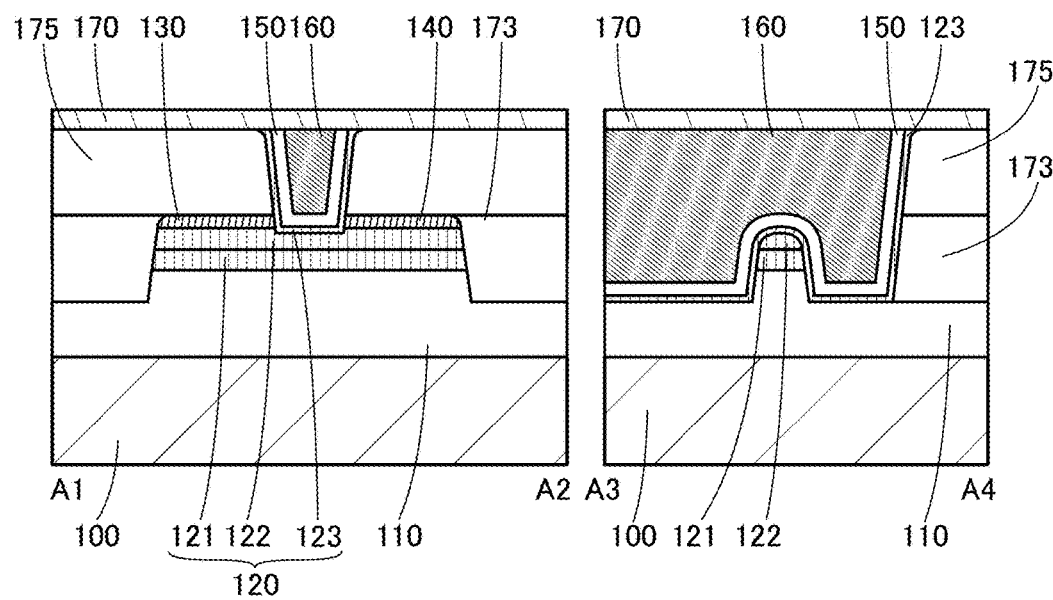

FIGS. 1A to 1C are a top view and cross-sectional views of a transistor 10 of one embodiment of the present invention. FIG. 1A is a top view, FIG. 1B is a cross-sectional view taken along the dashed-dotted line A1-A2 in FIG. 1A, and FIG. 1C is a cross-sectional view taken along the dashed-dotted line A3-4 in FIG. 1A. Note that in FIG. 1A, some components are scaled up or down in size or omitted for easy understanding. The directions of the dashed-dotted line A1-A2 and the dashed-dotted line A3-A4 can be referred to as a channel length direction and a channel width direction, respectively, in some cases.

The transistor 10 includes a substrate 100, an insulating layer 110, an insulator 121, a semiconductor layer 122, an insulator 123, a source electrode layer 130, a drain electrode layer 140, a gate insulating layer 150, a gate electrode layer 160, an insulating layer 175, an insulating layer 173, and an insulating layer 170. The transistor 10 includes the insulating layer 110 over the substrate 100. The transistor 10 includes the insulator 121 over the insulating layer 110. The transistor 10 includes the semiconductor layer 122 over the insulator 121. The transistor 10 includes the source electrode layer 130 and the drain electrode layer 140 over the semiconductor layer 122, and the source electrode layer 130 and the drain electrode layer 140 are electrically connected to the semiconductor layer 122. The transistor 10 includes the insulating layer 173, and the insulating layer 173 includes regions in contact with side surfaces of the insulator 121, the semiconductor layer 122, the insulator 123, the source electrode layer 130, and the drain electrode layer 140. The transistor 10 includes the insulating layer 175 over the insulating layer 173, the source electrode layer 130, and the drain electrode layer 140, and the insulating layer 175 includes a region in contact with a side surface of the insulator 123. The transistor 10 includes the insulator 123 over the semiconductor layer 122, and the insulator 123 includes regions in contact with side surfaces of the insulator 121, the insulating layer 173, and the insulating layer 175 as illustrated in FIG. 1C. The insulator 123 includes regions in contact with a bottom surface of the insulating layer 170 and side surfaces of the insulating layer 175, the source electrode layer 130, and the drain electrode layer 140 as illustrated in FIG. 1B. The transistor 10 includes the gate insulating layer 150 over the insulator 123. The transistor 10 includes the gate electrode layer 160 over the gate insulating layer 150.

<Insulator>

An insulator (e.g., the insulators 121 and 123) refers to a layer which basically has an insulating property and in which current can flow through the interface with the semiconductor layer and the vicinity thereof when a gate electric field or a drain electric field is increased.

The structure described above is characterized by its high heat dissipation effect: heat generated by the operation of the transistor 10 in the insulator 121, the semiconductor layer 122, and the insulator 123 can be sufficiently released because the semiconductor layer 122 and the insulator 123 each include regions in contact with the source electrode layer 130 and the drain electrode layer 140.

When the insulating layer 170 is formed, in the transistor 10, a mixed layer including materials of the insulating layers 175 and 170, a gas used during formation of the insulating layer 170, and the like is formed at the interface with the insulating layer 175, and oxygen (excess oxygen (exO)) is added to the mixed layer or the insulating layer 175. With heat treatment, the oxygen can be further diffused to the semiconductor layer 122, and oxygen vacancies that exist in the insulator 121 and the semiconductor layer 122 can be filled with the oxygen. Thus, transistor characteristics (e.g., a threshold voltage or reliability) can be improved.

The excess oxygen that is added during the formation of the insulating layer 170 exists in a variety of states such as an oxygen radical, an oxygen ion, or an oxygen atom during the formation by a sputtering method owing to the influence of applied voltage, power, plasma, substrate temperature, or the like. At this time, the excess oxygen is in a state of having higher energy than a stable state and thus can be taken into the insulating layer 175.

Note that the method of adding oxygen is not limited to the above method, and the insulating layer 110 may contain the excess oxygen during formation, or another method (e.g., an ion implantation method or an ion plasma immersion method) may be employed after the formation.

In the channel width direction of the transistor 10, the gate electrode layer 160 faces the side surfaces of the insulator 121, the semiconductor layer 122, and the insulator 123 with the gate insulating layer 150 therebetween as illustrated in the cross-sectional view of FIG. 1C taken along the dashed-dotted line A3-4. In other words, the insulator 121, the semiconductor layer 122, and the insulator 123 are surrounded by electric field of the gate electrode layer 160 in the channel width direction when voltage is applied to the gate electrode layer 160. The transistor structure in which the semiconductor layer 122 is surrounded by electric field of the gate electrode layer 160 is referred to as a surrounded channel (s-channel) structure. Furthermore, the gate electrode layer, the source electrode layer, and the drain electrode layer of the transistor 10 can be formed with a groove in a self-aligned manner; thus, alignment accuracy can be improved and miniaturized transistors can be easily manufactured. Note that such a structure described in this embodiment is referred to as a self-aligned (SA) s-channel FET structure, a trench-gate s-channel FET structure, a trench-gate self-aligned (TGSA) s-channel FET structure, or a gate-last self-aligned (GLSA) s-channel FET structure.

The insulator 121, the semiconductor layer 122, and the insulator 123 are collectively referred to as a semiconductor layer 120. When a transistor having the TGSA structure is in the on state, a channel is formed in the entire semiconductor layer 120 (bulk), so that the on-state current is increased. When the transistor having the TGSA structure is in the off state, the entire channel region formed in the semiconductor layer 120 can be depleted; thus, the off-state current can be further reduced.

In addition, the transistor 10 has the TGSA structure, whereby parasitic capacitance generated between the gate electrode and the source electrode or between the gate electrode and the drain electrode is reduced, and the cut-off frequency characteristics of the transistor 10 are improved. That is, high-speed response of the transistor 10 can be achieved.

As will be described later in this embodiment, after planarization treatment is performed on a second insulating film to be the insulating layer 175 until the source electrode layer 130 and the drain electrode layer 140 are exposed, a third insulating film to be the insulating layer 173 is formed. At this time, it is preferable that the top surfaces of the insulating layer 173, the source electrode layer 130, and the drain electrode layer 140 be at the same level and parallel to a substrate surface. Thus, the insulating layer 173 over the source electrode layer 130 and the drain electrode layer 140 can be formed uniformly in the substrate surface; therefore, a step of forming a groove portion 174 (e.g., time for etching treatment) can be stabilized. Eventually, the transistor 10 can be manufactured stably. Accordingly, the transistor can have a stable shape, which suppresses fluctuation of transistor characteristics.

Note that the top surface of the source electrode layer 130 or the drain electrode layer 140 may be located under, over, or at the same level as the bottom surface of the gate electrode layer 160.

Alternatively, in the transistor 10, the top surface of the gate electrode layer 160 may be located under the top surface of the insulating layer 175. Alternatively, the source electrode layer 130 and the drain electrode layer 140 may be shorter or longer than the semiconductor layer 122 in the channel length direction.

<Channel Length>

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed, in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<Channel Width>

Note that the channel width refers to, for example, the length of a region where a semiconductor (or a portion where a current flows in a semiconductor when a transistor is on) and a gate electrode overlap with each other. In one transistor, channel widths in all regions are not necessarily the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional channel, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

<SCW>

Therefore, in this specification, in a top view of a transistor, an apparent channel width in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from the value obtained by calculation using an effective channel width is obtained in some cases.

<Improvement of Characteristics in Miniaturization>

High integration of a semiconductor device requires miniaturization of a transistor. However, it is known that miniaturization of a transistor causes deterioration of the electrical characteristics of the transistor. A decrease in channel width causes a reduction in on-state current.

However, in the transistor of one embodiment of the present invention shown in FIGS. 1A to 1C, as described above, the insulator 123 is formed so as to cover the semiconductor layer 122 where a channel is formed and a channel formation layer and the gate insulating film are not in contact with each other. Accordingly, scattering of carriers at the interface between the channel formation layer and the gate insulating layer can be reduced and the on-state current of the transistor can be increased.

In the transistor of one embodiment of the present invention, the gate electrode layer 160 is formed to electrically surround the semiconductor layer 122, which is to be a channel, in the channel width direction; accordingly, a gate electric field is applied to the semiconductor layer 122 in the side surface direction in addition to the perpendicular direction. In other words, a gate electric field is applied to the semiconductor layer 122 entirely, so that current flows in the whole of the semiconductor layer 122, leading to a further increase in on-state current.

In the transistor of one embodiment of the present invention, the insulator 123 is formed over the insulator 121 and the semiconductor layer 122, so that an interface state is less likely to be formed. In addition, impurities do not enter the semiconductor layer 122 from above and below because the semiconductor layer 122 is positioned at the middle. Therefore, the transistor can achieve not only the increase in the on-state current of the transistor but also stabilization of the threshold voltage and a reduction in the S value (subthreshold swing). Thus, $I_{cut}$ (current when gate voltage VG is 0 V) can be reduced and power consumption can be reduced. Further, since the threshold voltage of the transistor becomes stable, long-term reliability of the semiconductor device can be improved.

Although an example where a channel or the like is formed in the semiconductor layer 120 (the semiconductor layer 122) or the like is described in this embodiment, one embodiment of the present invention is not limited thereto. For example, depending on cases or conditions, a channel, the vicinity of the channel, a source region, a drain region, or the like may be formed using a material containing silicon (including strained silicon), germanium, silicon germanium, silicon carbide, gallium arsenide, aluminum gallium arsenide, indium phosphide, gallium nitride, an organic semiconductor, or the like.

<Structure of Transistor>

A structure of a transistor of one embodiment of the present invention is described.

<<Substrate 100>>

A glass substrate, a ceramic substrate, a quartz substrate, a sapphire substrate, or the like can be used as the substrate 100. Alternatively, a single crystal semiconductor substrate or a polycrystalline semiconductor substrate of silicon or silicon carbide, a compound semiconductor substrate of silicon germanium, a silicon-on-insulator (SOI) substrate, or the like may be used. Still alternatively, any of these substrates provided with a semiconductor element may be used. The substrate 100 is not limited to a simple supporting substrate, and may be a substrate where a device such as a transistor is formed. In that case, at least one of the gate electrode layer 160, the source electrode layer 130, and the drain electrode layer 140 of the transistor may be electrically connected to above device.

Alternatively, a flexible substrate may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The substrate 100 has a thickness of, for example, greater than or equal to 5 µm and less than or equal to 700 µm, preferably greater than or equal to 10 µm and less than or equal to 500 µm and further preferably greater than or equal to 15 µm and less than or equal to 300 µm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 100 because of its low coefficient of linear expansion.

<<Insulating Layer 110>>

The insulating layer 110 can have a function of supplying oxygen to the semiconductor layer 120 (the semiconductor layer 122) as well as a function of preventing diffusion of impurities from the substrate 100. For this reason, the insulating layer 110 is preferably an insulating film containing oxygen and further preferably an insulating film containing oxygen in which the oxygen content is higher than that in the stoichiometric composition. The insulating layer 110 is a film of which the amount of released oxygen when converted into oxygen atoms is $1.0\times10^{19}$ atoms/cm$^3$ or more in TDS analysis. Note that the temperature of the film surface in the TDS analysis is preferably higher than or equal to 100° C. and lower than or equal to 700° C., or higher than or equal to 100° C. and lower than or equal to 500° C. In the case where the substrate 100 is provided with another device as described above, the insulating layer 110 also has a function as an interlayer insulating film. In that case, the insulating layer 110 is preferably subjected to planarization treatment such as chemical mechanical polishing (CMP) treatment so as to have a flat surface.

<<Insulators 121 and 123 and Semiconductor Layer 122>>

An oxide that can be used for each of the insulator 121, the semiconductor layer 122, and the insulator 123 preferably contains at least indium (In) or zinc (Zn). Alternatively, both In and Zn are preferably contained. In order to reduce fluctuations in the electrical characteristics of the transistors including the oxides as semiconductors, the oxides preferably contain a stabilizer in addition to In and Zn. Typically, In—Ga oxide, In—Zn oxide, In—Mg oxide, Zn—Mg oxide, or In-M-Zn oxide (M is Al, Ti, Ga, Y, Zr, Sn, La, Ce, Mg, or Nd) can be given as the oxide.

As examples of a stabilizer, gallium (Ga), tin (Sn), hafnium (Hf), aluminum (Al), zirconium (Zr), and the like can be given. As another example of the stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given.

Note that in the case where the insulator 123 is an In-M-Zn oxide, the proportions of In and M when the summation of In and M is assumed to be 100 atomic % are preferably as follows: the atomic percentage of In is greater than or equal to 25 atomic % and the atomic percentage of M is less than 75 atomic %, preferably the atomic percentage of In is greater than or equal to 34 atomic % and the atomic percentage of M is less than 66 atomic %.

The indium and gallium contents in the insulator 123 can be compared with each other by time-of-flight secondary ion mass spectrometry (TOF-SIMS), X-ray photoelectron spectrometry (XPS), or inductively coupled plasma mass spectrometry (ICP-MS).

Since the semiconductor layer 122 has an energy gap of 2 eV or more, preferably 2.5 eV or more and further preferably 3 eV or more, the off-state current of the transistor 10 can be low.

The thickness of the semiconductor layer 122 is greater than or equal to 3 nm and less than or equal to 200 nm, preferably greater than or equal to 3 nm and less than or equal to 100 nm and further preferably greater than or equal to 3 nm and less than or equal to 50 nm.

Each of the insulator 121 and the insulator 123 is an oxide film including one or more elements contained in the semiconductor layer 122. Thus, interface scattering is unlikely to occur at the interface between the semiconductor layer 122 and each of the insulator 121 and the insulator 123. The movement of carriers is not hindered at the interfaces accordingly, and the transistor 10 can have high field-effect mobility.

Each of the insulator 121 and the insulator 123 is typically In—Ga oxide, In—Zn oxide, In—Mg oxide, Ga—Zn oxide, Zn—Mg oxide, or In-M-Zn oxide (M is Al, Ti, Ga, Y, Zr, Sn, La, Ce, Mg, or Nd), and has the energy level at the conduction band minimum that is closer to a vacuum level than that of the semiconductor layer 122 is. Typically, a difference between the energy level at the conduction band minimum of the semiconductor layer 122 and the energy level at the conduction band minimum of each of the insulators 121 and 123 is 0.05 eV or more, 0.07 eV or more, 0.1 eV or more, or 0.2 eV or more and also 2 eV or less, 1 eV or less, 0.5 eV or less, or 0.4 eV or less. That is, the difference between the electron affinity of the semiconductor layer 122 and the electron affinity of each of the insulators 121 and 123 is 0.05 eV or more, 0.07 eV or more, 0.1 eV or more, or 0.2 eV or more and also 2 eV or less, 1 eV or less, 0.5 eV or less, or 0.4 eV or less. Note that the electron affinity refers to a difference between the vacuum level and the energy level at the conduction band minimum.

When each of the insulator 121 and the insulator 123 contain a larger amount of Al, Ti, Ga, Y, Zr, Sn, La, Ce, Mg, or Nd in an atomic ratio than the amount of In in an atomic ratio, any of the following effects may be obtained.

(1) The energy gap of each of the insulator 121, the semiconductor layer 122, and the insulator 123 is widened.
(2) The electron affinity of each of the insulator 121 and the insulator 123 is reduced.
(3) Impurities from the outside are blocked.
(4) An insulating property of each of the insulator 121 and the insulator 123 is higher than that of the semiconductor layer 122.
(5) Oxygen vacancies are less likely to be generated in the insulator 121 and the insulator 123 each containing a larger amount of Al, Ti, Ga, Y, Zr, Sn, La, Ce, Mg, or Nd in an atomic ratio than the amount of In in an atomic ratio because Al, Ti, Ga, Y, Zr, Sn, La, Ce, Mg, and Nd is a metal element that can be strongly bonded to oxygen.

Since the insulator 121 and the insulator 123 have higher insulating properties than the semiconductor layer 122, they each have a function similar to that of the gate insulating layer.

In the case where each of the insulator 121 and the insulator 123 is In-M-Zn oxide, the proportion of In and the proportion of M, not taking Zn and O into consideration, are preferably less than 50 atomic % and greater than or equal to 50 atomic %, respectively, and further preferably less than 25 atomic % and greater than or equal to 75 atomic %, respectively.

Further, in the case where each of the insulator 121 and the insulator 123 is In-M-Zn oxide (M is Al, Ti, Ga, Y, Zr, Sn, La, Ce, Mg, or Nd), the proportion of M atoms (M is Al, Ti, Ga, Y, Zr, Sn, La, Ce, Mg, or Nd) in each of the insulator 121 and the insulator 123 is higher than that in the semiconductor layer 122. Typically, the proportion of M atoms in each of the insulator 121 and the insulator 123 is higher than or equal to 1.5 times, preferably higher than or equal to twice and further preferably higher than or equal to three times, as high as that in the semiconductor layer 122. Any of the above-described elements represented by M is more strongly bonded to oxygen than indium is, and thus has a function of suppressing generation of oxygen vacancies in the insulator 121 and the insulator 123. That is, oxygen vacancies are less likely to be generated in the insulator 121 and the insulator 123 than in the semiconductor layer 122.

The indium content in the semiconductor layer 122 is preferably higher than those in the insulator 121 and the insulator 123. As a semiconductor, an s orbital of heavy metal mainly contributes to carrier transfer. When the proportion of In in the semiconductor is increased, overlap of s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the semiconductor layer 122, a transistor having high field-effect mobility can be obtained.

In the case where the semiconductor layer 122 includes In-M-Zn oxide (M is Al, Ti, Ga, Y, Zr, Sn, La, Ce, Mg, or Nd) and a target having the atomic ratio of metal elements of In:M:Zn=$x_1$:$y_1$:$z_1$ is used for forming the semiconductor layer 122, $x_1/y_1$ is preferably greater than or equal to 1/3 and less than or equal to 6 and further preferably greater than or equal to 1 and less than or equal to 6, and $z_1/y_1$ is preferably greater than or equal to 1/3 and less than or equal to 6 and further preferably greater than or equal to 1 and less than or equal to 6. Note that when $z_1/y_1$ is greater than or equal to 1 and less than or equal to 6, a c-axis aligned crystalline oxide semiconductor (CAAC-OS) film is easily formed as the semiconductor layer 122. Typical examples of the atomic ratio of metal elements of the target include In:M:Zn=1:1:1, 1:1:1.2, 2:1:1.5, 2:1:2.3, 2:1:3, 3:1:2, 4:2:3, and 4:2:4.1.

In the case where the insulator 121 and the insulator 123 include In-M-Zn oxide (M is Al, Ti, Ga, Y, Zr, Sn, La, Ce, Mg, or Nd) and a target having the atomic ratio of metal elements of In:M:Zn=$x_2$:$y_2$:$z_2$ is used for forming the insulator 121 and the insulator 123, $x_2/y_2$ is preferably less than $x_1/y_1$, and $z_2/y_2$ is preferably greater than or equal to 1/3 and less than or equal to 6 and further preferably greater than or equal to 1 and less than or equal to 6. Note that when $z_2/y_2$ is greater than or equal to 1 and less than or equal to 6, a CAAC-OS film is easily formed as the insulator 121 and the insulator 123. Typical examples of the atomic ratio of the metal elements of the target are In:M:Zn=1:3:2, 1:3:4, 1:3:6, 1:3:8, 1:4:4, 1:4:5, 1:4:6, 1:4:7, 1:4:8, 1:5:5, 1:5:6, 1:5:7, 1:5:8, 1:6:8, 1:6:4, 1:9:6, and the like.

In each of the insulator 121 and the insulator 123, the proportion of each atom in the above-described atomic ratio varies within a range of ±40% as an error.

Alternatively, the insulator 123 can be metal oxide, such as aluminum oxide ($AlO_x$), gallium oxide ($GaO_x$), hafnium oxide ($HfO_x$), silicon oxide ($SiO_x$), germanium oxide ($GeO_x$), or zirconia oxide ($ZrO_x$); or the metal oxide may be provided over the insulator 123.

The atomic ratio is not limited to those described above, and may be appropriately set in accordance with needed semiconductor characteristics.

The insulator 121 and the insulator 123 may have the same composition. For example, the insulator 121 and the insulator 123 may be an In—Ga—Zn oxide with an atomic ratio of the metal elements in a target used in a sputtering method being In:Ga:Zn=1:3:2, 1:3:4, or 1:4:5.

Alternatively, the insulator 121 and the insulator 123 may have different compositions. For example, the insulator 121 may be an In—Ga—Zn oxide with an atomic ratio of the metal elements in a target used in a sputtering method being In:Ga:Zn=1:3:4, and the insulator 123 may be an In—Ga—Zn oxide with an atomic ratio of the metal elements in a target used in a sputtering method being In:Ga:Zn=1:3:2.

The thickness of each of the insulator 121, the semiconductor layer 122, and the insulator 123 is preferably greater than or equal to 3 nm and less than or equal to 100 nm or greater than or equal to 3 nm and less than or equal to 50 nm.

The thickness of the semiconductor layer 122 may be larger than, equal to, or less than that of at least the insulator 121. If the thickness of the semiconductor layer 122 is larger than that of the insulator 121, the on-state current of the transistor can be increased. The thickness of the insulator 121 may be determined as appropriate as long as formation of an interface state at the interface with the semiconductor layer 122 can be suppressed. For example, the thickness of the semiconductor layer 122 is larger than that of the insulator 121, preferably 2 or more times, further preferably 4 or more times, and still further preferably 6 or more times, as large as that of the insulator 121. In the case where there is no need to increase the on-state current of the transistor, the thickness of the insulator 121 may be larger than or equal to that of the semiconductor layer 122. If the insulating layer 110, 170, 173, or 175 contains excess oxygen, the oxygen is diffused by heat treatment and the amount of oxygen vacancies in the semiconductor layer 122 can be reduced, which leads to stabilization of electrical characteristics of the semiconductor device.

The thickness of the insulator 123 may be determined as appropriate, in a manner similar to that of the insulator 121, as long as formation of an interface state at the interface with the semiconductor layer 122 is suppressed. For example, the thickness of the insulator 123 may be set smaller than or equal to that of the insulator 121. If the thickness of the insulator 123 is large, there is a concern that the electric field from the gate electrode layer 160 cannot reach the semiconductor layer 122. To prevent oxygen contained in the insulator 123 from diffusing to the source electrode layer 130 and the drain electrode layer 140 and oxidizing the source electrode layer 130 and the drain electrode layer 140, it is preferable that the thickness of the insulator 123 be small. For example, the thickness of the insulator 123 is smaller than that of the semiconductor layer 122. Note that the thickness of the insulator 123 is not limited to the above, and may be determined as appropriate in accordance with the driving voltage of the transistor in consideration of the withstand voltage of the gate insulating layer 150.

In the case where the insulator 121, the semiconductor layer 122, and the insulator 123 have different compositions from one another, the interfaces thereof can be observed by scanning transmission electron microscopy (STEM) in some cases.

<Hydrogen Concentration>

Hydrogen contained in the insulator 121, the semiconductor layer 122, and the insulator 123 reacts with oxygen bonded to a metal atom to be water, and in addition, an oxygen vacancy is formed in a lattice from which oxygen is released (or a portion from which oxygen is released). An electron serving as a carrier is generated in some cases due to entry of hydrogen into the oxygen vacancy or due to bonding of part of hydrogen to oxygen bonded to a metal atom. Thus, a transistor in which an oxide containing hydrogen is used as a semiconductor is likely to be normally on.

Accordingly, it is preferable that hydrogen be reduced as much as possible as well as the oxygen vacancies in the insulator 121, the semiconductor layer 122, and the insulator 123 and at their interfaces. For example, the concentrations of hydrogen in the insulator 121, the semiconductor layer 122, and the insulator 123 and at their interfaces, which are obtained by secondary ion mass spectrometry (SIMS), are preferably higher than or equal to $1\times10^{16}$ atoms/cm$^3$ and lower than or equal to $2\times10^{20}$ atoms/cm$^3$, further preferably higher than or equal to $1\times10^{16}$ atoms/cm$^3$ and lower than or equal to $5\times10^{19}$ atoms/cm$^3$, still further preferably higher than or equal to $1\times10^{16}$ atoms/cm$^3$ and lower than or equal to $1\times10^{19}$ atoms/cm$^3$, and yet still further preferably higher than or equal to $1\times10^{16}$ atoms/cm$^3$ and lower than or equal to $5\times10^{18}$ atoms/cm$^3$. As a result, the transistor 10 can have positive threshold voltage (normally-off characteristics).

<Concentrations of Carbon and Silicon>

When silicon and carbon, which are elements belonging to Group 14, are contained in the insulator 121, the semiconductor layer 122, and the insulator 123 and at their interfaces, oxygen vacancies are increased and an n-type region is formed in the insulator 121, the semiconductor layer 122, and the insulator 123. It is therefore preferable to reduce the concentrations of silicon and carbon in the insulator 121, the semiconductor layer 122, and the insulator 123 and at their interfaces. For example, the concentrations of silicon and carbon in the insulator 121, the semiconductor layer 122, and the insulator 123 and at their interfaces, which are obtained by SIMS, are preferably higher than or equal to $1\times10^{16}$ atoms/cm$^3$ and lower than or equal to $1\times10^{19}$ atoms/cm$^3$, further preferably higher than or equal to $1\times10^{16}$ atoms/cm$^3$ and lower than or equal to $5\times10^{18}$ atoms/cm$^3$, and still further preferably higher than or equal to $1\times10^{16}$ atoms/cm$^3$ and lower than or equal to $2\times10^{18}$ atoms/cm$^3$. As a result, the transistor 10 has positive threshold voltage (normally-off characteristics).

<Concentration of Alkali Metal and Alkaline Earth Metal>

Alkali metal and alkaline earth metal can generate carriers when bonded to an oxide, which can increase the off-state current of the transistor. It is thus preferable to reduce the concentrations of alkali metal and alkaline earth metal in the insulator 121, the semiconductor layer 122, and the insulator 123 and at their interfaces. For example, the concentrations of alkali metal and alkaline earth metal in the insulator 121, the semiconductor layer 122, and the insulator 123 and at their interfaces, which are obtained by SIMS, are preferably lower than or equal to $1\times10^{18}$ atoms/cm$^3$ and further preferably lower than or equal to $2\times10^{16}$ atoms/cm$^3$. As a result, the transistor 10 has positive threshold voltage (normally-off characteristics).

<Concentration of Nitrogen>

When nitrogen is contained in the insulator 121, the semiconductor layer 122, and the insulator 123 and at their interfaces, an electron serving as a carrier is generated and accordingly carrier density is increased, so that n-type regions are formed. Thus, when an oxide contains nitrogen, a transistor including the oxide is likely to be normally on. Thus, it is preferable that nitrogen be reduced as much as possible in the insulator 121, the semiconductor layer 122, and the insulator 123 and at their interfaces. For example, the concentrations of nitrogen in the insulator 121, the semiconductor layer 122, and the insulator 123 and at their interfaces, which are obtained by SIMS, are preferably higher than or equal to $1\times10^{15}$ atoms/cm$^3$ and lower than or equal to $5\times10^{19}$ atoms/cm$^3$, further preferably higher than or equal to $1\times10^{15}$ atoms/cm$^3$ and lower than or equal to $5\times10^{18}$ atoms/cm$^3$, still further preferably higher than or equal to $1\times10^{15}$ atoms/cm$^3$ and lower than or equal to $1\times10^{18}$ atoms/cm$^3$, and yet still further preferably higher than or equal to $1\times10^{15}$ atoms/cm$^3$ and lower than or equal to $5\times10^{17}$ atoms/cm$^3$. As a result, the transistor 10 has positive threshold voltage (normally-off characteristics).

<Carrier Density>

The carrier densities of the insulator 121, the semiconductor layer 122, and the insulator 123 can be lowered by reduction in impurities in the insulator 121, the semiconductor layer 122, and the insulator 123. The carrier densities of the insulator 121, the semiconductor layer 122, and the insulator 123 is therefore less than or equal to $1\times10^{15}$/cm$^3$, preferably less than or equal to $1\times10^{13}$/cm$^3$, further preferably less than $8\times10^{11}$/cm$^3$, still further preferably less than $1\times10^{11}$/cm$^3$, and yet still further preferably less than $1\times10^{10}$/cm$^3$, and is greater than or equal to $1\times10^{-9}$/cm$^3$.

When an oxide film having a low impurity concentration and a low density of defect states is used as each of the insulator 121, the semiconductor layer 122, and the insulator 123, a transistor including the insulators and the semiconductor layer can have more excellent electrical characteristics. Here, the state in which the impurity concentration is low and the density of defect states is low (the amount of oxygen vacancies is small) is described as "highly purified intrinsic" or "substantially highly purified intrinsic." A highly purified intrinsic or substantially highly purified intrinsic oxide semiconductor has few carrier generation sources, and thus has a low carrier density in some cases. Thus, a transistor including the oxide film in which a channel region is formed is likely to have positive threshold voltage (normally-off characteristics). A highly purified intrinsic or substantially highly purified intrinsic oxide film has a low density of defect states and accordingly has a low density of trap states in some cases. Further, a transistor including a highly purified intrinsic or substantially highly purified intrinsic oxide film has an extremely low off-state current; the off-state current can be less than or equal to the measurement limit of a semiconductor parameter analyzer, i.e., less than or equal to $1\times10^{-13}$ A, at a voltage between a source electrode and a drain electrode (drain voltage) of from 1 V to 10 V. Thus, the transistor whose channel region is formed in the oxide film has a small variation in electrical characteristics and high reliability in some cases.

A transistor in which a highly purified oxide film is used for a channel formation region exhibits extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

The insulator 121, the semiconductor layer 122, and the insulator 123 may have a non-single crystal structure, for example. The non-single crystal structure includes a CAAC-OS which is described later, a polycrystalline structure, a microcrystalline structure, or an amorphous structure, for example. Among the non-single crystal structure, the amorphous structure has the highest density of defect states, whereas the CAAC-OS has the lowest density of defect states.

The insulator 121, the semiconductor layer 122, and the insulator 123 may have a microcrystalline structure, for example. The insulator 121, the semiconductor layer 122, and the insulator 123 which each have the microcrystalline structure include a microcrystal with a size greater than or equal to 1 nm and less than 10 nm, for example. Alternatively, the oxide films which have the microcrystalline structure have a mixed phase structure where crystal parts (each of which is greater than or equal to 1 nm and less than 10 nm) are distributed in an amorphous phase.

The insulator 121, the semiconductor layer 122, and the insulator 123 may have an amorphous structure, for example. The insulator 121, the semiconductor layer 122, and the insulator 123 which have the amorphous structure each have disordered atomic arrangement and no crystalline component, for example. Alternatively, the oxide films which have an amorphous structure have, for example, an absolutely amorphous structure and no crystal part.

Note that the insulator 121, the semiconductor layer 122, and the insulator 123 may each be a mixed film including regions having two or more of the following structures: a CAAC-OS, a microcrystalline structure, and an amorphous structure. The mixed film, for example, has a single-layer structure including a region having an amorphous structure, a region having a microcrystalline structure, and a region of a CAAC-OS. Alternatively, the mixed film may have a stacked-layer structure including a region having an amorphous structure, a region having a microcrystalline structure, and a region of a CAAC-OS, for example.

Note that the insulator 121, the semiconductor layer 122, and the insulator 123 may have a single-crystal structure, for example.

By providing an oxide film in which oxygen vacancies are less likely to be generated than in the semiconductor layer 122, over and under and in contact with the semiconductor layer 122, oxygen vacancies in the semiconductor layer 122 can be reduced. Further, since the semiconductor layer 122 is in contact with the insulator 121 and the insulator 123 containing one or more metal elements forming the semiconductor layer 122, the density of interface states at the interfaces between the insulator 121 and the semiconductor layer 122 and between the semiconductor layer 122 and the insulator 123 is extremely low. For example, after oxygen is added to the insulating layer 110, the oxygen is transferred to the semiconductor layer 122 through the insulator 121 by heat treatment; however, the oxygen is hardly trapped by the interface states at this time, and the oxygen in the insulator 121 can be efficiently transferred to the semiconductor layer 122. Accordingly, oxygen vacancies in the semiconductor layer 122 can be reduced. Since oxygen is added to the insulator 121, oxygen vacancies in the insulator 121 can be reduced. In other words, the density of localized states of at least the semiconductor layer 122 can be reduced.

In addition, when the semiconductor layer 122 is in contact with an insulating film including a different constituent element (e.g., a gate insulating layer including a silicon oxide film), an interface state is sometimes formed, and the interface state forms a channel. At this time, a second transistor having a different threshold voltage appears, so that an apparent threshold voltage of the transistor is varied. However, since the insulator 121 and the insulator 123 containing one or more kinds of metal elements forming the semiconductor layer 122 are in contact with the semiconductor layer 122, an interface state is not easily formed at the interfaces between the insulator 121 and the semiconductor layer 122 and between the insulator 123 and the semiconductor layer 122.

The insulator 121 and the insulator 123 function as barrier films that prevent constituent elements of the insulating layer 110 and the gate insulating layer 150 from entering the semiconductor layer 122 and forming an impurity state.

For example, in the case of using a silicon-containing insulating film as the insulating layer 110 or the gate insulating layer 150, silicon in the gate insulating layer 150 or carbon which might be contained in the insulating layer 110 or the gate insulating layer 150 enters the insulator 121 or the insulator 123 to a depth of several nanometers from the interface in some cases. An impurity, such as silicon or carbon, entering the semiconductor layer 122 forms an impurity state. The impurity state serves as a donor to generate an electron; thus, an n-type semiconductor might be formed.

However, when each thickness of the insulator 121 and the insulator 123 is greater than several nanometers, the impurity such as silicon or carbon does not reach the semiconductor layer 122, so that the influence of impurity states is reduced.

Thus, providing the insulator 121 and the insulator 123 makes it possible to reduce variations in electrical characteristics of the transistor, such as threshold voltage.

In the case where the gate insulating layer 150 and the semiconductor layer 122 are in contact with each other and a channel is formed at the interface thereof, interface scattering occurs at the interface and the field-effect mobility of the transistor is decreased. However, since the insulator 121 and the insulator 123 containing one or more kinds of metal elements forming the semiconductor layer 122 are provided in contact with the semiconductor layer 122, scattering of carriers does not easily occur at the interfaces between the semiconductor layer 122 and each of the insulator 121 and the insulator 123, and thus the field-effect mobility of the transistor can be increased.

In this embodiment, the amount of oxygen vacancies in the semiconductor layer 122, and further the amount of oxygen vacancies in the insulator 121 and the insulator 123 in contact with the semiconductor layer 122 can be reduced; thus, the density of localized states of the semiconductor layer 122 can be reduced. As a result, the transistor 10 in this embodiment has small variations in threshold voltage and high reliability. Further, the transistor 10 of this embodiment has excellent electrical characteristics.

An insulating film containing silicon is often used as a gate insulating layer of a transistor. For the above-described reason, it is preferable that a region of the oxide layer, which serves as a channel, be not in contact with the gate insulating layer as in the transistor of one embodiment of the present invention. In the case where a channel is formed at the interface between the gate insulating layer and the oxide layer, scattering of carriers occurs at the interface, whereby the field-effect mobility of the transistor is reduced in some cases. Also from the view of the above, it is preferable that the region of the oxide layer, which serves as a channel, be separated from the gate insulating layer.

Accordingly, with the semiconductor layer 120 having a stacked-layer structure including the insulator 121, the semiconductor layer 122, and the insulator 123, a channel can be formed in the semiconductor layer 122; thus, the transistor can have high field-effect mobility and stable electrical characteristics.

Note that the three semiconductor layers are not necessarily provided and can be a single layer, two layers, four layers, or five or more layers. In the case of a single layer, a layer corresponding to the semiconductor layer 122, which is described in this embodiment, can be used.

<Band Diagram>

Here, a band diagram is described. For easy understanding, the band diagram is illustrated with the energy levels (Ec) at the conduction band minimum of the insulating layer 110, the insulator 121, the semiconductor layer 122, the insulator 123, and the gate insulating layer 150.

Figure 3A:
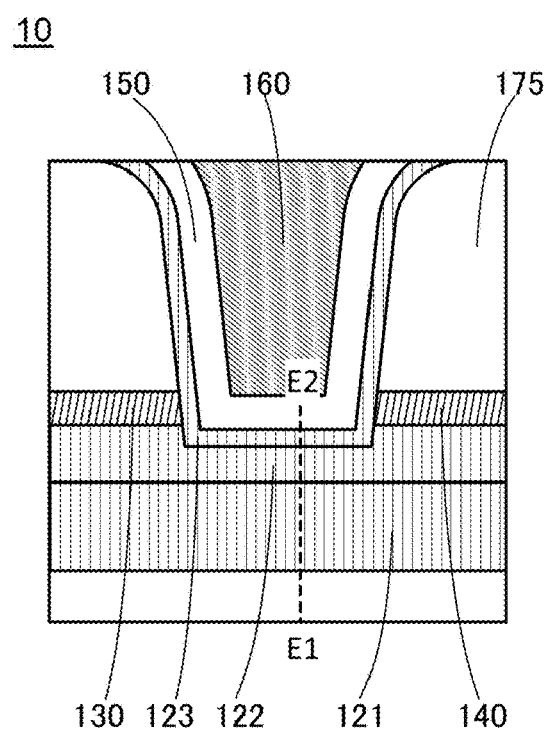
FIGS. 3A and 3B are an enlarged cross-sectional view and a band diagram of a transistor.
Figure 3B:
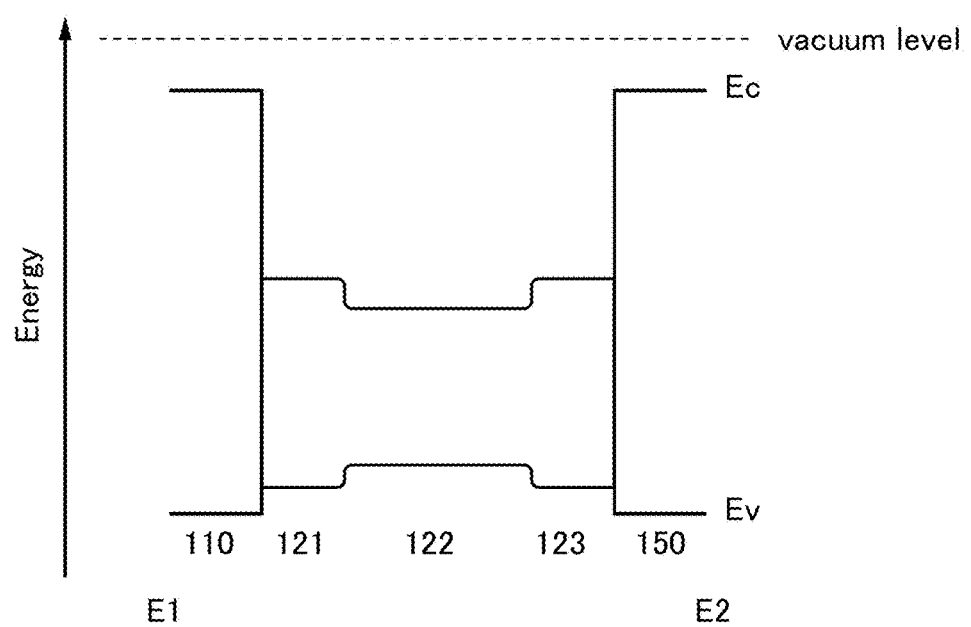
Figure 4A:
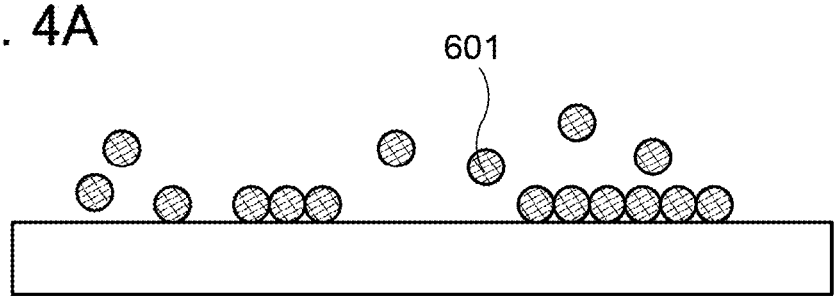
FIGS. 4A to 4D illustrate ALD deposition mechanism.
Figure 4B:
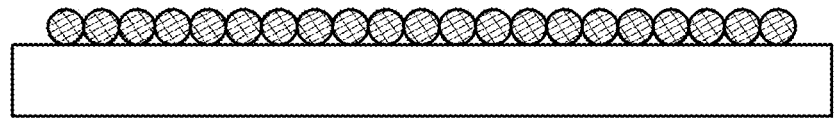
Figure 4C:
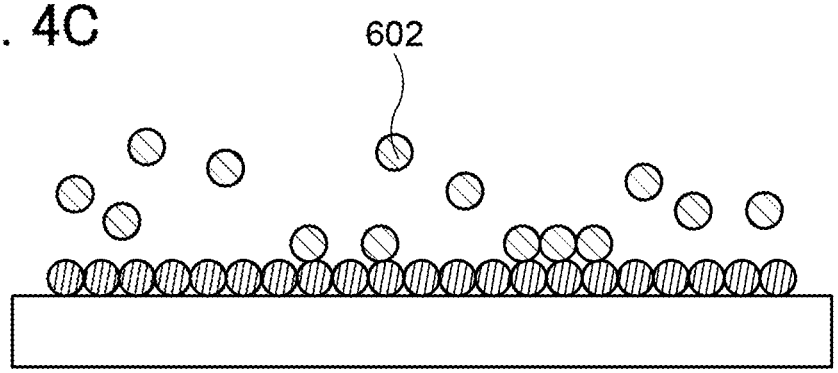
Figure 4D:
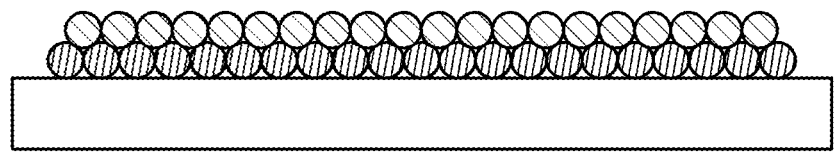

As illustrated in FIGS. 3A and 3B, the energy at the conduction band minimum changes continuously within the insulator 121, the semiconductor layer 122, and the insulator 123. This can be understood also from the fact that the constituent elements are common among the insulator 121, the semiconductor layer 122, and the insulator 123 and oxygen is easily diffused among them. Thus, the insulator 121, the semiconductor layer 122, and the insulator 123 have a continuous physical property although they are a stack of films having different compositions.

The oxide films, which contain the same main components and are stacked, are not simply stacked but formed to have continuous junction (here, particularly a U-shaped (U shape) well structure where the energy at the conduction band minimum is continuously changed between the films). In other words, a stacked-layer structure is formed such that there exist no impurities which form a defect level such as a trap center or a recombination center at each interface. If impurities are mixed between the films in the stacked multilayer film, the continuity of the energy band is lost and carriers disappear by a trap or recombination at the interface.

Although Ec of the insulator 121 and Ec of the insulator 123 are equal to each other in FIG. 3B, they may be different from each other.

As illustrated in FIG. 3B, the semiconductor layer 122 serves as a well and a channel of the transistor 10 is formed in the semiconductor layer 122. Note that a channel having a U-shaped well structure in which the energy at the conduction band minimum continuously changes like the one formed in the semiconductor layer 122, can also be referred to as a buried channel.

Note that trap levels due to impurities or defects can be formed in the vicinity of the interface between an insulating film such as a silicon oxide film and the insulator 121 and the insulator 123. The semiconductor layer 122 can be distanced away from the trap levels owing to existence of the insulator 121 and the insulator 123. However, when the energy difference between Ec of the insulator 121 or the insulator 123 and Ec of the semiconductor layer 122 is small, an electron in the semiconductor layer 122 can go over the energy difference and reach the trap level. When electrons to be negative charge are captured by the trap levels, a negative fixed charge is generated at the interface with the insulating film, whereby the threshold voltage of the transistor is shifted in the positive direction. In addition, a trap is not fixed and characteristics can be changed in a long-time preservation test of a transistor.

Thus, to reduce a change in the threshold voltage of the transistor, an energy difference between the Ec of the semiconductor layer 122 and the Ec of each of the insulator 121 and the insulator 123 is necessary. The energy difference is preferably greater than or equal to 0.1 eV and further preferably greater than or equal to 0.2 eV.

The insulator 121, the semiconductor layer 122, and the insulator 123 preferably include a crystal part. In particular, when a crystal in which c-axes are aligned is used, the transistor can have stable electrical characteristics.

In the band diagram illustrated in FIG. 3B, In—Ga oxide (e.g., with an atomic ratio of In:Ga=7:93) or gallium oxide may be provided between the semiconductor layer 122 and the gate insulating layer 150 without providing the insulator 123. Alternatively, In—Ga oxide or gallium oxide may be provided between the insulator 123 and the gate insulating layer 150.

As the semiconductor layer 122, an oxide having an electron affinity higher than those of the insulators 121 and 123 is used. The oxide which can be used for the semiconductor layer 122 has, for example, an electron affinity higher than that of each of the insulators 121 and 123 by 0.07 eV or higher and 1.3 eV or lower, preferably 0.1 eV or higher and 0.7 eV or lower and further preferably 0.2 eV or higher and 0.4 eV or lower.

Since the transistor described in this embodiment includes the insulator 121 and the insulator 123 that each include one or more kinds of metal elements included in the semiconductor layer 122, interface states can be reduced at the interfaces between the insulator 121 and the semiconductor layer 122 and between the insulator 123 and the semiconductor layer 122. Thus, providing the insulator 121 and the insulator 123 makes it possible to reduce variations or changes in electrical characteristics of the transistor, such as threshold voltage.

<<Source Electrode Layer 130 and Drain Electrode Layer 140>>

The source electrode layer 130 and the drain electrode layer 140 are preferably a conductive layer having a single-layer structure or a stacked-layer structure and containing a material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), strontium (Sr), and the like, an alloy of such a material, or a compound of oxygen, nitrogen, fluoride, silicon, or the like containing any of these materials as its main component. For example, in the case of stacking layers, the lower conductive layer which is in contact with the semiconductor layer 122 contains a material which is easily bonded to oxygen, and the upper conductive layer contains a highly oxidation-resistant material. It is preferable to use a high-melting-point material, such as tungsten or molybdenum, which has both heat resistance and conductivity. In addition, the source electrode layer 130 and the drain electrode layer 140 are preferably formed using a low-resistance conductive material such as aluminum or copper. The source electrode layer 130 and the drain electrode layer 140 are further preferably formed using a Cu—Mn alloy, in which case manganese oxide formed at the interface with an insulator containing oxygen has a function of preventing Cu diffusion. In addition, tantalum nitride is preferable because it has an effect of suppressing diffusion of hydrogen and oxygen (a barrier property) and shows high resistance to oxidation.

When the conductive material that is easily bonded to oxygen is in contact with an oxide semiconductor layer, a phenomenon occurs in which oxygen in the oxide semiconductor layer is diffused to the conductive material that is easily bonded to oxygen. Oxygen vacancies are generated in the vicinity of a region which is in the oxide semiconductor layer and is in contact with the source electrode layer or the drain electrode layer. Hydrogen slightly contained in the film enters the oxygen vacancies, whereby the region is markedly changed to an n-type region. Accordingly, the n-type region can serve as a source or a drain of the transistor.

For example, a stacked-layer structure using W and Pt for the lower conductive layer and the upper conductive layer, respectively, can suppress oxidation of the conductive layers caused by being in contact with the insulating layer 175 while an oxide semiconductor in contact with the conductive layers becomes n-type.

<<Gate Insulating Layer 150>>

The gate insulating layer 150 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more of aluminum oxide ($AlO_x$), magnesium oxide ($MgO_x$), silicon oxide ($SiO_x$), silicon oxynitride ($SiO_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$) can be used. The gate insulating layer 150 may be a stack of any of the above materials. The gate insulating layer 150 may contain lanthanum (La), nitrogen, zirconium (Zr), or the like as an impurity.

An example of a stacked-layer structure of the gate insulating layer 150 is described. The gate insulating layer 150 includes, for example, oxygen, nitrogen, silicon, or hafnium. Specifically, the gate insulating layer 150 preferably includes hafnium oxide, and silicon oxide or silicon oxynitride.

Hafnium oxide has higher dielectric constant than silicon oxide and silicon oxynitride. Therefore, by using hafnium oxide, the thickness of the gate insulating layer 150 can be larger than that of silicon oxide; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

A surface over which the hafnium oxide with a crystalline structure is formed might have interface states due to defects. The interface state serves as a trap center in some cases. Therefore, when hafnium oxide is provided near a channel region of a transistor, the electrical characteristics of the transistor might deteriorate because of the interface state. In order to reduce the adverse effect of the interface state, in some cases, it is preferable to separate the channel region of the transistor and the hafnium oxide from each other by providing another film therebetween. The film has a buffer function. The film having a buffer function may be included in the gate insulating layer 150 or included in the oxide semiconductor film. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

In some cases, the threshold voltage of a transistor can be controlled by trapping an electric charge in an interface state (trap center) in hafnium oxide with the above-described crystalline structure in the formation surface where the hafnium oxide having the above-described crystalline structure is formed. In order to make the electric charge exist stably, for example, an insulator having a larger energy gap than hafnium oxide may be provided between the channel region and the hafnium oxide. Alternatively, a semiconductor or an insulator having lower electron affinity than hafnium oxide may be provided. The film having a buffer function may be formed using a semiconductor or an insulator having higher ionization energy than hafnium oxide. With the use of such an insulator, an electric charge trapped in the interface state is less likely to be released; accordingly, the electric charge can be held for a long period of time.

Examples of such an insulator include silicon oxide and silicon oxynitride. In order to make the interface state in the gate insulating layer 150 trap an electric charge, an electron may be transferred from an oxide semiconductor film toward the gate electrode layer 160. As a specific example, the potential of the gate electrode layer 160 is kept higher than the potential of the source electrode layer 130 or the drain electrode layer 140 under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the gate insulating layer 150 or the like shifts in the positive direction. The amount of electrons to be trapped (the amount of change in threshold voltage) can be controlled by adjusting a voltage of the gate electrode layer 160 or time in which the voltage is applied. Note that a location in which an electric charge is trapped is not necessarily limited to the inside of the gate insulating layer 150 as long as an electric charge can be trapped therein. A stacked film having a similar structure may be used as another insulating layer.

<<Gate Electrode Layer 160>>

For example, a conductive film of aluminum (Al), titanium (Ti), chromium (Cr), cobalt (Co), nickel (Ni), copper (Cu), yttrium (Y), zirconium (Zr), molybdenum (Mo), ruthenium (Ru), silver (Ag), tantalum (Ta), tungsten (W), or the like can be used for the gate electrode layer 160. The gate electrode layer 160 may have a stacked-layer structure. Alternatively, a conductive film containing nitrogen, such as a nitride of the above material, may be used. In addition, tantalum nitride is preferable because it has an effect of suppressing diffusion of hydrogen and oxygen (a barrier property) and shows high resistance to oxidation.

<<Insulating Layer 170>>

The insulating layer 170 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more of aluminum oxide ($AlO_x$), magnesium oxide ($MgO_x$), silicon oxide ($SiO_x$), silicon oxynitride ($SiO_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$) can be used. The insulating layer 170 may be a stack of any of the above materials.

Alternatively, an oxide containing In or Zn may be used for the insulating layer 170. Typically, In—Ga oxide, In—Zn oxide, In—Mg oxide, Zn—Mg oxide, or In-M-Zn oxide (M is Al, Ti, Ga, Y, Zr, Sn, La, Ce, Mg, or Nd) can be given as the oxide.

An aluminum oxide film is preferably included in the insulating layer 170. The aluminum oxide film can prevent transmission of both oxygen and impurities, such as hydrogen and moisture. Accordingly, the aluminum oxide film is suitable for use as a protective film that has the following prevention effects: during and after the manufacturing process of the transistor, entry of impurities, such as hydrogen and moisture, which cause variations in the electrical characteristics of the transistor, into the insulator 121 and the semiconductor layer 122; release of oxygen, which is the main component, from the insulator 121 and the semiconductor layer 122; and unnecessary release of oxygen from the insulating layer 110.

The insulating layer 170 is preferably a film having oxygen supply capability. A mixed layer of the insulating layer 170 and the insulating layer 175 is formed and oxygen is added to the mixed layer or the insulating layer 175 when an insulating film 170a to be the insulating layer 170 is formed, the oxygen is diffused to an oxide semiconductor by heat treatment performed after that, and the oxygen can fill oxygen vacancies in the oxide semiconductor; therefore, the transistor characteristics (e.g., threshold voltage and reliability) can be improved.

Alternatively, another insulating layer may be provided over or under the insulating layer 170. For example, the insulating layer can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more of aluminum oxide ($AlO_x$), magnesium oxide ($MgO_x$), silicon oxide ($SiO_x$), silicon oxynitride ($SiO_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$) can be used. The insulating layer may have a stacked-layer structure. The insulating layer preferably contains oxygen more than that in the stoichiometric composition. Oxygen released from the insulating layer can be diffused to the channel formation region in the semiconductor layer 120 through the gate insulating layer 150, so that oxygen vacancies formed in the channel formation region can be filled with the oxygen. In this manner, stable electrical characteristics of the transistor can be achieved.

<<Insulating Layers 173 and 175>>

The insulating layers 173 and 175 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more of aluminum oxide ($AlO_x$), magnesium oxide ($MgO_x$), silicon oxide ($SiO_x$), silicon oxynitride ($SiO_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$) can be used. The insulating layers 173 and 175 each preferably contain oxygen more than that in the stoichiometric composition.

Alternatively, a low-dielectric constant material (a low-k material) may be used for the insulating layers 173 and 175. For example, silicon oxide into which several percentage fluorine (F) is introduced (SiOF), silicon oxide into which several percentage carbon (C) is introduced (SiOC), fluorinesilicate glass (FSG), organosilicate glass (OSG), silsesquioxane hydride (HSQ), methylsilsesquioxane (MSQ), an organic polymer, polyimide, a fluorine resin (e.g., polytetrafluoroethylene), amorphous carbon to which fluorine is added, or the like can be used. When the low-k material is used for the insulating layers 173 and 175, capacitance of the transistor 10 can be further reduced.

<Conductive Layer 165>

Figure 2A:
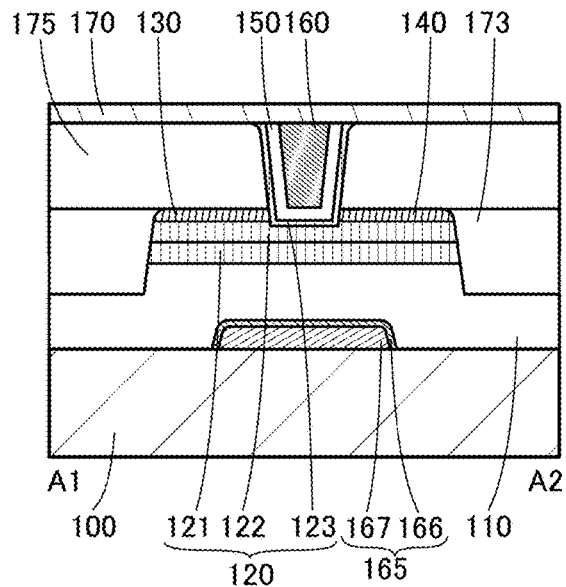
FIGS. 2A to 2D are cross-sectional views each illustrating a transistor.
Figure 2B:
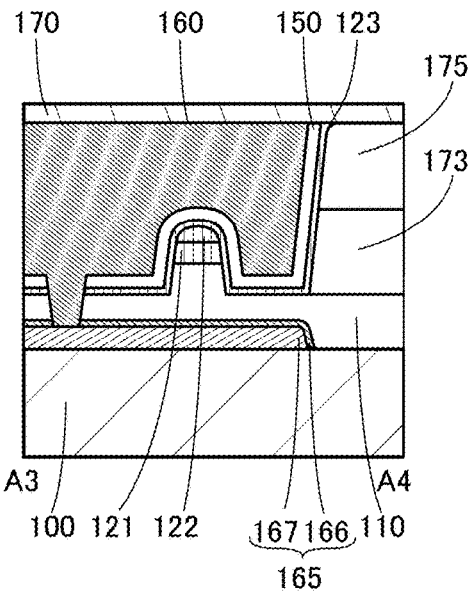
Figure 2C:
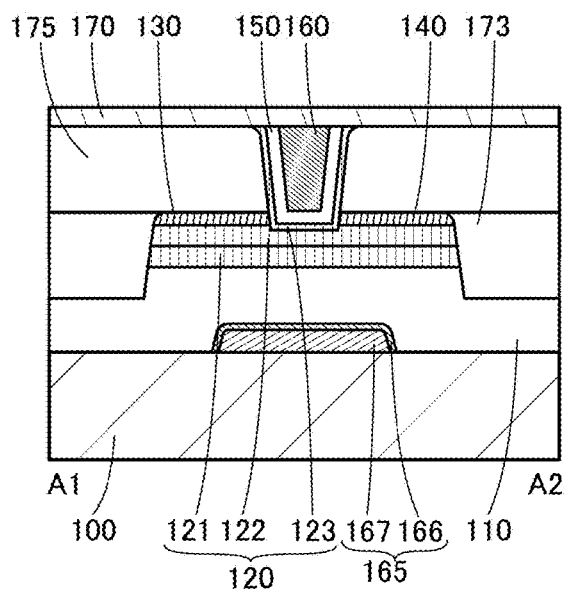
Figure 2D:
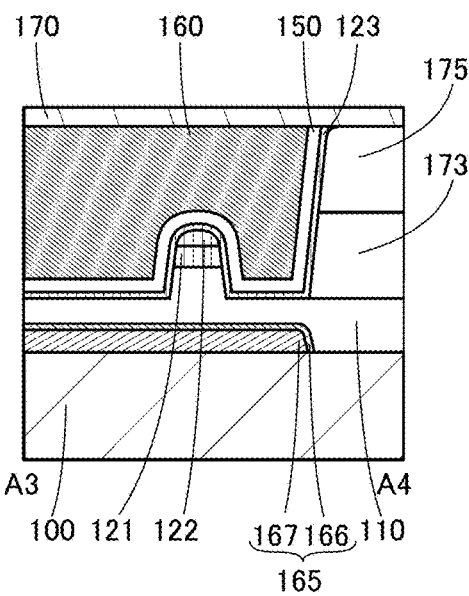

Note that the transistor 10 can include a conductive layer 165 under the insulating layer 110 as illustrated in FIGS. 2A to 2D and the conductive layer 165 can have a function as a bottom gate. The same potential as the gate electrode layer 160 can be applied to the conductive layer as illustrated in FIG. 2B, or a potential different therefrom can be applied to the conductive layer as illustrated in FIG. 2D. The conductive layer 165 is preferably, for example, a conductive layer having a single-layer structure or a stacked-layer structure and containing a material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), strontium (Sr), and the like, an alloy of such a material, or a compound of oxygen, nitrogen, fluoride, silicon, or the like containing any of these materials as its main component. For example, a conductive layer 166 can contain a highly oxidation-resistant material. It is preferable to use a high-melting-point material, such as tungsten or molybdenum, which has both heat resistance and conductivity for a conductive layer 167. In addition, the conductive layer 167 is preferably formed using a low-resistance conductive material such as aluminum or copper.

<Manufacturing Method of Transistor>

Next, a manufacturing method of a semiconductor device of this embodiment is described with reference to FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, and FIGS. 14A to 14C. Note that the same parts as those in the above transistor structure are not described here. The direction of A1-A2 and that of A3-A4 in FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, and FIGS. 14A to 14C can be respectively referred to as a channel length direction in FIGS. 1A and 1B and a channel width direction in FIGS. 1A and 1C.

In this embodiment, the layers included in the transistor (i.e., the insulating layer, the oxide semiconductor layer, the conductive layer, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

<Thermal CVD Method>

A thermal CVD method has an advantage that no defect due to plasma damage is generated because it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

The variety of films such as the metal film, the semiconductor film, and the inorganic insulating film which have been disclosed in the above embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

<ALD Method>

In a conventional deposition apparatus utilizing a CVD method, one or more kinds of source gases (precursors) for reaction are supplied to a chamber at the same time at the time of deposition. In a deposition apparatus utilizing an ALD method, precursors for reaction are sequentially introduced into a chamber, and then the sequence of the gas introduction is repeated. For example, two or more kinds of precursors are sequentially supplied to the chamber by switching respective switching valves (also referred to as high-speed valves). For example, a first precursor is introduced, an inert gas (e.g., argon or nitrogen) or the like is introduced after the introduction of the first precursor so that the plural kinds of precursors are not mixed, and then a second precursor is introduced. Alternatively, the first precursor may be exhausted by vacuum evacuation instead of the introduction of the inert gas, and then the second precursor may be introduced.

FIGS. 4A to 4D illustrate a deposition process by an ALD method. First precursors 601 are adsorbed onto a substrate surface (see FIG. 4A), whereby a first monolayer is formed (see FIG. 4B). At this time, metal atoms and the like included in the precursors can be bonded to hydroxyl groups that exist at the substrate surface. The metal atoms may be bonded to alkyl groups such as methyl groups or ethyl groups. The first monolayer reacts with second precursors 602 introduced after the first precursors 601 are evacuated (see FIG. 4C), whereby a second monolayer is stacked over the first monolayer. Thus, a thin film is formed (see FIG. 4D). For example, in the case where an oxidizer is included in the second precursors, the oxidizer chemically reacts with metal atoms included in the first precursors or an alkyl group bonded to the metal atoms, whereby an oxide film can be formed. Moreover, with the use of a gas containing hydrogen for the second precursors, a metal film can be formed by reduction reaction.

An ALD method is a deposition method based on a surface chemical reaction, by which precursors are adsorbed onto a surface and adsorbing is stopped by a self-terminating mechanism, whereby a layer is formed. For example, precursors such as trimethylaluminum react with hydroxyl groups (OH groups) that exist at the surface. At this time, only a surface reaction due to heating occurs; therefore, the precursors come into contact with the surface and metal atoms or the like in the precursors can be adsorbed onto the surface by thermal energy. The precursors have characteristics of, for example, having a high vapor pressure, being thermally stable before being deposited and not dissolving, and being chemically adsorbed onto a substrate at a high speed. Since the precursors are introduced in a state of a gas, when the first precursors and the second precursors, which are alternately introduced, have enough time to be diffused, a film can be formed with good coverage even onto a region having unevenness with a high aspect ratio.

In an ALD method, the sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness. The deposition rate can be increased and the impurity concentration in the film can be reduced by improving the evacuation capability.

ALD methods include an ALD method using heating (thermal ALD method) and an ALD method using plasma (plasma ALD method). In the thermal ALD method, precursors react using thermal energy, and in the plasma ALD method, precursors react in a state of a radical.

By an ALD method, an extremely thin film can be formed with high accuracy. In addition, the coverage of an uneven surface with the film and the film density of the film are high.

<Plasma ALD>

Alternatively, when the plasma ALD method is employed, the film can be formed at a lower temperature than when the thermal ALD method is employed. With the plasma ALD method, for example, the film can be formed without decreasing the deposition rate even at 100° C. or lower. Moreover, in the plasma ALD method, nitrogen radicals can be formed by plasma; thus, a nitride film as well as an oxide film can be formed.

In addition, oxidizability of an oxidizer can be enhanced by the plasma ALD method. Thus, precursors remaining in a plasma ALD film or organic components released from precursors can be reduced. In addition, carbon, chlorine, hydrogen, and the like in the film can be reduced. Therefore, a film with low impurity concentration can be formed.

In the case of using the plasma ALD method, radical species are generated, and plasma can be generated from a place apart from the substrate like inductively coupled plasma (ICP) or the like, so that plasma damage to the substrate or a film on which the protective film is formed can be suppressed.

As described above, with the plasma ALD method, the process temperature can be lowered and the coverage of the surface can be increased as compared with other deposition methods, and the film can be deposited successfully. Thus, entry of water and hydrogen from the outside can be suppressed, leading to an improvement of the reliability of characteristics of the transistor.

<ALD Apparatus>

Figure 5A:
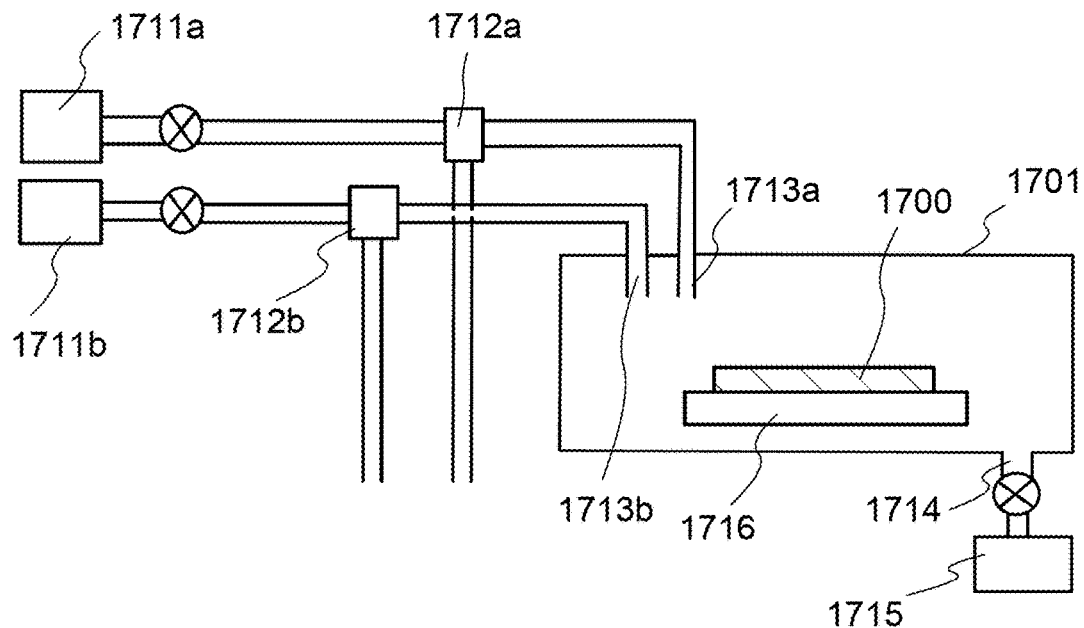
FIGS. 5A and 5B are schematic views of an ALD apparatus.

FIG. 5A illustrates an example of a deposition apparatus utilizing an ALD method. The deposition apparatus utilizing an ALD method includes a deposition chamber (chamber 1701), source material supply portions 1711a and 1711b, high-speed valves 1712a and 1712b which are flow rate controllers, source material introduction ports 1713a and 1713b, a source material exhaust port 1714, and an evacuation unit 1715. The source material introduction port 1713a and the source material introduction port 1713b provided in the chamber 1701 are connected to the source material supply portion 1711a and the source material supply portion 1711b, respectively, through supply tubes and valves. The source material exhaust port 1714 is connected to the evacuation unit 1715 through an exhaust tube, a valve, and a pressure controller.

A substrate holder 1716 with a heater is provided in the chamber, and a substrate 1700 over which a film is formed is provided over the substrate holder.

In the source material supply portions 1711a and 1711b, a source gas is formed from a solid source material or a liquid source material by using a vaporizer, a heating unit, or the like. Alternatively, the source material supply portions 1711a and 1711b may supply a source gas.

Although two source material supply portions 1711a and 1711b are provided as an example, without limitation thereon, three or more source material supply portions may be provided. The high-speed valves 1712a and 1712b can be accurately controlled by time, and a source gas and an inert gas are supplied by the high-speed valves 1712a and 1712b. The high-speed valves 1712a and 1712b are flow rate controllers for a source gas, and can also be referred to as flow rate controllers for an inert gas.

In the deposition apparatus illustrated in FIG. 5A, a thin film is formed over a surface of the substrate 1700 over which a film is formed in the following manner: the substrate 1700 over which a film is formed is transferred to put on the substrate holder 1716, the chamber 1701 is sealed, the substrate 1700 over which a film is formed is heated to a desired temperature (e.g., higher than or equal to 100° C. or higher than or equal to 150° C.) by heating the substrate holder 1716 with a heater; and supply of a source gas, evacuation with the evacuation unit 1715, supply of an inert gas, and evacuation with the evacuation unit 1715 are repeated.

In the deposition apparatus illustrated in FIG. 5A, an insulating layer formed using an oxide (including a composite oxide) containing one or more elements selected from hafnium (Hf), aluminum (Al), tantalum (Ta), zirconium (Zr), and the like can be formed by selecting as appropriate a source material (e.g., a volatile organometallic compound) used for the source material supply portions 1711a and 1711b. Specifically, it is possible to use an insulating layer formed using hafnium oxide, an insulating layer formed using aluminum oxide, an insulating layer formed using hafnium silicate, an insulating layer formed using aluminum silicate, or the like. Alternatively, a thin film, for example, a metal layer such as a tungsten layer or a titanium layer, or a nitride layer such as a titanium nitride layer can be formed by selecting as appropriate a source material (e.g., a volatile organometallic compound) used for the source material supply portions 1711a and 1711b.

For example, in the case where a hafnium oxide layer is formed by a deposition apparatus using an ALD method, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. In this case, the first source gas supplied from the source material supply portion 1711a is TDMAH, and the second source gas supplied from the source material supply portion 1711b is ozone. Note that the chemical formula of tetrakis(dimethylamide)hafnium is $Hf[N(CH_3)_2]_4$. Examples of another material include tetrakis(ethylmethylamide)hafnium. Note that nitrogen has a function of eliminating charge trap states. Therefore, when the source gas contains nitrogen, a hafnium oxide film having low density of charge trap states can be formed.

For example, in the case where an aluminum oxide layer is formed by a deposition apparatus utilizing an ALD method, two kinds of gases, for example, $H_2O$ as an oxidizer and a source gas which is obtained by vaporizing liquid containing a solvent and an aluminum precursor compound (e.g., trimethylaluminum (TMA)) are used. In this case, a first source gas supplied from the source material supply portion 1711a is TMA, and a second source gas supplied from the source material supply portion 1711b is $H_2O$. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, for example, an In—Ga—Zn—O film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. A $Zn(CH_3)_2$ gas may be used.

<<Multi-Chamber Manufacturing Apparatus>>

Figure 5B:
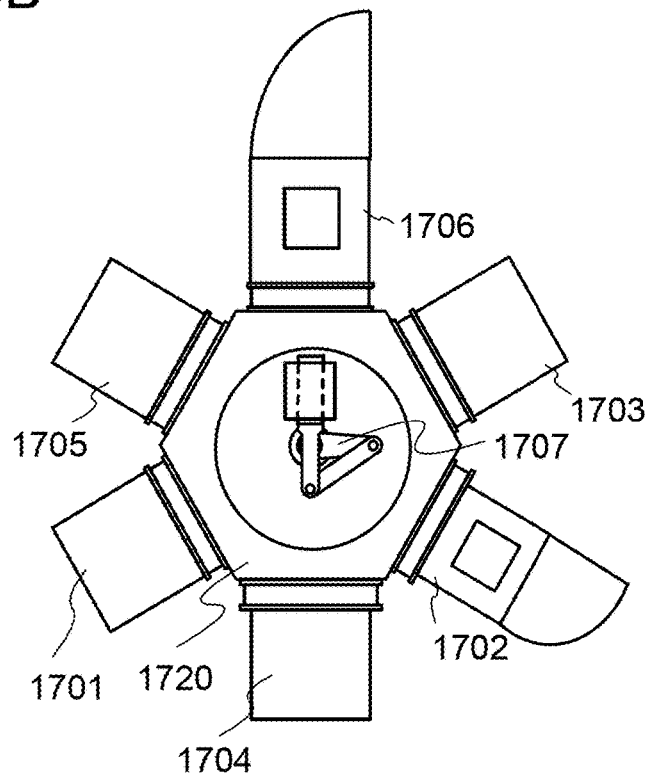
Figure 6A:
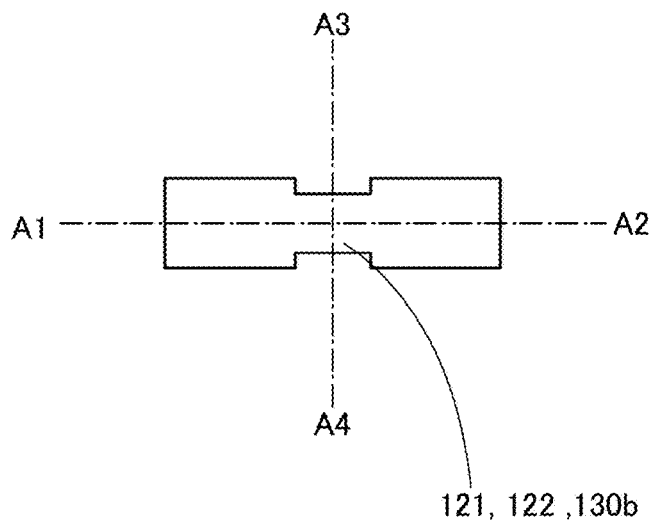
FIGS. 6A to 6C are a top view and cross-sectional views illustrating a method for manufacturing a transistor.
Figures 6B, 6C:
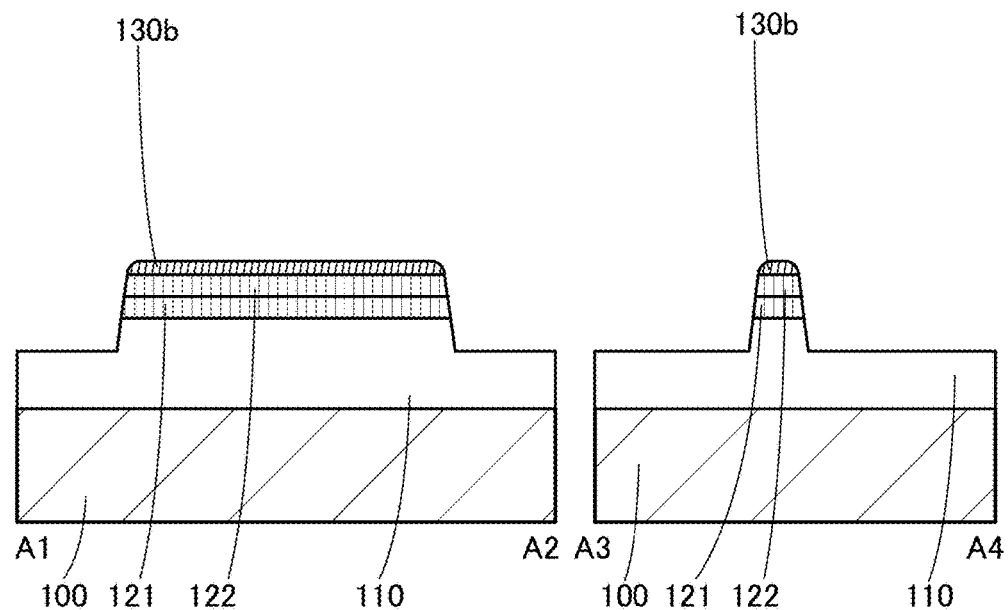

FIG. 5B Illustrates an Example of a Multi-Chamber Manufacturing Apparatus including at least one deposition apparatus illustrated in FIG. 5A.

In the manufacturing apparatus illustrated in FIG. 5B, a stack of films can be successively formed without exposure to the air, and entry of impurities is prevented and throughput is improved.

The manufacturing apparatus illustrated in FIG. 5B includes at least a load chamber 1702, a transfer chamber 1720, a pretreatment chamber 1703, a chamber 1701 which is a deposition chamber, and an unload chamber 1706. Note that in order to prevent attachment of moisture, the chambers of the manufacturing apparatus (including the load chamber, the treatment chamber, the transfer chamber, the deposition chamber, the unload chamber, and the like) are preferably filled with an inert gas (such as a nitrogen gas) whose dew point is controlled, further preferably maintain reduced pressure.

The chambers 1704 and 1705 may be deposition apparatuses utilizing an ALD method like the chamber 1701, deposition apparatuses utilizing a plasma CVD method, deposition apparatuses utilizing a sputtering method, or deposition apparatuses utilizing a metal organic chemical vapor deposition (MOCVD) method.

For example, an example in which a stack of films is formed under a condition that the chamber 1704 is a deposition apparatus utilizing a plasma CVD method and the chamber 1705 is a deposition apparatus utilizing an MOCVD method is shown below.

Although FIG. 5B illustrates an example in which a top view of the transfer chamber 1720 is a hexagon, a manufacturing apparatus in which the top surface shape is set to a polygon having more than six corners and more chambers are connected depending on the number of layers of a stack may be used. The top surface shape of the substrate is rectangular in FIG. 5B; however, there is no particular limitation on the top surface shape of the substrate. Although FIG. 5B illustrates an example of the single wafer type, a batch-type deposition apparatus in which a plurality of substrates are formed at a time may be used.

<Formation of Insulating Layer 110>

First, the insulating layer 110 is formed over the substrate 100. The insulating layer 110 can be formed by a plasma CVD method, a thermal CVD method (an MOCVD method or an ALD method), a sputtering method, or the like with the use of an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. Alternatively, these materials may be stacked, in which case an upper layer of the stacked layer which is in contact with a first insulator film to be the insulator 121 later is preferably formed using a material containing excess oxygen that can serve as a supply source of oxygen to the semiconductor layer 122.

For example, as the insulating layer 110, a 100-nm-thick silicon oxynitride film can be formed by a plasma CVD method.

Next, first heat treatment may be performed to release water, hydrogen, or the like contained in the insulating layer 110. As a result, the concentration of water, hydrogen, or the like contained in the insulating layer 110 can be reduced. The heat treatment can reduce the amount of water, hydrogen, or the like diffused to the first oxide semiconductor film formed later.

<Formation of First Insulator Film and Semiconductor Film>

Then, a first insulator film to be the insulator 121 later and a semiconductor film to be the semiconductor layer 122 later are formed over the insulating layer 110. The first insulator film and the semiconductor film can be formed by a sputtering method, an MOCVD method, a PLD method, or the like, and a sputtering method is preferable. As a sputtering method, an RF sputtering method, a DC sputtering method, an AC sputtering method, or the like can be used. In addition, a facing-target-type sputtering method (also referred to as a counter-electrode-type sputtering method, a gas phase sputtering method, and a vapor deposition sputtering (VDSP) method) is used, whereby plasma damage at the time of deposition can be reduced.

When the first insulator film is formed by a sputtering method, it is preferable that each chamber of the sputtering apparatus be able to be evacuated to a high vacuum (about $5 \times 10^{-7}$ Pa to $1 \times 10^{-4}$ Pa) by an adsorption vacuum pump such as a cryopump and that the chamber be able to heat a substrate over which a film is to be deposited to 100° C. or higher, preferably 400° C. or higher, so that water and the like acting as impurities in the oxide semiconductor can be removed as much as possible, for example. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation in a chamber but also high purity of a sputtering gas is necessary to obtain a high-purity intrinsic oxide semiconductor. When a highly purified gas having a dew point of −40° C. or lower, preferably −80° C. or lower and further preferably −100° C. or lower, is used as an oxygen gas or an argon gas used as a sputtering gas, moisture or the like can be prevented from entering an oxide semiconductor as much as possible.

As a sputtering gas, a rare gas (typically argon), an oxygen gas, or a mixed gas of a rare gas and an oxygen gas is used as appropriate. In the case of using the mixed gas of a rare gas and an oxygen gas, the proportion of oxygen to a rare gas is preferably increased.

Note that, for example, in the case where the oxide semiconductor film is formed by a sputtering method at a substrate temperature higher than or equal to 150° C. and lower than or equal to 750° C., preferably higher than or equal to 150° C. and lower than or equal to 450° C. and further preferably higher than or equal to 200° C. and lower than or equal to 420° C., the oxide semiconductor film can be a CAAC-OS film.

The material of the first insulator film is selected so that the first insulator film can have a lower electron affinity than the semiconductor film.

The indium content in the semiconductor film is preferably higher than those in the first insulator film and a second insulator film. As a semiconductor, an s orbital of heavy metal mainly contributes to carrier transfer. When the proportion of In in the semiconductor is increased, overlap of s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high content of indium for the semiconductor layer 122, a transistor having high field-effect mobility can be obtained.

When a sputtering method is used to form the first insulator film and the semiconductor film, the first insulator film and the semiconductor film can be successively formed without exposing to the air with the use of a multi-chamber sputtering apparatus. In that case, entry of unnecessary impurities and the like into the interface between the first insulator film and the semiconductor film can be prevented and the density of interface states can be reduced accordingly. Thus, the electrical characteristics of a transistor can be stabilized, particularly in a reliability test.

If the semiconductor film is damaged, the semiconductor film, which is a main conduction path, can keep a distance from the damaged part owing to the existence of the first insulator film. Thus, the electrical characteristics of a transistor can be stabilized, particularly in a reliability test.

For example, as the first insulator film, a 20-nm-thick oxide semiconductor film which is formed by a sputtering method using a target having an atomic ratio of In:Ga:Zn=1:3:4 can be used. In addition, as the semiconductor film, a 15-nm-thick oxide semiconductor film which is formed by a sputtering method using a target having an atomic ratio of In:Ga:Zn=1:1:1 can be used.

It is preferable to perform second heat treatment after the first insulator film and the semiconductor film are formed. The amount of oxygen vacancies in the semiconductor film can be reduced by performing the second heat treatment.

The temperature of the second heat treatment is higher than or equal to 250° C. and lower than the strain point of the substrate, preferably higher than or equal to 300° C. and lower than or equal to 650° C. and further preferably higher than or equal to 350° C. and lower than or equal to 550° C.

The second heat treatment is performed under an inert gas atmosphere containing nitrogen or a rare gas such as helium, neon, argon, xenon, or krypton. Further, after heat treatment performed in an inert gas atmosphere, heat treatment may be additionally performed in an oxygen atmosphere or a dry air atmosphere (air whose dew point is lower than or equal to −80° C., preferably lower than or equal to −100° C. and further preferably lower than or equal to −120° C.). The treatment may be performed under reduced pressure. Note that it is preferable that hydrogen, water, and the like be not contained in an inert gas and an oxygen gas, like the dry air, and the dew point is preferably lower than or equal to −80° C., further preferably lower than or equal to −100° C. The treatment time is 3 minutes to 24 hours.

In the second heat treatment, instead of an electric furnace, any device for heating an object by heat conduction or heat radiation from a heating element, such as a resistance heating element, may be used. For example, an RTA (rapid thermal annealing) apparatus, such as a GRTA (gas rapid thermal annealing) apparatus or an LRTA (lamp rapid thermal annealing) apparatus, can be used. The LRTA apparatus is an apparatus for heating an object to be processed by radiation of light (an electromagnetic wave) emitted from a lamp, such as a halogen lamp, a metal halide lamp, a xenon arc lamp, a carbon arc lamp, a high pressure sodium lamp, or a high pressure mercury lamp. The GRTA apparatus is an apparatus for the second heat treatment using a high-temperature gas. As the high-temperature gas, an inert gas, such as nitrogen or a rare gas like argon, is used.

Note that the second heat treatment may be performed after etching for forming the insulator 121 and the semiconductor layer 122 described later.

For example, after heat treatment is performed at 450° C. in a nitrogen atmosphere for one hour, heat treatment is performed at 450° C. in an oxygen atmosphere for one hour.

Through the above-described steps, oxygen vacancies and impurities such as hydrogen and water in the semiconductor films can be reduced. The semiconductor films can have low density of localized states.

<Formation of First Conductive Film>

Next, a first conductive film to be the source electrode layer 130 and the drain electrode layer 140 is formed over the semiconductor film. The first conductive film can be formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, or the like.

The first conductive film is preferably, for example, a conductive film having a single-layer structure or a stacked-layer structure and containing a material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), strontium (Sr), and the like, an alloy of such a material, or a compound containing any of these materials as its main component. For example, in the case of stacking layers, the lower conductive layer which is in contact with the semiconductor layer 122 contains a material which is easily bonded to oxygen, and the upper conductive layer contains a highly oxidation-resistant material. It is preferable to use a high-melting-point material, such as tungsten or molybdenum, which has both heat resistance and conductivity. In addition, the first conductive film is preferably formed using a low-resistance conductive material such as aluminum or copper. The first conductive film is further preferably formed using a Cu—Mn alloy, in which case a film containing manganese oxide formed at the interface with an insulator containing oxygen has a function of preventing Cu diffusion.

For example, as the first conductive film, a tungsten film having a thickness of 20 nm to 100 nm can be formed by a sputtering method.

A conductive layer 130b formed by processing the first conductive film in a subsequent step can have a function as a hard mask and a function as a source electrode layer and a drain electrode layer in the subsequent steps; thus, no additional step is needed. Thus, the semiconductor manufacturing process can be shortened.

<Formation of Insulator 121 and Semiconductor Layer 122>

Then, a resist mask is formed through a lithography process. Part of the first conductive film is selectively etched using the resist mask, so that the conductive layer 130b is formed. The resist over the conductive layer 130b is removed. The semiconductor film and the first oxide semiconductor film are selectively etched using the conductive layer 130b as a hard mask, so that the island-shaped semiconductor layer 122 and insulator 121 can be formed (see FIGS. 6A to 6C). A dry etching method can be used here. Note that the use of the conductive layer 130b as a hard mask for etching for the semiconductor film and the first insulator film can reduce edge roughness of the etched oxide semiconductor layer as compared to the case of using only a resist mask.

For example, the first oxide semiconductor film and the semiconductor film are selectively etched using a resist mask and a hard mask with a methane gas and an argon gas used as an etching gas, whereby the insulator 121 and the semiconductor layer 122 can be formed. At this time, the insulating layer 110 may be partly etched.

<Formation of Insulating Film>

Next, an insulating film 173a to be the insulating layer 173 is formed over the insulating layer 110 and the conductive layer 130b (see FIGS. 7A to 7C). The insulating film 173a can be formed by a plasma CVD method, a thermal CVD method (an MOCVD method or an ALD method), a sputtering method, a spin coating method, or the like with the use of an oxide insulating film of aluminum oxide ($AlO_x$), magnesium oxide ($MgO_x$), silicon oxide ($SiO_x$), silicon oxynitride ($SiO_xN_y$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), tantalum oxide ($TaO_x$), or the like; a nitride insulating film of silicon nitride ($SiN_x$), silicon nitride oxide ($SiN_xO_y$), aluminum nitride ($AlN_x$), aluminum nitride oxide ($AlN_xO_y$), or the like; or a mixed material of any of these. Alternatively, these materials may be stacked.

Alternatively, a low-dielectric constant material (a low-k material) may be used for the insulating film 173a. For example, silicon oxide into which several percentage fluorine (F) is introduced (SiOF), silicon oxide into which several percentage carbon (C) is introduced (SiOC), fluorinesilicate glass (FSG), organosilicate glass (OSG), silsesquioxane hydride (HSQ), methylsilsesquioxane (MSQ), an organic polymer, polyimide, a fluorine resin (e.g., polytetrafluoroethylene), amorphous carbon to which fluorine is added, or the like can be used.

Note that the second heat treatment may be performed after the formation of the insulating film 173a.

<Planarization of Second Insulating Film>

Then, planarization treatment is performed on the insulating film 173a until the conductive layer 130b is exposed, so that the insulating layer 173 is formed (see FIGS. 8A to 8C). The planarization treatment can be performed by a chemical mechanical polishing (CMP) method or the like. Accordingly, the thickness of an insulating film 175a described later which is over the conductive layer 130b in the substrate surface can be formed uniformly.

Note that the second heat treatment may be performed after the planarization of the insulating film 173a.

<Formation of Insulating Film>

Figure 9A:
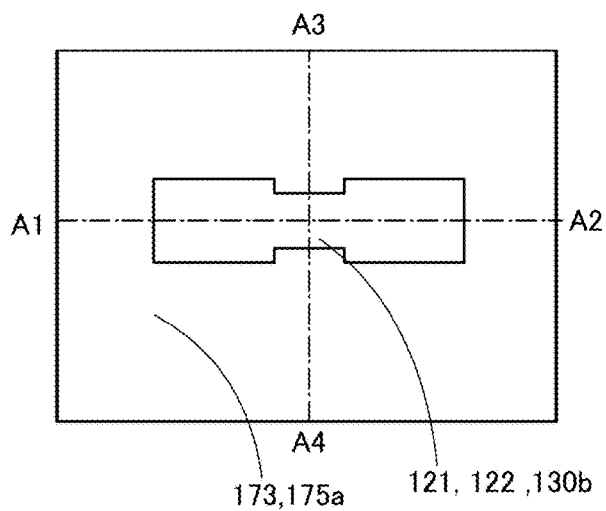
FIGS. 9A to 9C are a top view and cross-sectional views illustrating the method for manufacturing a transistor.
Figures 9B, 9C:
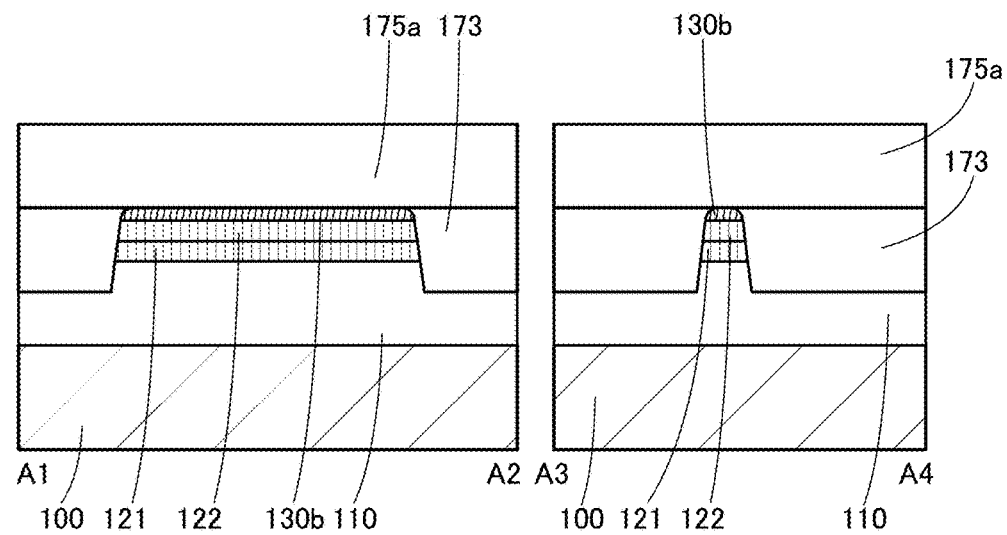

Next, the third insulating film 175a to be the insulating layer 175 is formed over the insulating layer 173 and the conductive layer 130b (see FIGS. 9A to 9C).

The insulating film 175a can be formed using a material and a method similar to those for the insulating film 173a.

<Formation of Groove Portion>

Next, a resist mask 176 is formed over the insulating film 175a by a lithography process (see FIGS. 10A to 10C). Note that the lithography process may be performed after an organic film is applied to the insulating film 175a or an organic film is applied to the resist. The organic film contains propylene glycolmonomethyl ether, ethyl lactate, or the like. The organic film has a function as an anti-reflection film (a bottom anti-reflective coating (BARC) film) during light exposure, and can improve adhesion to the resist, the resolution, and the like.

Note that in the case where a transistor having an extremely short channel length is formed, at least the conductive layer in a region to divide the conductive layer 130b to be the source electrode layer 130 and the drain electrode layer 140 is etched using a resist mask that is processed by a method suitable for micropatterning, such as electron beam exposure, liquid immersion exposure, or extreme ultraviolet (EUV) exposure. Note that in the case of forming the resist mask by electron beam exposure, a positive resist mask is used, so that an exposed region can be minimized and throughput can be improved. In the above manner, a transistor having a channel length of 100 nm or less, further, 30 nm or less can be formed. Alternatively, minute processing may be performed by an exposure technology which uses X-rays or the like.

With the resist mask, processing is partly performed on the insulating film 175a by a dry etching method. Accordingly, a groove portion 174 is formed at the same time as the formation of the insulating layer 175.

Figure 11A:
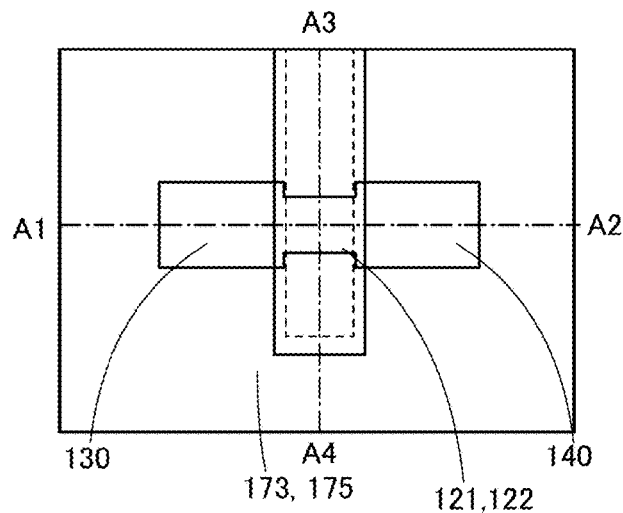
FIGS. 11A to 11C are a top view and cross-sectional views illustrating the method for manufacturing a transistor.
Figures 11B, 11C:
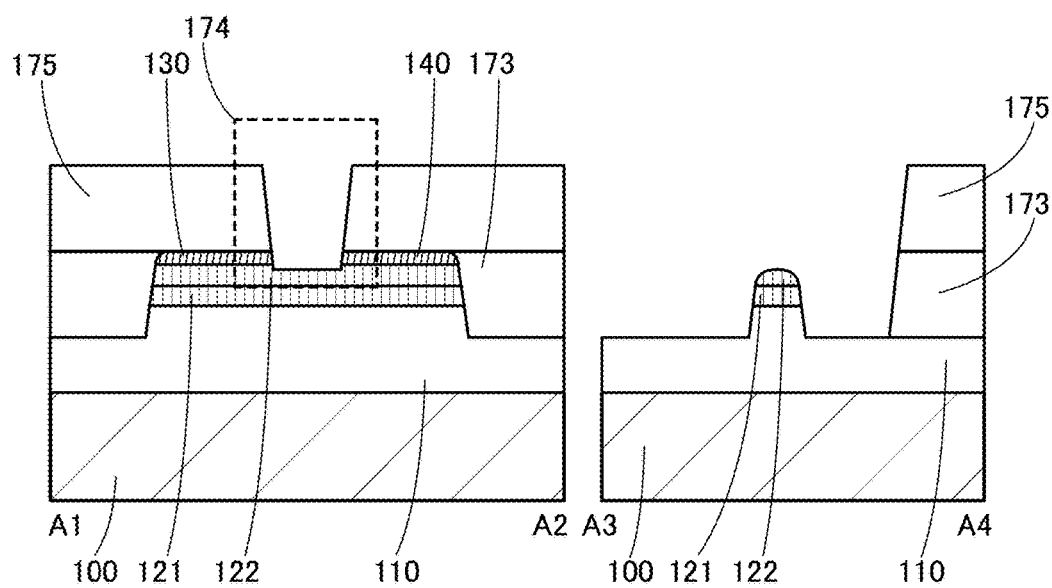
Figure 13A:
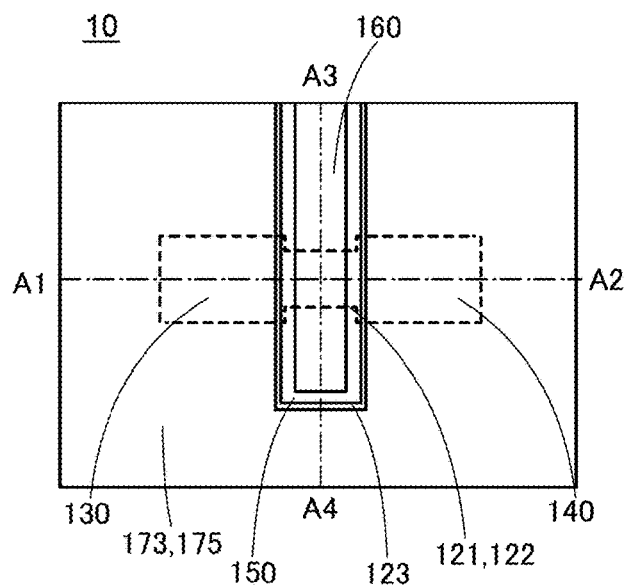
FIGS. 13A to 13C are a top view and cross-sectional views illustrating the method for manufacturing a transistor.
Figure 13B:
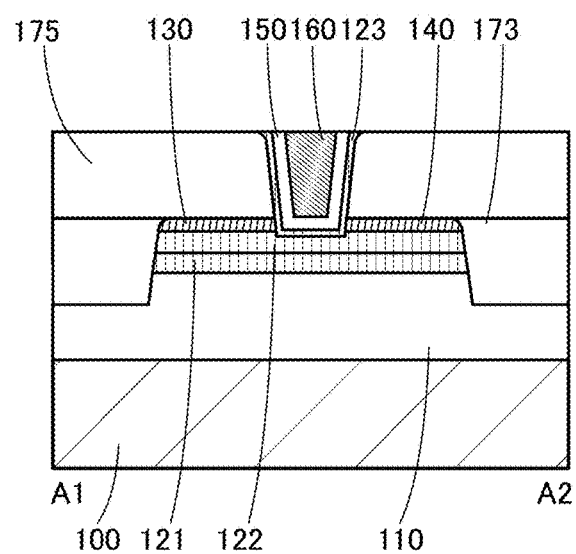
Figure 13C:
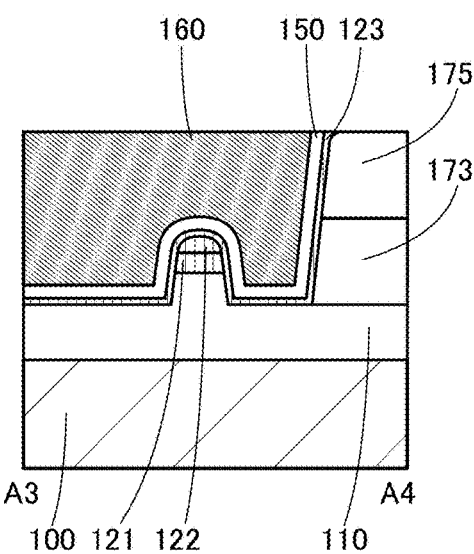
Figure 14A:
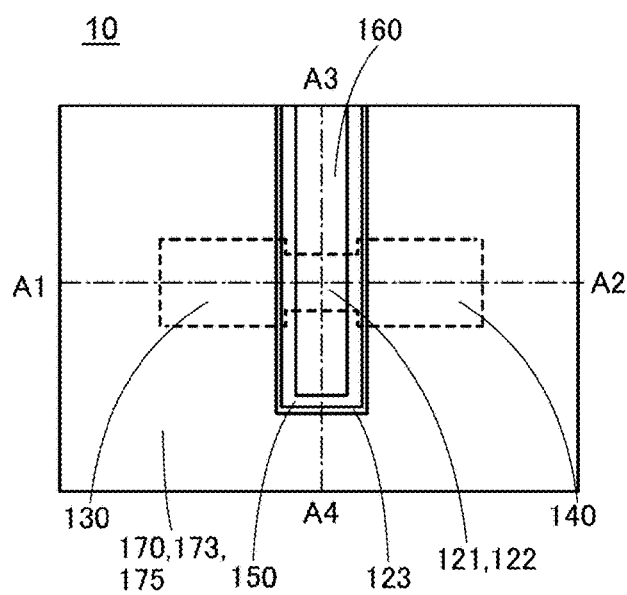
FIGS. 14A to 14C are a top view and cross-sectional views illustrating the method for manufacturing a transistor.
Figure 14B:
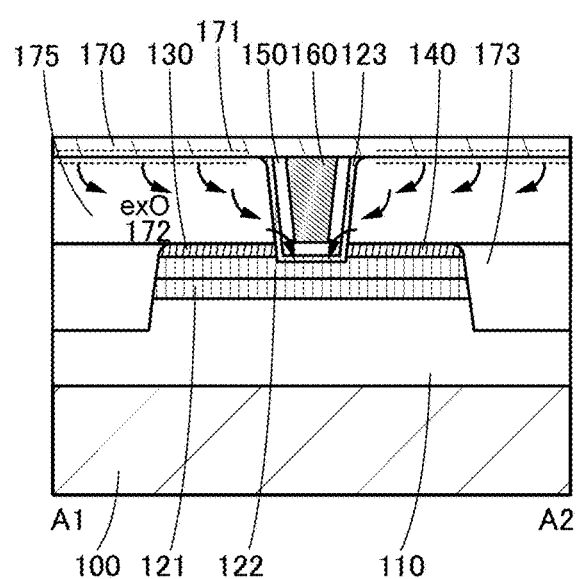
Figure 14C:
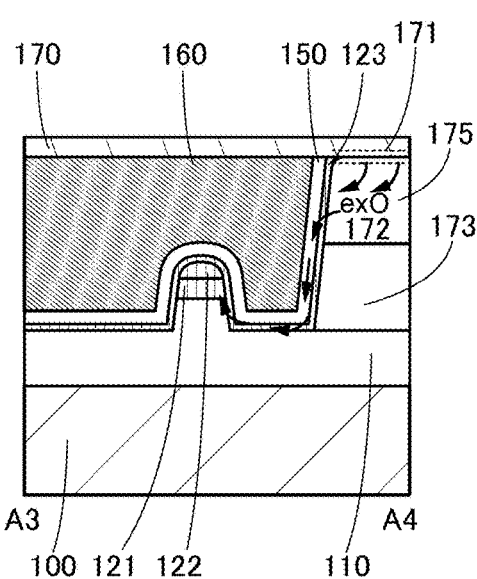

Then, the exposed conductive layer 130b is partly etched to be divided, so that the source electrode layer 130 and the drain electrode layer 140 can be formed (see FIGS. 11A to 11C).

After the source electrode layer 130 and the drain electrode layer 140 are formed, cleaning treatment is preferably performed to remove an etching residue. The cleaning treatment can prevent a short circuit between the source electrode layer 130 and the drain electrode layer 140. The cleaning treatment can be performed using an alkaline solution such as a tetramethylammonium hydroxide (TMAH) solution, an acidic solution such as diluted hydrofluoric acid, an oxalic acid solution, or a phosphoric acid solution. By the cleaning treatment, part of the semiconductor layer 122 is etched and a depression is formed in the semiconductor layer 122.

For example, the silicon oxynitride film formed as the insulating film 173a is planarized, a resist mask is formed over the silicon oxynitride film by a lithography method, an opening is formed in the silicon oxynitride film by a dry etching method using the resist mask and gas containing carbon or fluorine, and dry etching is performed on the conductive layer 130b using a chlorine-based gas or a fluorine-based gas, whereby the source electrode layer 130 and the drain electrode layer 140 can be formed.

<Formation of Second Insulator Film 123a>

Next, a second insulator film 123a to be the insulator 123 is formed over the semiconductor layer 122 and the insulating layer 175. The second insulator film 123a can be formed in a manner similar to that of the first insulator film. The materials can be selected such that the electron affinity of the second insulator film 123a is smaller than that of the semiconductor film.

For example, as the second insulator film 123a, a 5-nm-thick oxide semiconductor film which is formed by a sputtering method using a target having an atomic ratio of In:Ga:Zn=1:3:2 can be used.

<Formation of Insulating Film 150a>

Next, an insulating film 150a to be the gate insulating layer 150 is formed over the second insulator film 123a. The insulating film 150a can be formed using aluminum oxide ($AlO_x$), magnesium oxide ($MgO_x$), silicon oxide ($SiO_x$), silicon oxynitride ($SiO_xN_y$), silicon nitride oxide, silicon nitride, gallium oxide, germanium oxide, yttrium oxide, zirconium oxide, lanthanum oxide, neodymium oxide, hafnium oxide, tantalum oxide, or the like. The insulating film 150a may be a stack containing any of these materials. The insulating film 150a can be formed by a sputtering method, a CVD method such as a plasma CVD method, a MOCVD method, or an ALD method, an MBE method, or the like. The insulating film 150a can be formed by a method similar to that of the insulating layer 110 as appropriate.

For example, a 10-nm-thick silicon oxynitride film is formed by a plasma CVD method as the insulating film 150a.

<Formation of Conductive Film 160a>

Next, a conductive film 160a to be the gate electrode layer 160 is formed over the insulating film 150a (see FIGS. 12A to 12C). For example, aluminum (Al), titanium (Ti), chromium (Cr), cobalt (Co), nickel (Ni), copper (Cu), yttrium (Y), zirconium (Zr), molybdenum (Mo), ruthenium (Ru), silver (Ag), gold (Au), platinum (Pt), tantalum (Ta), and tungsten (W), or an alloy material containing any of these as its main component can be used for the conductive film 160a. The conductive film 160a can be formed by a sputtering method, a CVD method such as a plasma CVD method, a MOCVD method, or an ALD method, an MBE method, an evaporation method, a plating method, or the like. The conductive film 160a may be formed using a conductive film containing nitrogen or a stack including the conductive film and a conductive film containing nitrogen. Note that the conductive film 160a may have either a single-layer structure or a stacked-layer structure.

For example, a stack of a 10-nm-thick titanium nitride film formed by an ALD method and a 150-nm-thick tungsten film formed by a metal CVD method can be used.

<Planarization Treatment>

Next, planarization treatment is performed. The planarization treatment can be performed by a CMP method, a dry etching method, or the like. The planarization treatment may be terminated at the time when the insulating film 150a is exposed, may be terminated at the time when the second insulator film 123a is exposed, or may be terminated at the time when the insulating layer 175 is exposed. Accordingly, the gate electrode layer 160, the gate insulating layer 150, and the insulator 123 can be formed (see FIGS. 13A to 13C).

In the case where the second insulator film 123a or the insulating film 150a is provided over the insulating layer 175 that has been planarized, another resist mask may be used for the processing. The resist mask is formed over the second insulator film 123a or the insulating film 150a by a lithography process. The mask has a larger area than that of the top surface portion of the gate electrode layer 160. The insulating film 150a and the second insulator film 123a are selectively etched using the mask, so that the gate insulating layer 150 and the insulator 123 can be formed.

In the transistor 10, by providing the insulator 123 in which oxygen vacancies are unlikely to occur, release of oxygen from side surfaces of the insulator 123 in the channel width direction is suppressed, so that generation of oxygen vacancies can be suppressed. As a result, a transistor which has improved electrical characteristics and high reliability can be provided.

<Formation of Insulating Layer 170>

Next, the insulating layer 170 is formed over the insulating layer 173, the insulator 123, the gate insulating layer 150, and the gate electrode layer 160.

The insulating layer 170 can be formed by a plasma CVD method, a thermal CVD method (an MOCVD method or an ALD method), a sputtering method, or the like with the use of an oxide insulating film of aluminum oxide ($AlO_x$), magnesium oxide ($MgO_x$), silicon oxide ($SiO_x$), silicon oxynitride ($SiO_xN_y$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), tantalum oxide ($TaO_x$), or the like; a nitride insulating film of silicon nitride ($SiN_x$), silicon nitride oxide ($SiN_xO_y$), aluminum nitride ($AlN_x$), aluminum nitride oxide ($AlN_xO_y$), or the like; or a mixed material of any of these. Alternatively, these materials may be stacked. Alternatively, an oxide containing In or Zn may be used for the insulating layer 170. Typically, In—Ga oxide, In—Zn oxide, In—Mg oxide, Zn—Mg oxide, or In-M-Zn oxide (M is Al, Ti, Ga, Y, Zr, Sn, La, Ce, Mg, or Nd) can be given as the oxide.

As the insulating layer 170, an aluminum oxide film is preferably formed by a sputtering method. Moreover, aluminum oxide is preferably used as a sputtering target. An oxygen gas is preferably used as a gas used for forming the insulating layer 170.

A mixed layer 171 is formed at an interface with the insulating layer 173 when the aluminum oxide film is formed.

For example, the oxygen gas used for forming the insulating layer 170 exists in a variety of states such as an oxygen radical, an oxygen ion, or an oxygen atom during the formation by a sputtering method owing to the influence of applied voltage, power, plasma, substrate temperature, or the like. At this time, oxygen (excess oxygen (exO)) 172 is added to the insulating layer 173 or the mixed layer 171.

<Oxygen Addition>

The manufacturing method of the transistor 10 is not limited to the above, and treatment for adding oxygen may be additionally performed. Oxygen may be added to the insulating layer 110, or the first oxide semiconductor film or the second insulator film 123a described above. As oxygen that is added, at least one kind selected from oxygen radicals, oxygen atoms, oxygen atomic ions, oxygen molecular ions, and the like is used. As a method for adding oxygen, an ion doping method, an ion implantation method, a plasma immersion ion implantation method, or the like can be used.

In the case of using an ion implantation method as the method for adding oxygen, oxygen atomic ions or oxygen molecular ions can be used. The use of oxygen molecular ions can reduce damage to a film to which oxygen is added. Oxygen molecular ions are broken down into oxygen atomic ions at the surface of the film to which oxygen is added, and the oxygen atomic ions are added. Since energy for breaking oxygen molecules down into oxygen atoms is used, the energy per oxygen atomic ion in the case of adding oxygen molecular ions to the film to which oxygen is added is lower than that in the case of adding oxygen atomic ions to the film to which oxygen is added. Therefore, damage to the film to which oxygen is added can be reduced.

In the case of injecting oxygen molecular ions, the energy per oxygen atomic ion is low as compared with the case of injecting oxygen atomic ions. Thus, by using oxygen molecular ions for injection, the acceleration voltage can be increased and throughput can be increased. Moreover, by using oxygen molecular ions for injection, the same amount of oxygen atomic ions can be added at a dose half that necessary in the case of using oxygen atomic ions. As a result, throughput of the manufacturing process can be increased.

In the case of adding oxygen to the film to which oxygen is added, it is preferable that oxygen be added to the film to which oxygen is added so that a peak of the concentration profile of oxygen atomic ions is located in the film to which oxygen is added. In that case, the acceleration voltage for implantation can be lowered as compared to the case where oxygen atomic ions are implanted, and damage to the film to which oxygen is added can be reduced. In other words, defects in the film to which oxygen is added can be reduced, and variations in electrical characteristics of the transistor can be suppressed. As a result, damage to the film to which oxygen is added can be reduced, suppressing variation in the electrical characteristics of the transistor.

Plasma treatment (plasma immersion ion implantation method) in which the film to which oxygen is added is exposed to plasma generated in an atmosphere containing oxygen may be performed to add oxygen to the film to which oxygen is added. As the atmosphere containing oxygen, an atmosphere containing an oxidation gas such as oxygen, ozone, dinitrogen monoxide, or nitrogen dioxide can be given. Note that it is preferable that the film to which oxygen is added be exposed to plasma generated in a state where bias is applied on the substrate 100 side because the amount of oxygen added to the film to which oxygen is added can be increased. As an example of an apparatus with which such plasma treatment is performed, an ashing apparatus is given.

For example, oxygen molecular ions can be added to the first oxide semiconductor film by an ion implantation method with a dose of $1\times10^{16}/cm^2$ at an acceleration voltage of 5 kV.

Through the above-described steps, which are combined with heat treatment in a later step, the amount of oxygen vacancies in the semiconductor layer 122 can be reduced. Note that the film to which oxygen is added has a low film density compared with the film to which oxygen is not added.

Next, third heat treatment may be performed. The third heat treatment can be performed typically at a temperature higher than or equal to 150° C. and lower than the strain point of the substrate, preferably higher than or equal to 250° C. and lower than or equal to 500° C. and further preferably higher than or equal to 300° C. and lower than or equal to 450° C. By the heat treatment, added oxygen 172 is diffused and transferred to the semiconductor layer 122, and oxygen vacancies in the semiconductor layer 122 can be filled with the oxygen (see FIGS. 14A to 14C).

For example, the insulating layer 170 can be formed by a sputtering method with an aluminum oxide ($AlO_x$) target and 50 vol % of an oxygen gas used as a sputtering gas. The thickness can be greater than or equal to 20 nm and less than or equal to 40 nm. The third heat treatment can be performed at 400° C. in an oxygen atmosphere for one hour.

Through the above-described steps, the density of localized states of the semiconductor films is lowered, and thus a transistor with excellent electrical characteristics can be manufactured. In addition, a highly reliable transistor in which a variation in electrical characteristics with time or a variation in electrical characteristics due to a stress test is small can be manufactured.

Embodiment 2

In this embodiment, a method for manufacturing a transistor 11 and a transistor 12 each having a structure different from the structure of the transistor 10 described in Embodiment 1 will be described.

<Modification Example 1 of Transistor 10: Transistor 11>

The transistor 11 which is different in shape from the transistor 10 illustrated in FIGS. 1A to 1C is described with reference to FIGS. 15A to 15C.

Figure 15A:
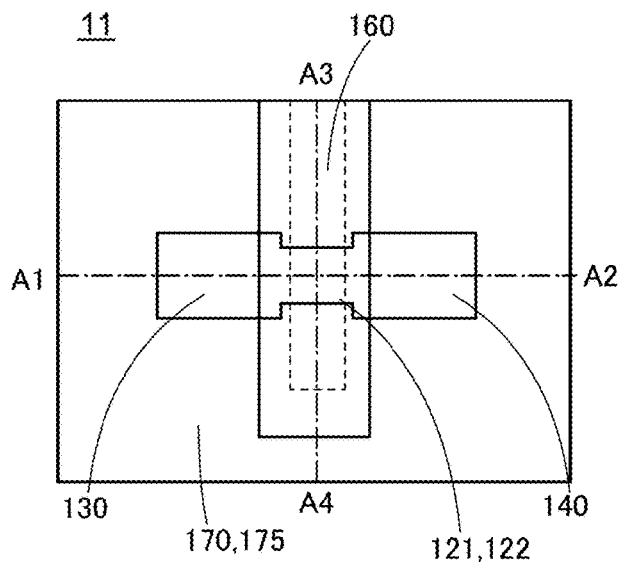
FIGS. 15A to 15C are a top view and cross-sectional views of a transistor.
Figure 15B:
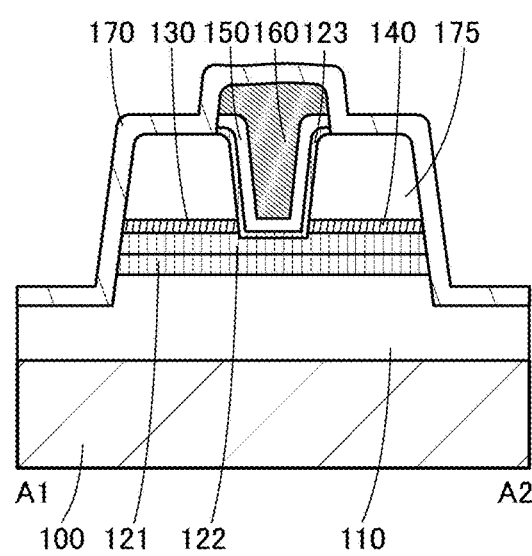
Figure 15C:
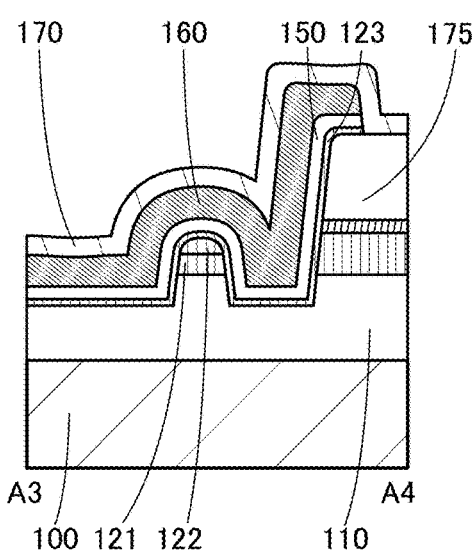

FIGS. 15A to 15C are a top view and cross-sectional views of the transistor 11. FIG. 15A is a top view of the transistor 11, FIG. 15B is a cross-sectional view taken along the dashed-dotted line A1-A2 in FIG. 15A, and FIG. 15C is a cross-sectional view taken along the dashed-dotted line A3-4 in FIG. 15A.

The transistor 11 is different from the transistor 10 in that the insulating layer 170 includes regions in contact with side surfaces of the insulator 121, the semiconductor layer 122, the source electrode layer 130, the drain electrode layer 140, and the insulating layer 175.

Moreover, the manufacturing method of the transistor 11 is different from that of the transistor 10 in that the insulator 121, the semiconductor layer 122, the source electrode layer 130, the drain electrode layer 140, and the insulating layer 175 are formed in the same step and planarization treatment is not performed in each step, as will be described later.

<Manufacturing Method of Transistor 11>

A manufacturing method of the transistor 11 is described with reference to FIGS. 16A to 16C, FIGS. 17A to 17C, FIGS. 18A to 18C, FIGS. 19A to 19C, FIGS. 20A to 20C, FIGS. 21A to 21D, FIGS. 22A to 22D, and FIGS. 23A to 23C. Note that for steps similar to those of the transistor 10 described in Embodiment 1, the description of the transistor is referred to.

Figure 16A:
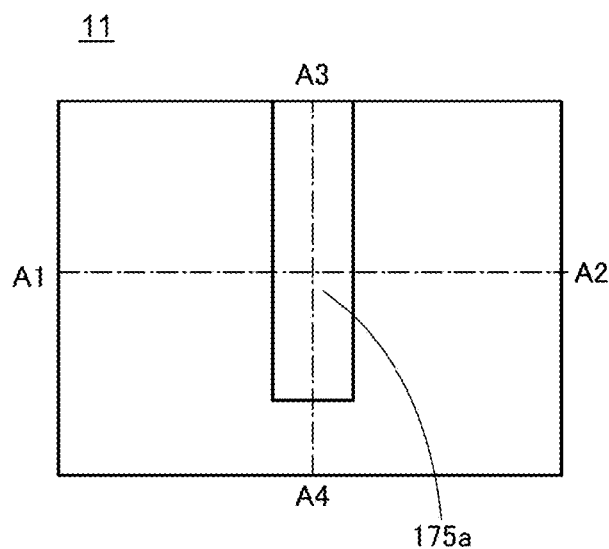
FIGS. 16A to 16C are a top view and cross-sectional views illustrating a method for manufacturing a transistor.
Figure 16B:
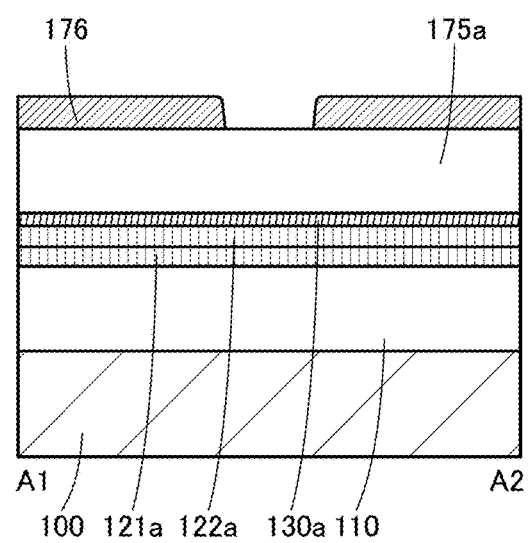
Figure 16C:
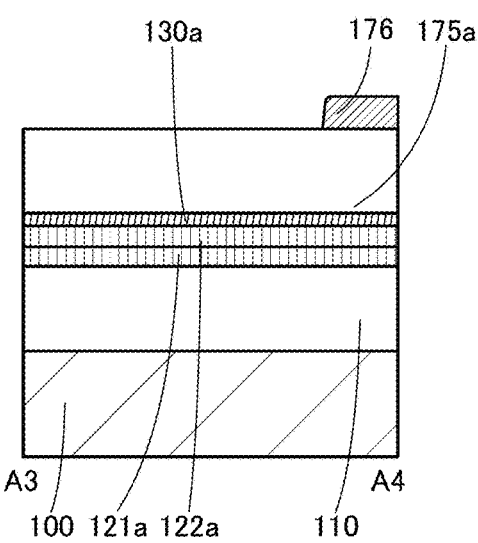

As illustrated in FIGS. 16A and 16B, the insulating layer 110, a first insulator film 121a to be the insulator 121, a semiconductor film 122a to be the semiconductor layer 122, a conductive film 130a to be the source electrode layer 130 and the drain electrode layer 140, and the insulating film 175a to be the insulating layer 175 are formed, and a resist mask 176 is formed over the insulating film 175a by a lithography method.

Next, the insulating film 175a and the conductive film 130a are partly etched with the resist mask 176, so that the groove portion 174, an insulating layer 175b, and the conductive layer 130b are formed (see FIGS. 17A to 17C).

Figure 18A:
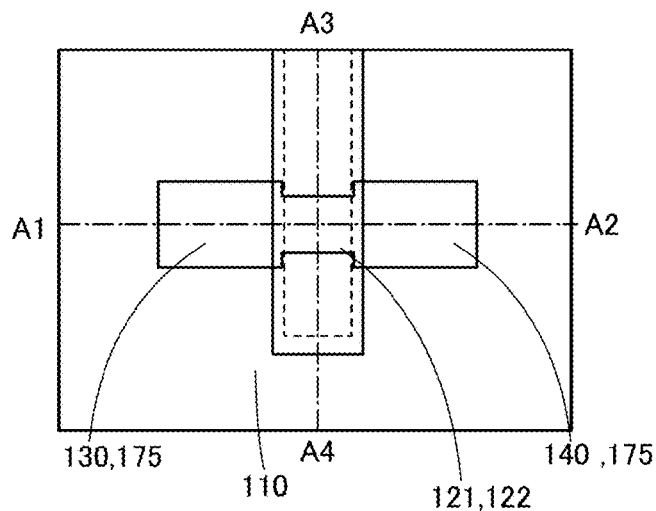
FIGS. 18A to 18C are a top view and cross-sectional views illustrating the method for manufacturing a transistor.
Figures 18B, 18C:
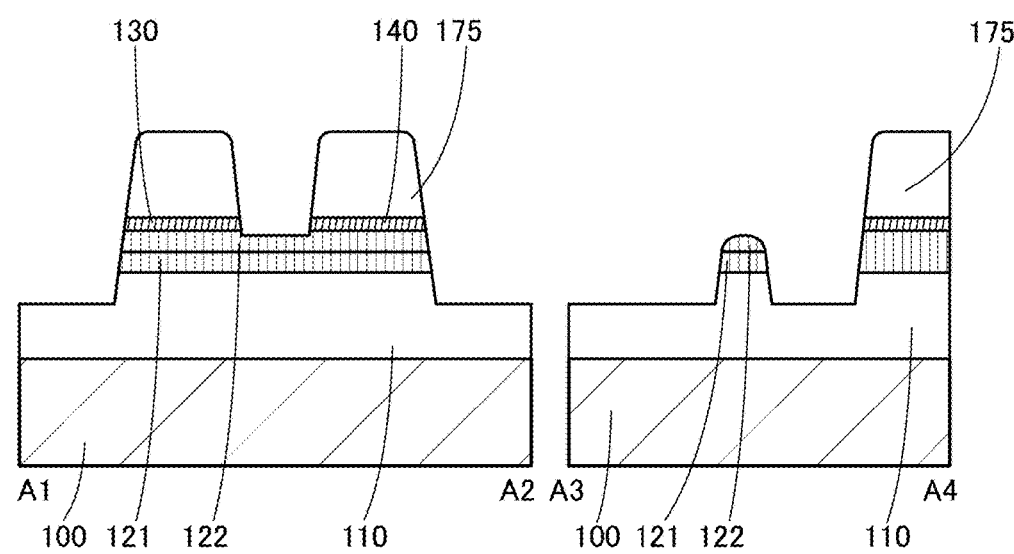

The insulating layer 175b, the conductive layer 130b, the semiconductor film 122a, and the first insulator film 121a are partly etched with a resist mask, so that the insulator 121, the semiconductor layer 122, the source electrode layer 130, the drain electrode layer 140, and the insulating layer 175 are formed (see FIGS. 18A to 18C).

Figure 19A:
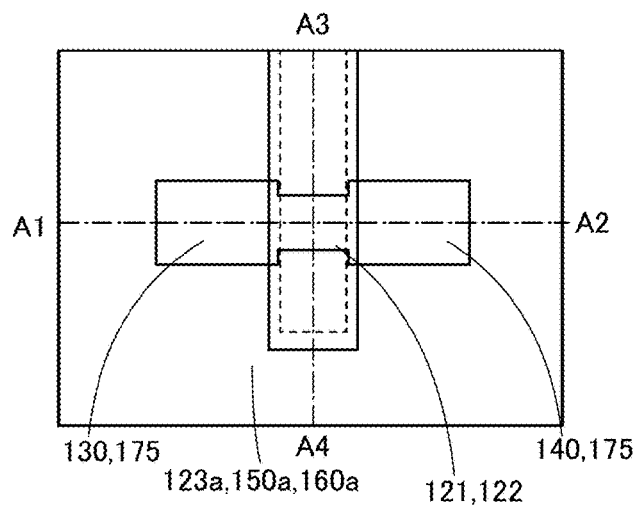
FIGS. 19A to 19C are a top view and cross-sectional views illustrating the method for manufacturing a transistor.
Figures 19B, 19C:
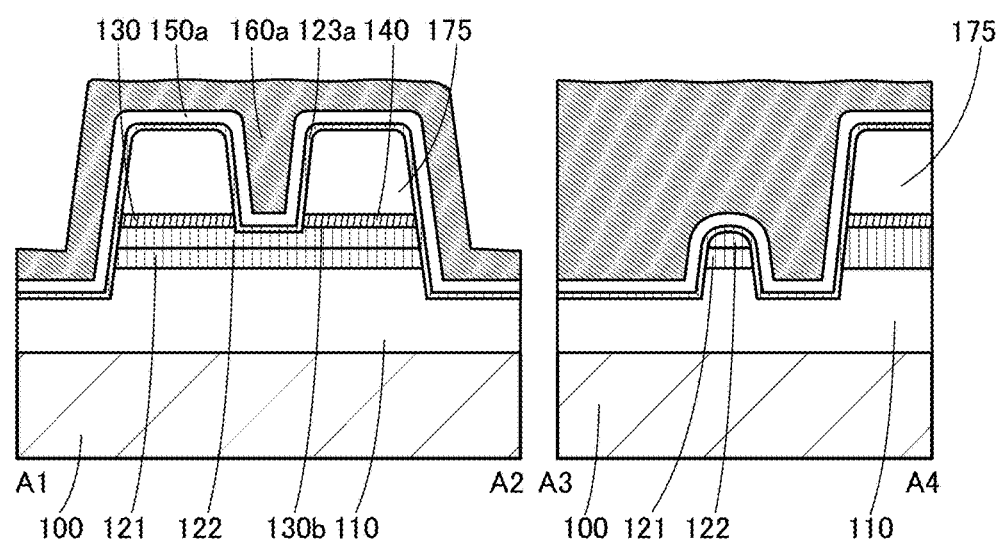

The second insulator film 123a to be the insulator 123, the insulating film 150a to be the gate insulating layer 150, and the conductive film 160a to be the gate electrode layer 160 are sequentially formed (see FIGS. 19A to 19C).

Figure 20A:
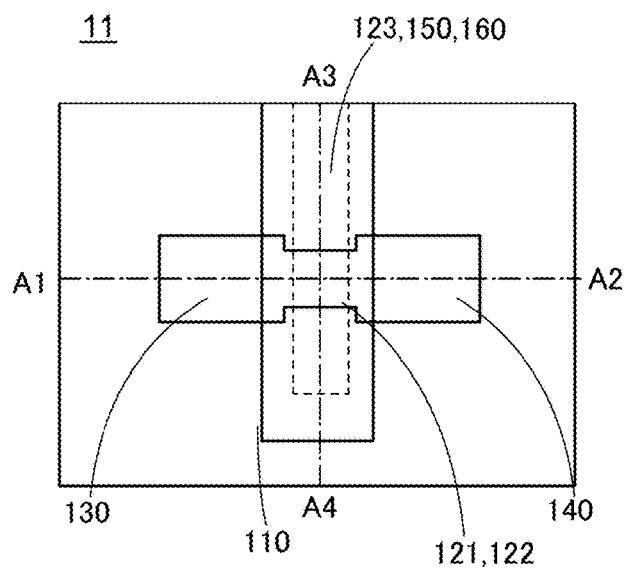
FIGS. 20A to 20C are a top view and cross-sectional views illustrating the method for manufacturing a transistor.
Figure 20B:
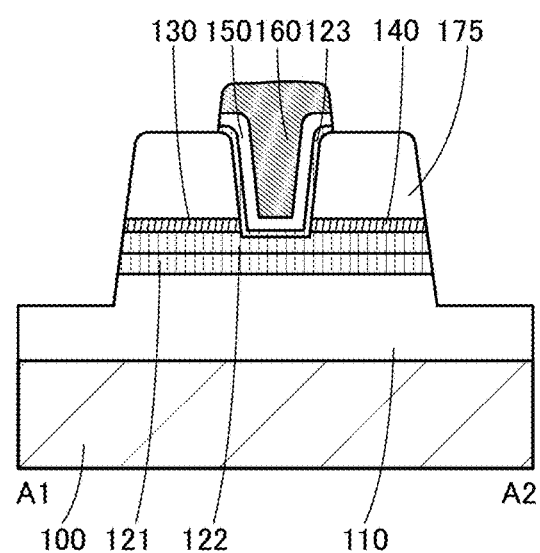
Figure 20C:
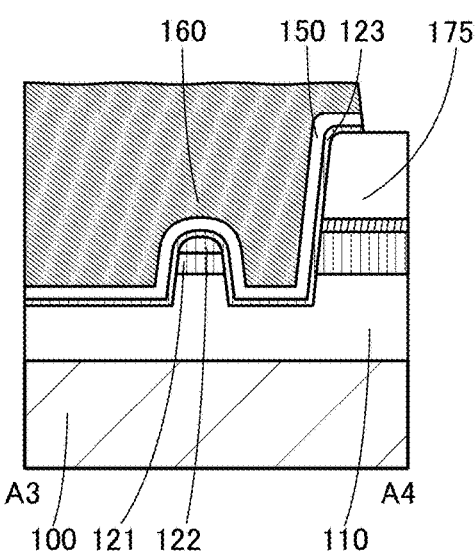
Figure 22A:
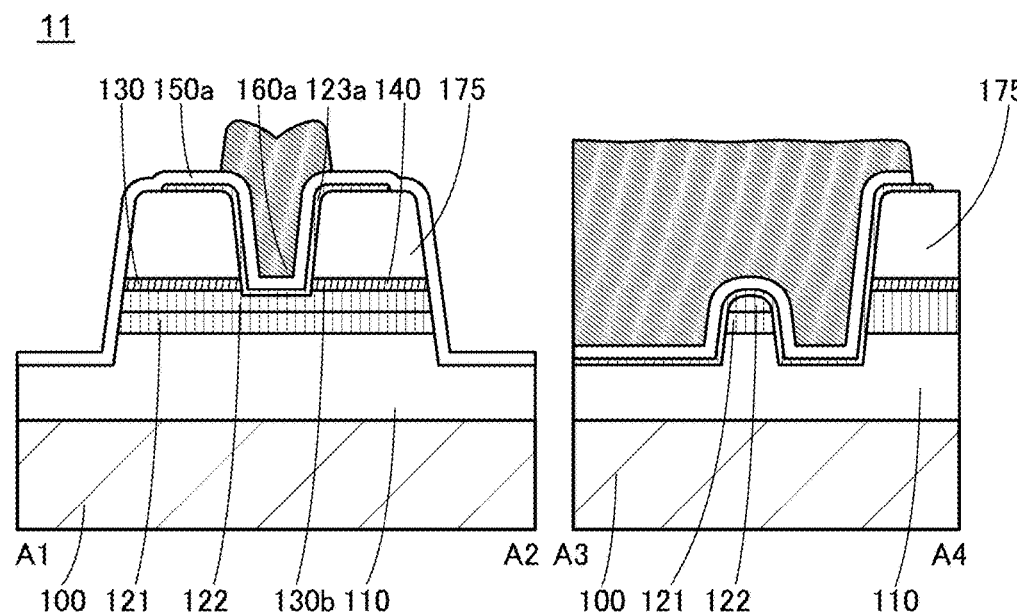
FIGS. 22A to 22D are cross-sectional views illustrating the method for manufacturing a transistor.
Figure 22B:
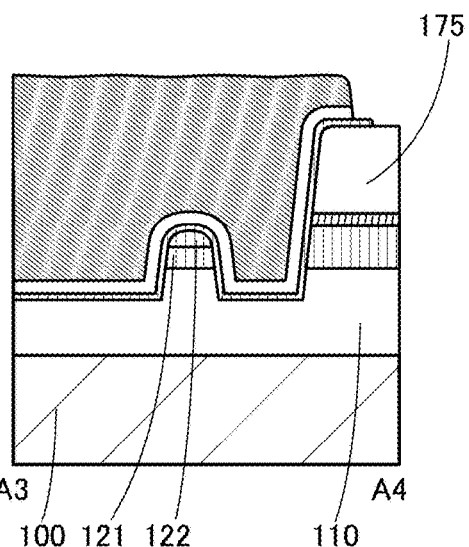
Figure 22C:
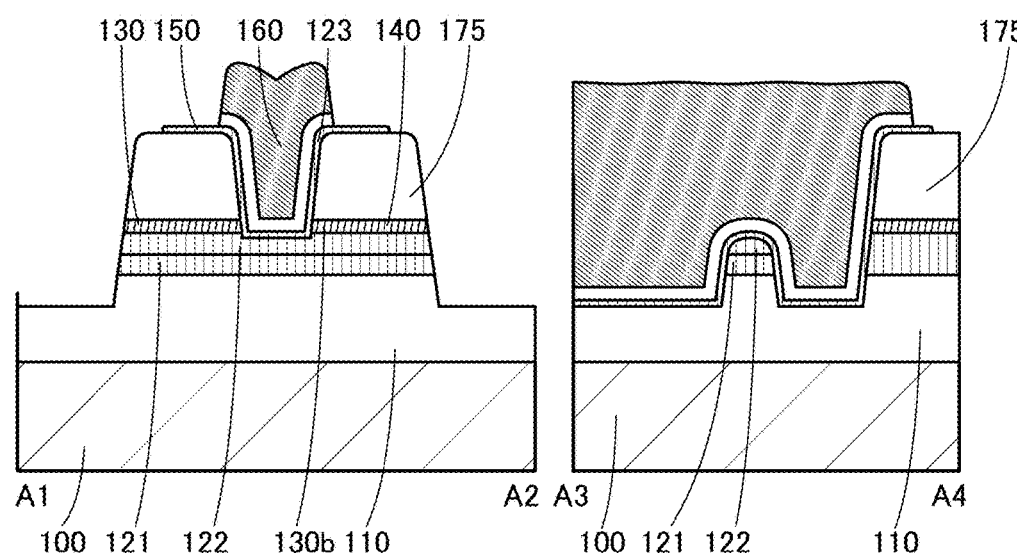
Figure 22D:
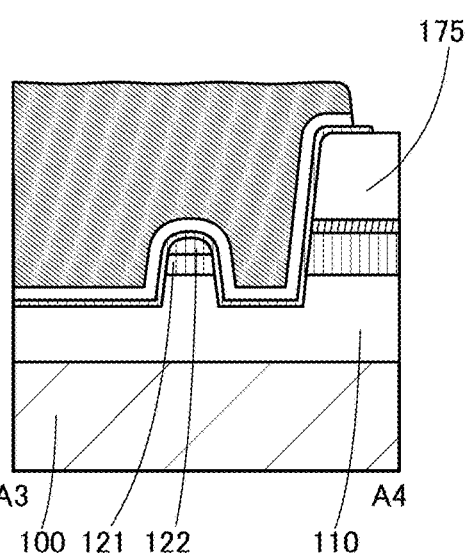

Then, the conductive film 160a, the insulating film 150a, and the second insulator film 123a are partly etched with a resist mask formed by a lithography method, so that the insulator 123, the gate insulating layer 150, and the gate electrode layer 160 are formed (see FIGS. 20A to 20C).

Note that the insulator 123, the gate insulating layer 150, and the gate electrode layer 160 are not necessarily formed at a time. As illustrated in FIGS. 21A to 21D and FIGS. 22A to 22D, the insulator 123 and the gate electrode layer 160 may be formed without etching the insulating film 150a. The insulator 123 may be formed so that its end portion does not overlap with an end portion of the gate insulating layer 150 and an end portion of the gate electrode layer 160.

Figure 23A:
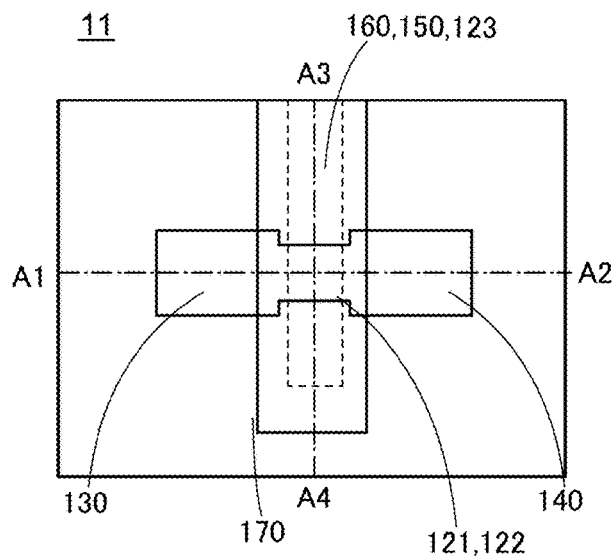
FIGS. 23A to 23C are a top view and cross-sectional views illustrating the method for manufacturing a transistor.
Figure 23B:
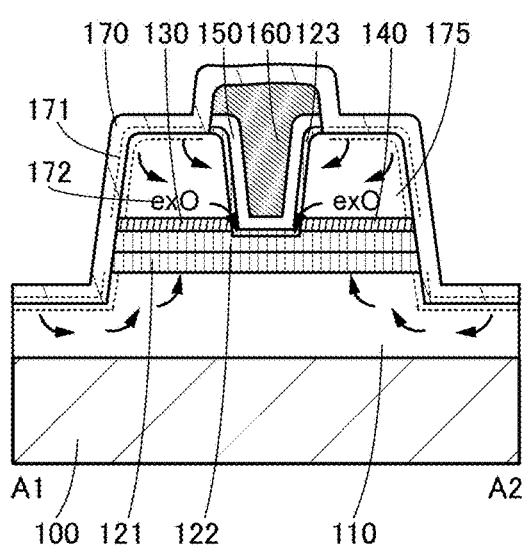
Figure 23C:
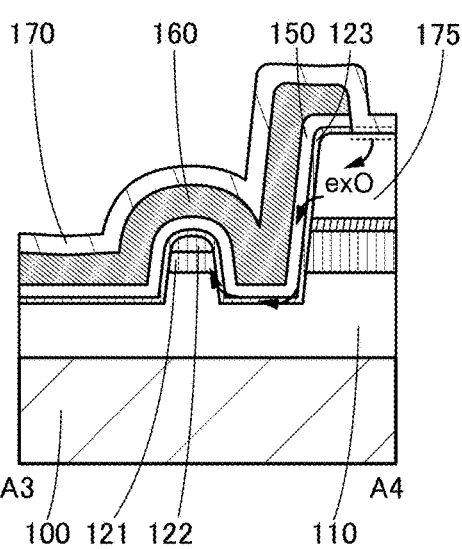

Next, the insulating layer 170 is formed and subjected to heat treatment, so that oxygen 172 is diffused to the semiconductor layer 122 and oxygen vacancies in the semiconductor layer 122 can be reduced (see FIGS. 23A to 23C).

Through the above-described steps, the transistor 11 can be manufactured.

In the manufacturing method of the transistor 11, the insulating film 175a to be the insulating layer 175 can be formed before the conductive film 130a to be the source electrode layer 130 and the drain electrode layer 140 is processed, so that the thickness of the insulating film 175a can be uniform in the substrate surface and time for etching treatment at the formation of the groove portion 174 can be stabilized. Accordingly, the transistor 11 can be manufactured stably and the shape of the transistor can be stabilized. Thus, the transistor characteristics can be stabilized.

<Modification Example 2 of Transistor 10: Transistor 12>

The transistor 12 which is different in shape from the transistor 10 illustrated in FIGS. 1A to 1C is described with reference to FIGS. 24A to 24C.

FIGS. 24A to 24C are a top view and cross-sectional views of the transistor 12. FIG. 24A is a top view of the transistor 12, FIG. 24B is a cross-sectional view taken along the dashed-dotted line A1-A2 in FIG. 24A, and FIG. 24C is a cross-sectional view taken along the dashed-dotted line A3-4 in FIG. 24A.

The transistor 12 is different from the transistor 10 in including an insulating layer 177.

The manufacturing method is different from that of the transistor 10 in that the first insulator film 121a to be the insulator 121, the semiconductor film 122a to be the semiconductor layer 122, the conductive film 130a to be the source electrode layer 130 and the drain electrode layer 140, the insulating film 175a to be the insulating layer 175, and an insulating film 177a to be the insulating layer 177 are formed before being processed, as will be described later.

<Manufacturing Method of Transistor 12>

The manufacturing method of the transistor 12 is described with reference to FIGS. 25A to 25C, FIGS. 26A to 26C, FIGS. 27A to 27C, FIGS. 28A to 28C, FIGS. 29A to 29C, FIGS. 30A to 30C, FIGS. 31A to 31C, and FIGS. 32A to 32C. Note that for steps similar to those of the transistor 10 described in Embodiment 1, the description of the transistor is referred to.

Figure 25A:
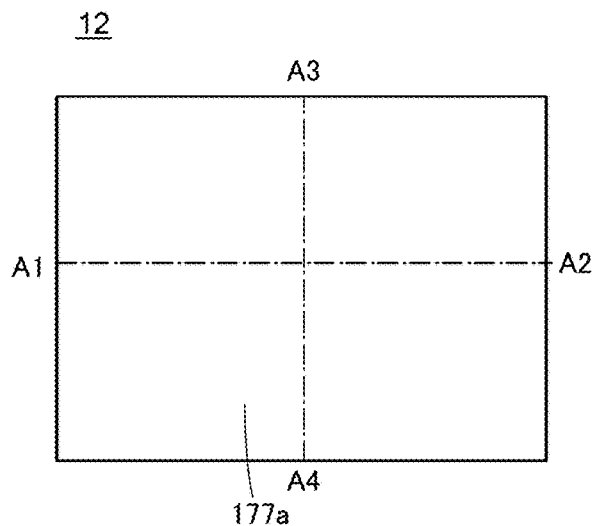
FIGS. 25A to 25C are a top view and cross-sectional views illustrating a method for manufacturing a transistor.
Figures 25B, 25C:
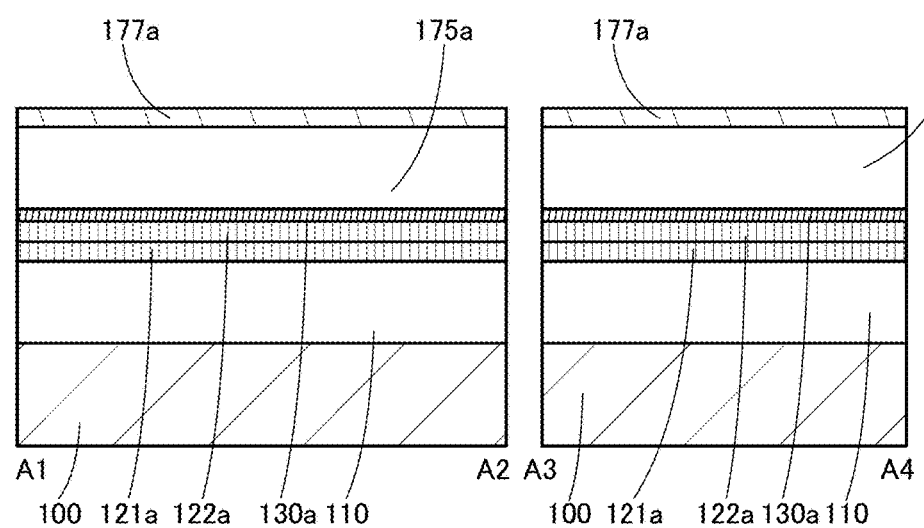

Over the insulating layer 110, the first insulator film 121a to be the insulator 121, the semiconductor film 122a to be the semiconductor layer 122, the conductive film 130a to be the source electrode layer 130 and the drain electrode layer 140, the insulating film 175a to be the insulating layer 175, and the insulating film 177a to be the insulating layer 177 are sequentially formed before being processed (see FIGS. 25A to 25C).

The insulating layer 177 can be formed using a material and a method similar to those for the insulating layer 170.

Figure 26A:
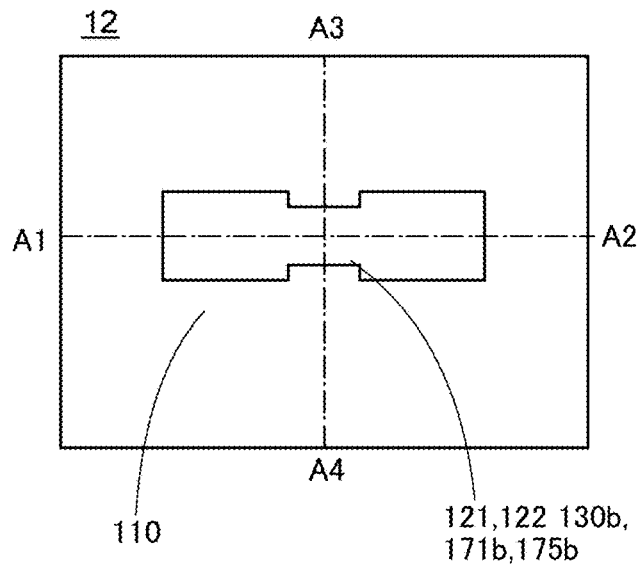
FIGS. 26A to 26C are a top view and cross-sectional views illustrating the method for manufacturing a transistor.
Figure 26B:
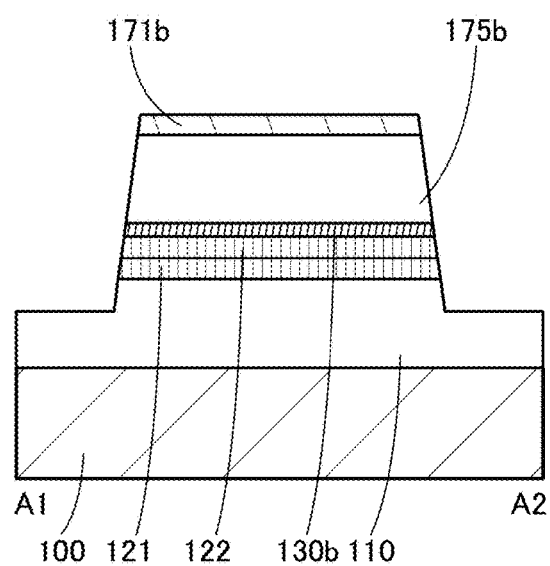
Figure 26C:
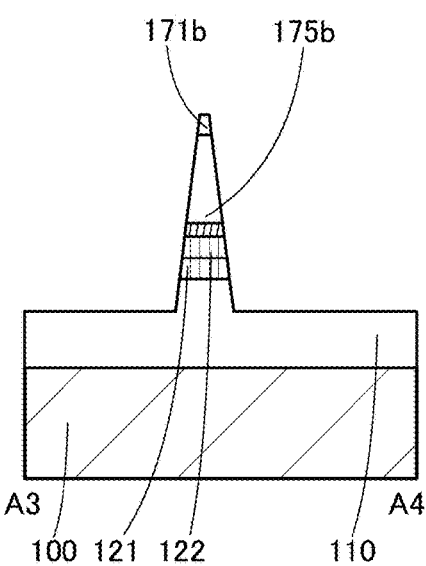

Next, the insulating film 177a, the insulating film 175a, the conductive film 130a, the semiconductor film 122a, and the first insulator film 121a are partly etched with a resist mask, so that the insulator 121, the semiconductor layer 122, the conductive layer 130b, the insulating layer 175b, and an insulating layer 171b are formed (see FIGS. 26A to 26C). At this time, the insulating layer 110 may be partly etched.

Next, the insulating film 173a to be the insulating layer 173 is formed (see FIGS. 27A to 27C). The insulating film 173a can be formed by a plasma CVD method, a thermal CVD method (an MOCVD method or an ALD method), a sputtering method, a spin coating method, or the like.

Figure 28A:
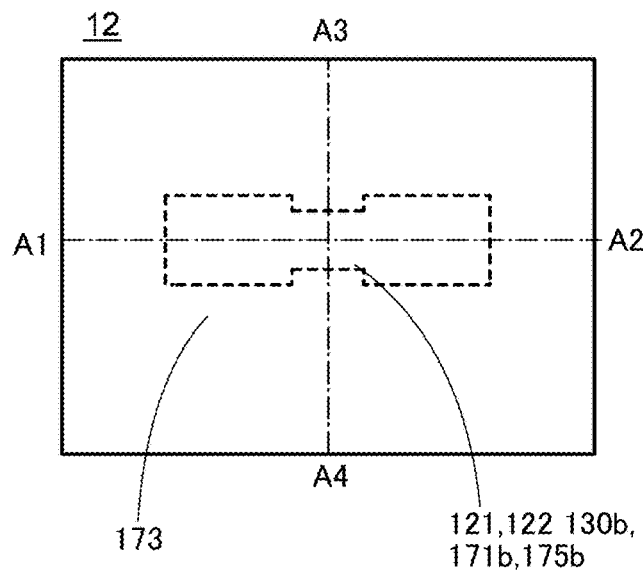
FIGS. 28A to 28C are a top view and cross-sectional views illustrating the method for manufacturing a transistor.
Figure 28B:
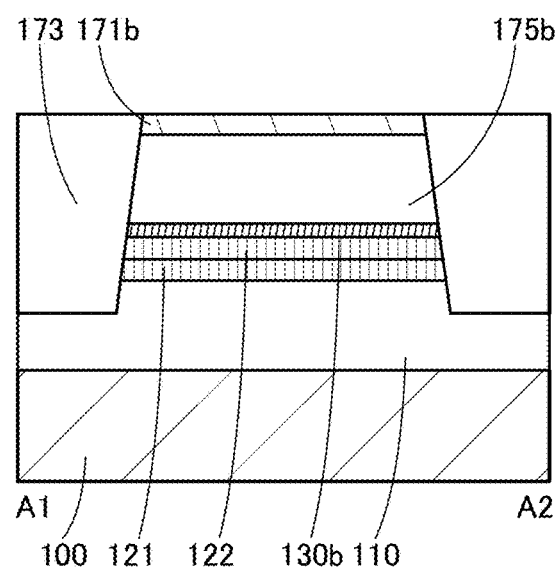
Figure 28C:
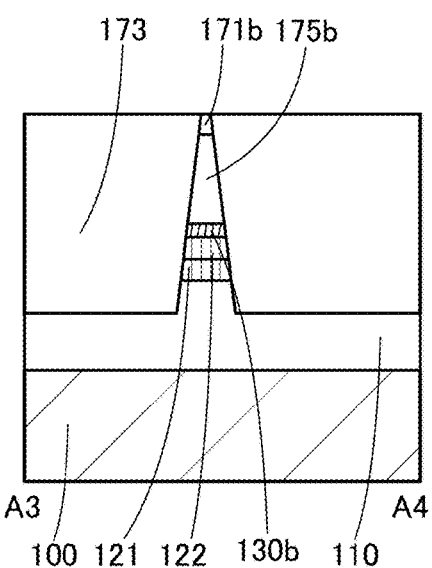

Then, planarization treatment by CMP is performed on the insulating film 173a until the insulating layer 171b is exposed, so that the insulating layer 173 is formed (see FIGS. 28A to 28C). Note that the insulating layer 171b preferably has a function as a stopper, i.e. has a lower polishing rate than the insulating layer 173 under the same CMP processing conditions.

Then, a resist mask is formed through a lithography process over the insulating layer 173 and the insulating layer 171b. Part of the conductive layer 130b is selectively etched using the insulating layer 171b as a hard mask until the semiconductor layer 122 is exposed. Accordingly, the source electrode layer 130, the drain electrode layer 140, and the insulating layer 175 are formed (see FIGS. 29A to 29C).

Figure 30A:
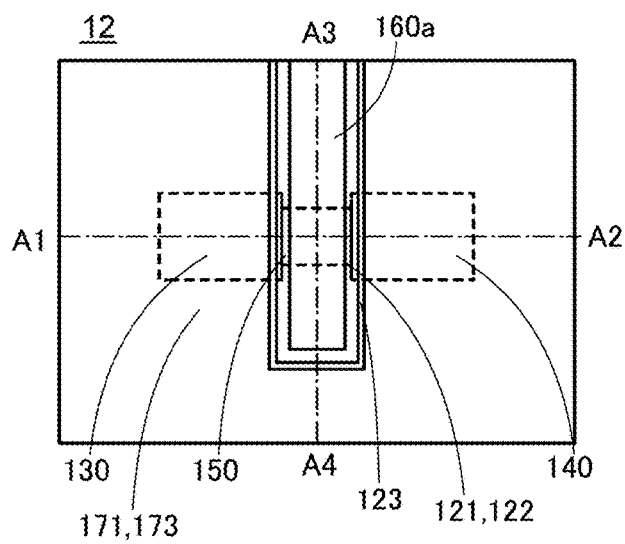
FIGS. 30A to 30C are a top view and cross-sectional views illustrating the method for manufacturing a transistor.
Figure 30B:
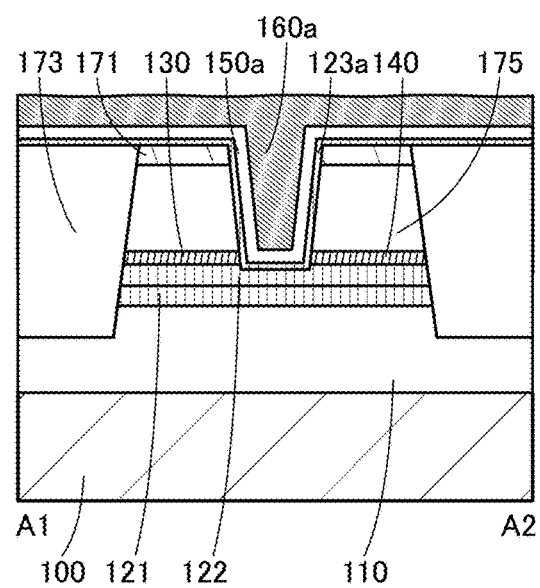
Figure 30C:
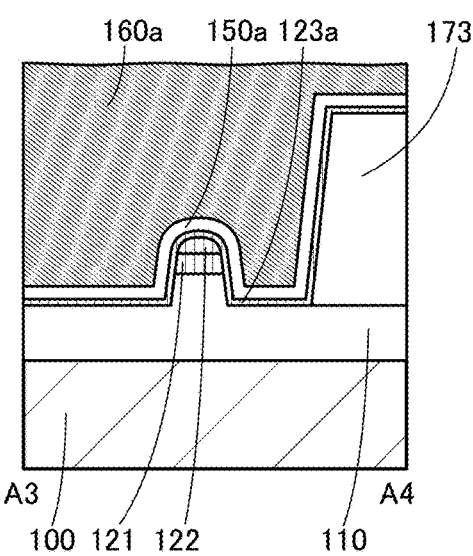

The second insulator film 123a, the insulating film 150a, and the conductive film 160a are sequentially formed (see FIGS. 30A to 30C).

Then, planarization treatment is performed on the conductive film 160a, the insulating film 150a, and the second insulator film 123a, so that the insulator 123, the gate insulating layer 150, and the gate electrode layer 160 are formed (see FIGS. 31A to 31C).

Next, the insulating layer 170 is formed and subjected to heat treatment, so that oxygen 172 is diffused to the semiconductor layer 122 and oxygen vacancies in the semiconductor layer 122 can be reduced (see FIGS. 32A to 32C).

Through the above-described steps, the transistor 12 can be manufactured.

In the manufacturing method of the transistor 12, the insulating film 175a to be the insulating layer 175 can be formed before the conductive film 130a to be the source electrode layer 130 and the drain electrode layer 140 is processed, so that the thickness of the insulating film 175a can be uniform in the substrate surface and time for etching treatment at the formation of the groove portion 174 can be stabilized. Accordingly, the transistor 12 can be manufactured stably and the shape of the transistor can be stabilized. Thus, the transistor characteristics (e.g., a threshold voltage or reliability) can be stabilized.

This embodiment can be combined as appropriate with any of the other embodiments in this specification.

Embodiment 3

<Oxide Semiconductor Structure>

In this embodiment, the structure of an oxide semiconductor will be described.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 33A:
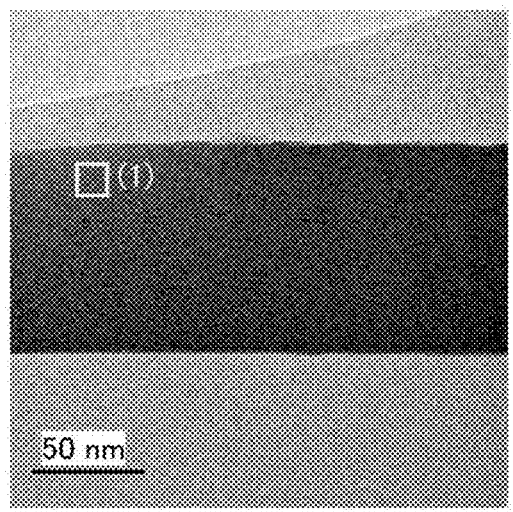
FIGS. 33A to 33D are Cs-corrected high-resolution TEM images of a cross section of a CAAC-OS and a cross-sectional schematic view of the CAAC-OS.

The CAAC-OS observed with a TEM is described below. FIG. 33A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 33B:
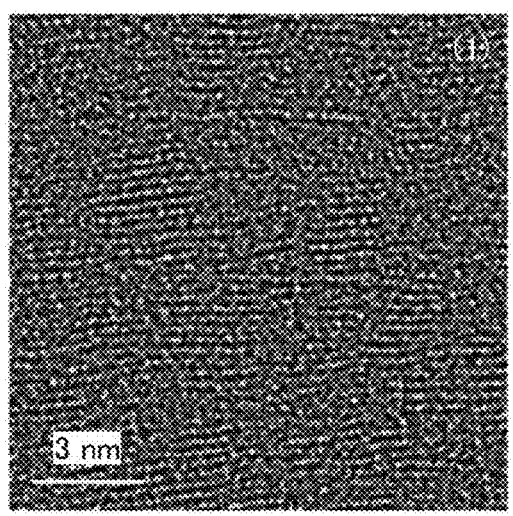

FIG. 33B is an enlarged Cs-corrected high-resolution TEM image of a region (1) in FIG. 33A. FIG. 33B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 33C:
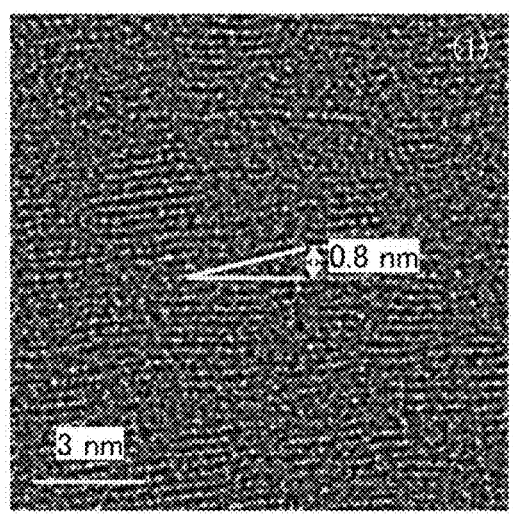

As shown in FIG. 33B, the CAAC-OS film has a characteristic atomic arrangement. The characteristic atomic arrangement is denoted by an auxiliary line in FIG. 33C. FIGS. 33B and 33C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 33D:
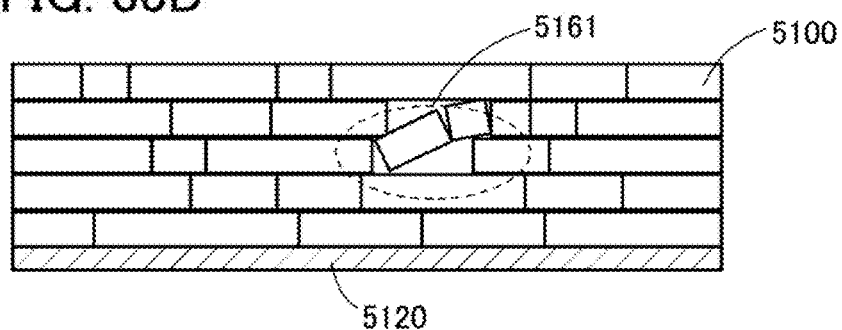

Here, according to the Cs-corrected high-resolution TEM images, the schematic arrangement of pellets 5100 of a CAAC-OS layer over a substrate 5120 is illustrated by such a structure in which bricks or blocks are stacked (see FIG. 33D). The part in which the pellets are tilted as observed in FIG. 33C corresponds to a region 5161 illustrated in FIG. 33D.

FIG. 34A shows a Cs-corrected high-resolution TEM image of a plane of the CAAC-OS observed from a direction substantially perpendicular to the sample surface. FIGS. 34B, 34C, and 34D are enlarged Cs-corrected high-resolution TEM images of regions (1), (2), and (3) in FIG. 34A, respectively. FIGS. 34B, 34C, and 34D indicate that metal atoms are arranged in a triangular, quadrangular, or hexagonal configuration in a pellet. However, there is no regularity of arrangement of metal atoms between different pellets.

Figure 35A:
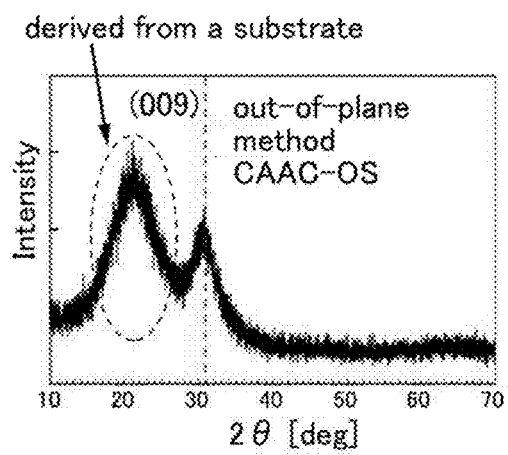
FIGS. 35A to 35C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 35A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 35B:
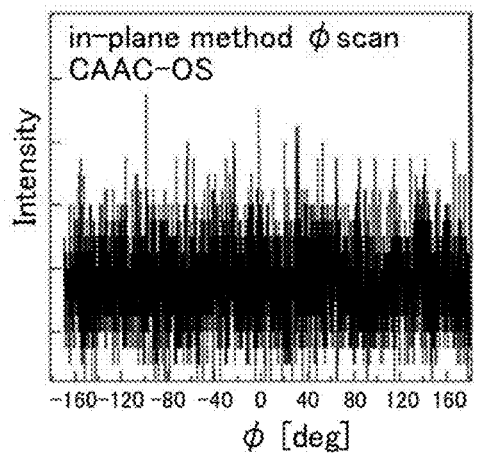
Figure 35C:
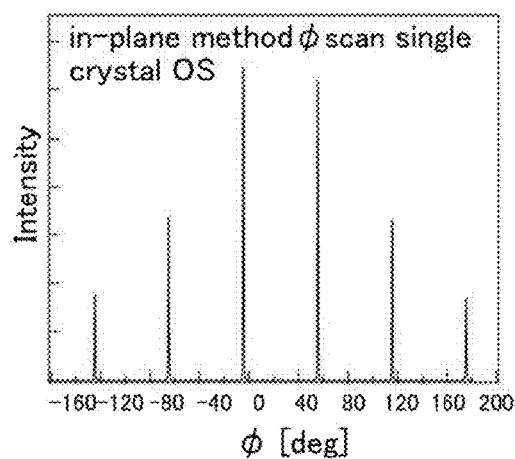

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 35B, a peak is not clearly observed. In contrast, in the case of a single crystal oxide semiconductor of InGaZnO$_4$, when φ scan is performed with 2θ fixed at around 56°, as shown in FIG. 35C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 36A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 36B shows a diffraction pattern obtained in such a manner that an electron beam with a probe diameter of 300 nm is incident on the same sample in a direction perpendicular to the sample surface. As shown in FIG. 36B, a ring-like diffraction pattern is observed. Thus, the electron diffraction also indicates that the a-axes and b-axes of the pellets included in the CAAC-OS do not have regular alignment. The first ring in FIG. 36B is considered to be derived from the (010) plane, the (100) plane, and the like of the InGaZnO$_4$ crystal. Furthermore, it is supposed that the second ring in FIG. 36B is derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. Furthermore, oxygen vacancy in the oxide semiconductor serves as a carrier trap or serves as a carrier generation source when hydrogen is captured therein.

The CAAC-OS having small amounts of impurities and oxygen vacancies is an oxide semiconductor film with low carrier density (specifically, lower than $8 \times 10^{11}/cm^3$, preferably lower than $1 \times 10^{11}/cm^3$, and further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS and an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS is an oxide semiconductor having a structure between the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 37:
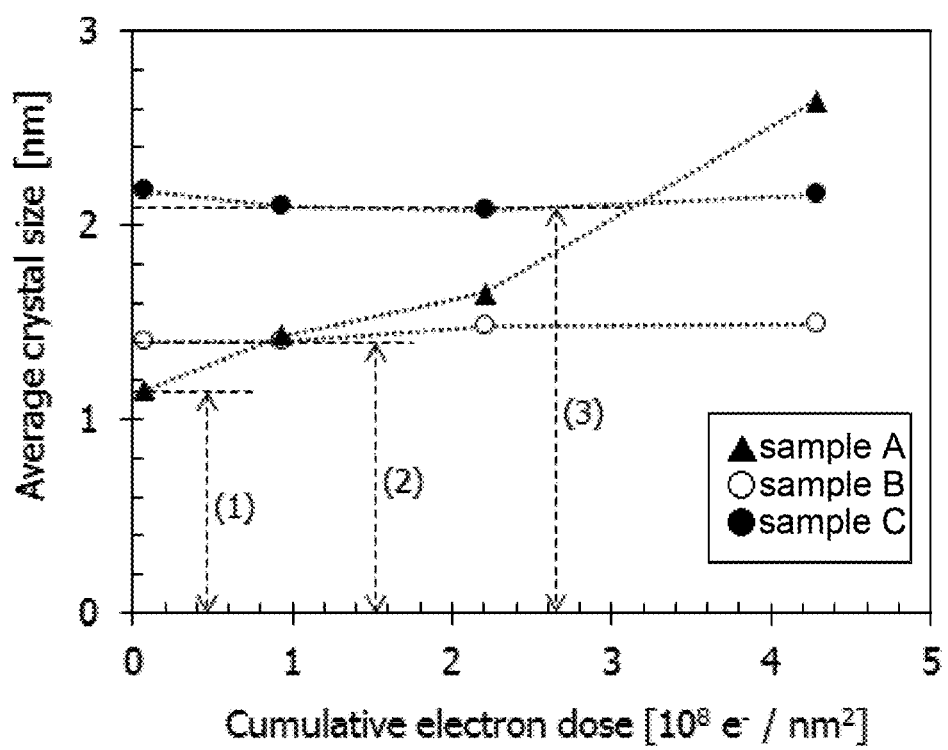
FIG. 37 shows a change of crystal parts of an In—Ga—Zn oxide owing to electron irradiation.

FIG. 37 shows change in the average size of crystal parts (at 22 points to 45 points) in each sample. Note that the crystal part size corresponds to the length of a lattice fringe. FIG. 37 indicates that the crystal part size in the a-like OS increases with an increase in the cumulative electron dose. Specifically, as shown by (1) in FIG. 37, a crystal part of approximately 1.2 nm at the start of TEM observation (the crystal part is also referred to as an initial nucleus) grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 37, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Embodiment 4

In this embodiment, an example of a circuit including the transistor of one embodiment of the present invention will be described with reference to drawings <Cross-Sectional Structure>

Figure 38A:
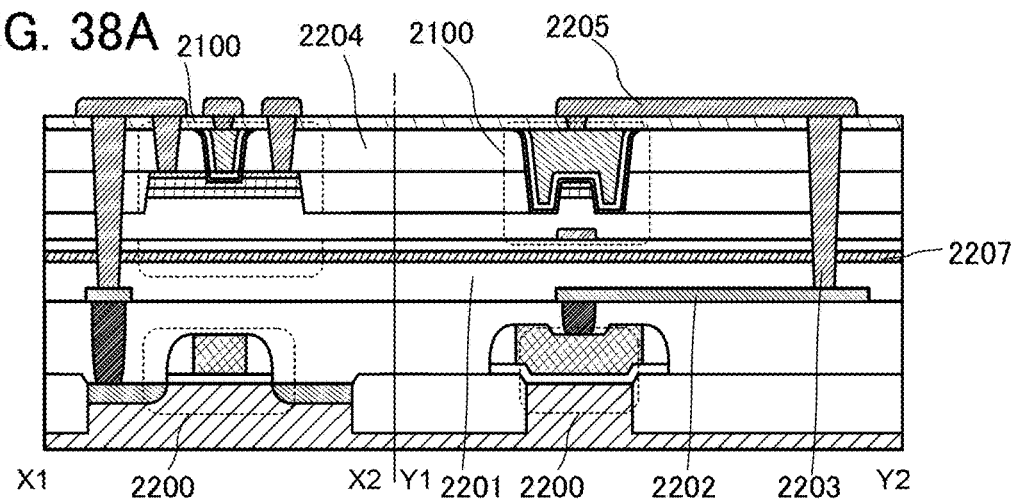
FIGS. 38A to 38D are cross-sectional views and circuit diagrams of a semiconductor device.

FIG. 38A is a cross-sectional view of a semiconductor device of one embodiment of the present invention. In FIG. 38A, X1-X2 direction and Y1-Y2 direction represents a channel length direction and a channel width direction, respectively. The semiconductor device illustrated in FIG. 38A includes a transistor 2200 containing a first semiconductor material in a lower portion and a transistor 2100 containing a second semiconductor material in an upper portion. In FIG. 38A, an example is described in which the transistor described in the above embodiment as an example is used as the transistor 2100 containing the second semiconductor material. A cross-sectional view of the transistors in a channel length direction is on the left side of a dashed-dotted line, and a cross-sectional view of the transistors in a channel width direction is on the right side of the dashed-dotted line.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor including a material other than an oxide semiconductor, such as single crystal silicon, can operate at high speed easily. In contrast, a transistor including an oxide semiconductor and described in the above embodiment as an example has excellent subthreshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 38A illustrates a structure in which the transistor 2100 is provided over the transistor 2200 with an insulator 2201 and an insulator 2207 provided therebetween. A plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100 and a wiring 2205 over the insulator 2204 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulator 2207 having a function of preventing diffusion of hydrogen is provided between the transistors 2100 and 2200. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 can also be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide film is preferably used. The aluminum oxide film has a high shielding (blocking) effect of preventing transmission of both oxygen and impurities such as hydrogen and moisture. Thus, by using the aluminum oxide film as the blocking film covering the transistor 2100, release of oxygen from the oxide semiconductor film included in the transistor 2100 can be prevented and entry of water and hydrogen into the oxide semiconductor film can be prevented. Note that as the blocking film, the insulator 2204 having a stacked-layer structure may be used, or the blocking film may be provided under the insulator 2204.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIG. 38D. An insulator 2212 is provided over a semiconductor substrate 2211. The semiconductor substrate 2211 includes a projecting portion with a thin tip (also referred to a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

<Circuit Configuration Example>

In the above structure, electrodes of the transistor 2100 and the transistor 2200 can be connected as appropriate; thus, a variety of circuits can be formed. Examples of circuit configurations which can be achieved by using a semiconductor device of one embodiment of the present invention are shown below.

<CMOS Inverter Circuit>

Figures 38B, 38C:
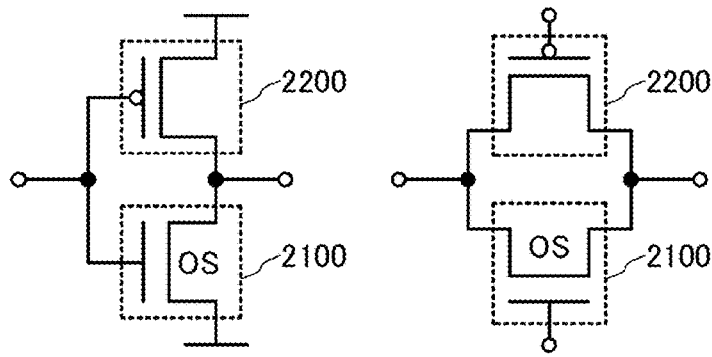
Figure 38D:
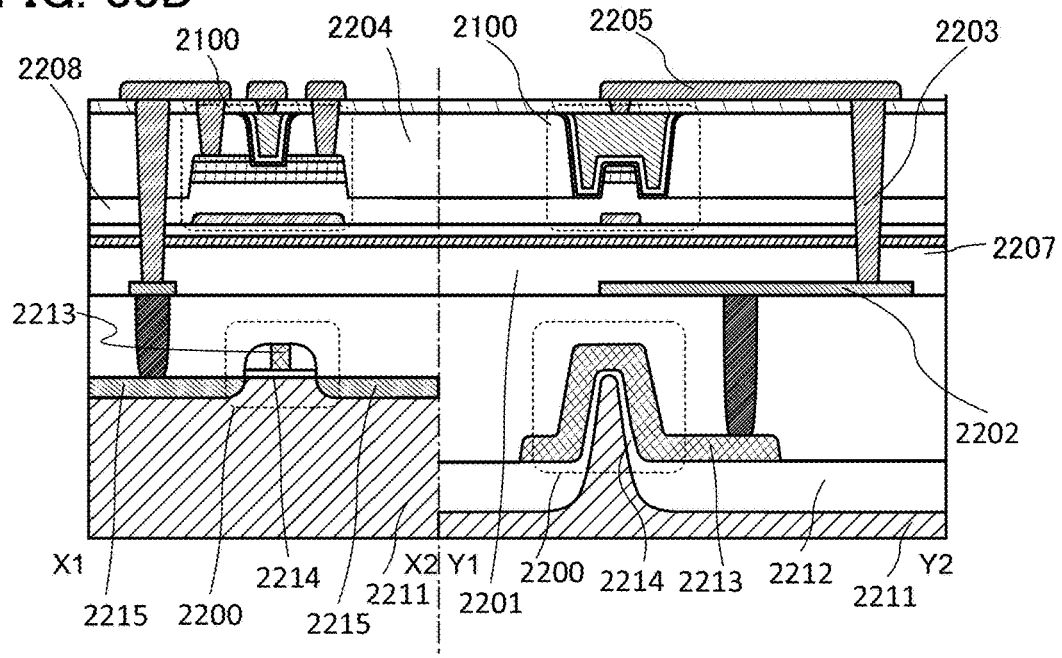

A circuit diagram in FIG. 38B illustrates a configuration of a CMOS inverter in which the p-channel transistor 2200 and the n-channel transistor 2100 are connected to each other in series and in which gates of them are connected to each other.

<CMOS Analog Switch>

A circuit diagram in FIG. 38C illustrates a configuration in which sources of the transistors 2100 and 2200 are connected to each other and drains of the transistors 2100 and 2200 are connected to each other. With such a configuration, the transistors can function as a CMOS analog switch.

<Memory Device Example>

Figure 39A:
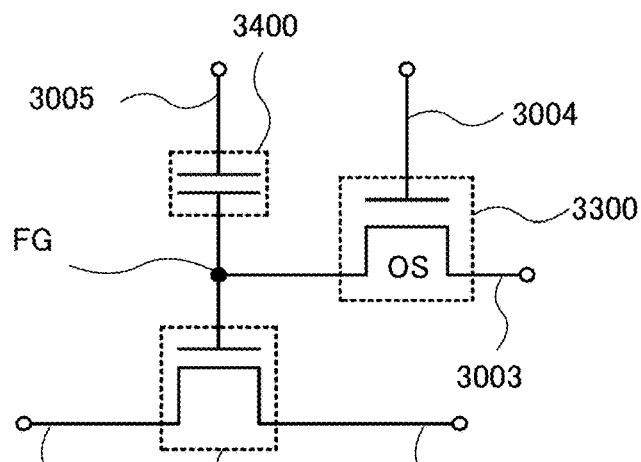
FIGS. 39A to 39C are a cross-sectional view and circuit diagrams of a semiconductor device.
Figure 39B:
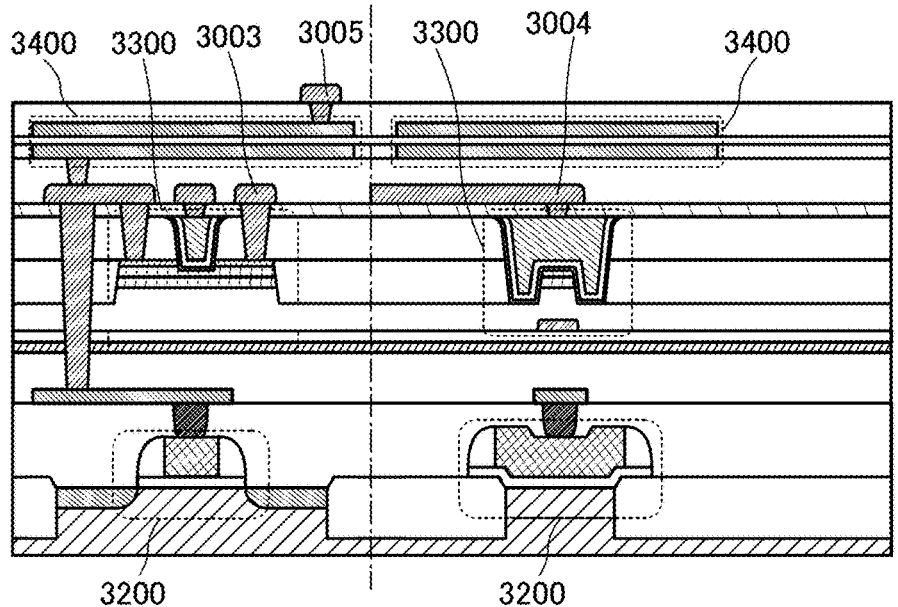
Figure 39C:
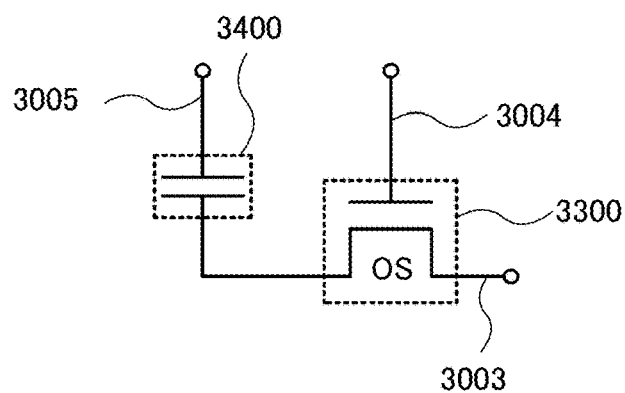

An example of a semiconductor device (memory device) which includes the transistor of one embodiment of the present invention, which can retain stored data even when not powered, and which has an unlimited number of write cycles is illustrated in FIGS. 39A to 39C.

The semiconductor device illustrated in FIG. 39A includes a transistor 3200 using a first semiconductor material, a transistor 3300 using a second semiconductor material, and a capacitor 3400. Note that any of the transistors in Embodiment 1 and 2 can be used as the transistor 3300.

FIG. 39B is a cross-sectional view of the semiconductor device illustrated in FIG. 39A. The semiconductor device in the cross-sectional view has a structure in which the transistor 3300 is provided with a back gate; however, a structure without a back gate may be employed.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor memory device in which refresh operation is unnecessary or the frequency of refresh operation is extremely low can be provided.

In FIG. 39A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode and the drain electrode of the transistor 3300 and one electrode of the capacitor 3400. The fifth wiring 3005 is electrically connected to the other electrode of the capacitor 3400.

The semiconductor device in FIG. 39A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed to be used, it is necessary that only data of a desired memory cell be able to be read. For example, the fifth wiring 3005 of memory cells from which data is not read may be supplied with a potential at which the transistor 3200 is turned off regardless of the state of the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the state of the gate electrode, that is, a potential higher than $V_{th\_L}$, whereby only data of a desired memory cell can be read.

The semiconductor device illustrated in FIG. 39C is different from the semiconductor device illustrated in FIG. 39A in that the transistor 3200 is not provided. Also in this case, writing and retaining operation of data can be performed in a manner similar to those of the semiconductor device illustrated in FIG. 39A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer hardly occurs. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

<Imaging Device>

An imaging device of one embodiment of the present invention is described below.

FIG. 40A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicates all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC. Note that as the peripheral circuit, one or more of the peripheral circuits 260, 270, 280, and 290 may be omitted.

As illustrated in FIG. 40B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength range (color filter), whereby data for achieving color image display can be obtained.

Figure 41A:
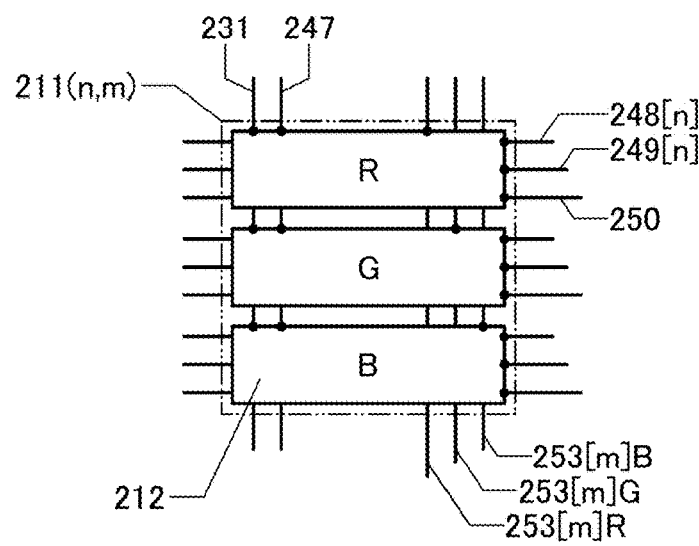
FIGS. 41A and 41B are plan views of pixels of an imaging device.

FIG. 41A is a plan view illustrating an example of the pixel 211 with which a color image is obtained. The pixel 211 illustrated in FIG. 41A includes a subpixel 212 provided with a color filter transmitting light with a red (R) wavelength band (also referred to as a subpixel 212R), a subpixel 212 provided with a color filter transmitting light with a green (G) wavelength band (also referred to as a subpixel 212G), and a subpixel 212 provided with a color filter transmitting light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row (n is an integer greater than or equal to 1 and less than or equal to p) are referred to as a wiring 248[n] and a wiring 249[n]. For example, the wiring 253 connected to the pixel 211 in the m-th column (m is an integer greater than or equal to 1 and less than or equal to q) is referred to as a wiring 253[m]. Note that in FIG. 41A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B, respectively. The subpixels 212 are electrically connected to the peripheral circuit through the above wirings.

Figure 41B:
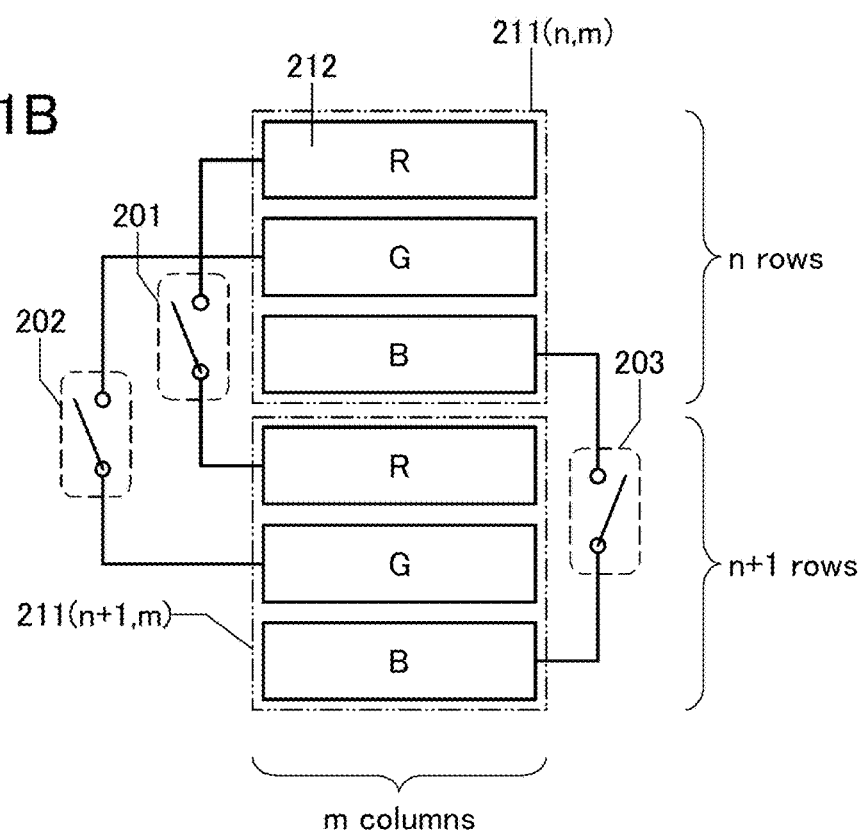

The imaging device 200 has a structure in which the subpixel 212 is electrically connected to the subpixel 212 in an adjacent pixel 211 which is provided with a color filter transmitting light with the same wavelength band as the subpixel 212, via a switch. FIG. 41B shows a connection example of the subpixels 212: the subpixel 212 in the pixel 211 arranged in an n-th row and an m-th column and the subpixel 212 in the adjacent pixel 211 arranged in an (n+1)-th row and the m-th column. In FIG. 41B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be further increased.

For example, in FIG. 41A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) of red to green and blue is 1:2:1 may be employed. Alternatively, the pixel number ratio (the light receiving area ratio) of red to green and blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 42A and 42B. With the lens 255, the photoelectric conversion element can receive incident light efficiently. Specifically, as illustrated in FIG. 42A, light 256 enters a photoelectric conversion element 220 through the lens 255, the filter 254 (a filter 254R, a filter 254G, and a filter 254B), a pixel circuit 230, and the like which are provided in the pixel 211.

However, as indicated by a region surrounded with dashed-dotted lines, part of the light 256 indicated by arrows might be blocked by some wirings 257. Thus, a preferable structure is that the lens 255 and the filter 254 are provided on the photoelectric conversion element 220 side, so that the photoelectric conversion element 220 can efficiently receive the light 256 as illustrated in FIG. 42B. When the light 256 enters the photoelectric conversion element 220 from the photoelectric conversion element 220 side, the imaging device 200 with high sensitivity can be provided.

Figure 42A:
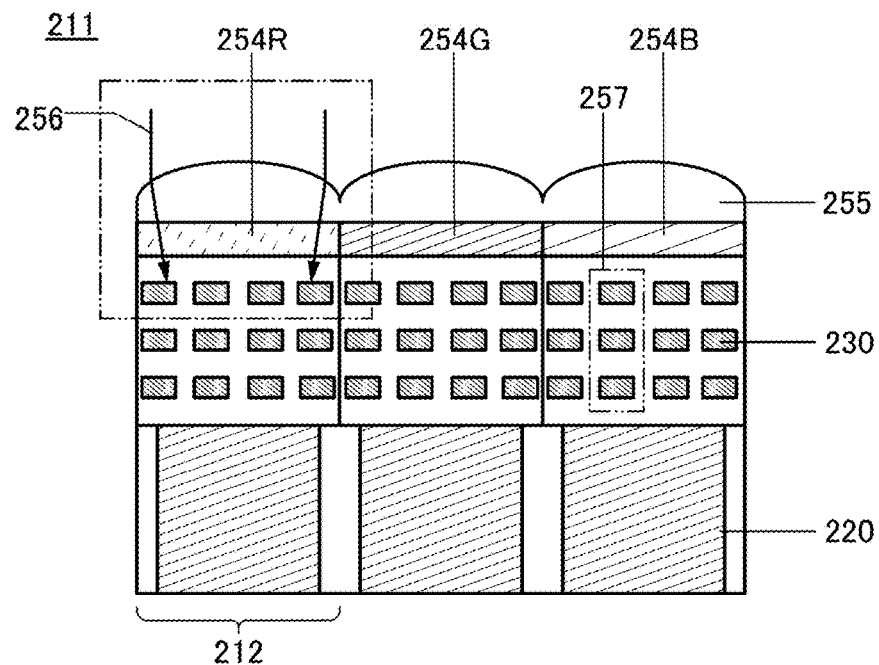
FIGS. 42A and 42B are cross-sectional views of an imaging device.
Figure 42B:
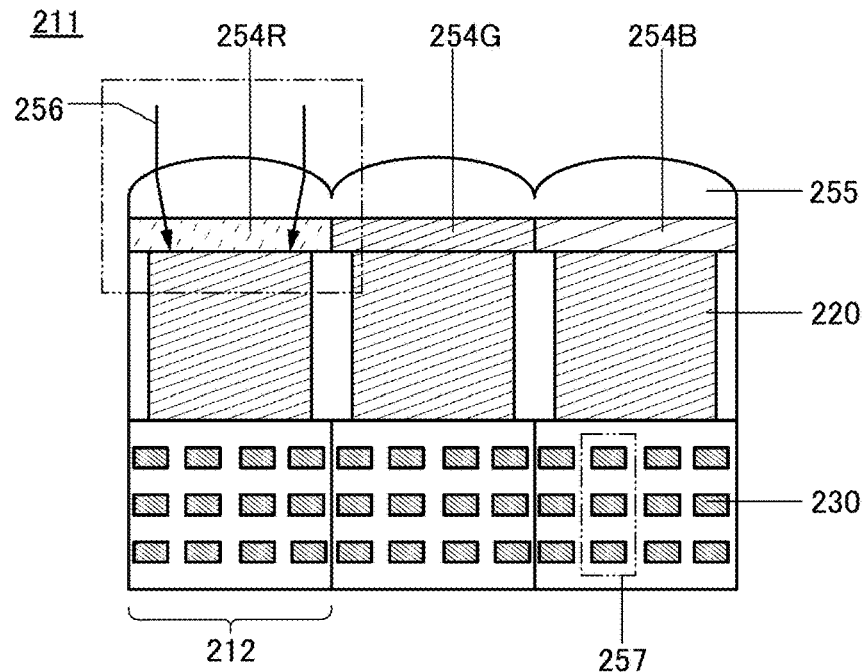

As the photoelectric conversion element 220 illustrated in FIGS. 42A and 42B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and a cadmium zinc alloy.

For example, when selenium is used for the photoelectric conversion element 220, the photoelectric conversion element 220 can have a light absorption coefficient in a wide wavelength band, such as visible light, ultraviolet light, infrared light, X-rays, and gamma rays.

One pixel 211 included in the imaging device 200 may include the subpixel 212 with a first filter in addition to the subpixel 212 illustrated in FIGS. 41A and 41B.

<Configuration Example 2 of Pixel>

An example of a pixel that includes a transistor including silicon and a transistor including an oxide semiconductor is described below.

Figure 43A:
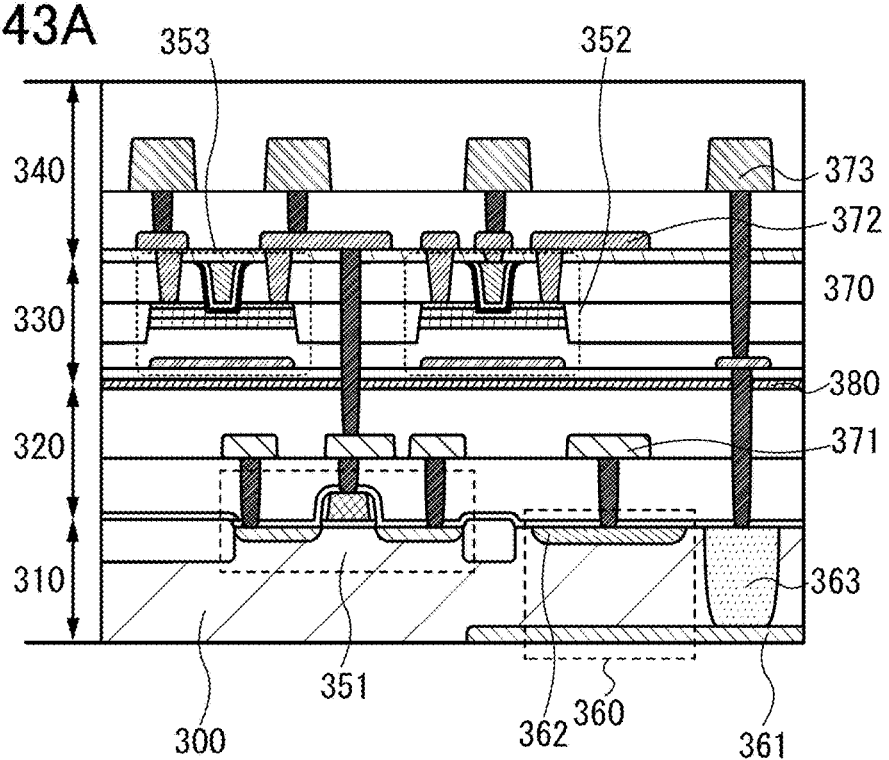
FIGS. 43A and 43B are cross-sectional views of an imaging device.
Figure 43B:
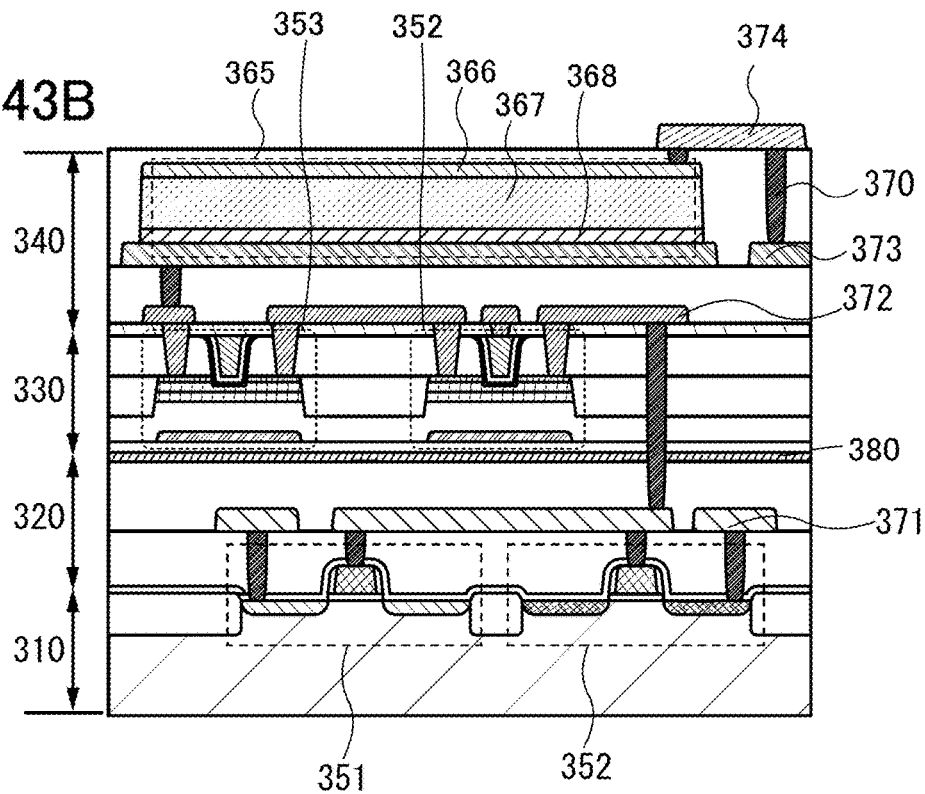

FIGS. 43A and 43B are each a cross-sectional view of an element included in an imaging device.

The imaging device illustrated in FIG. 43A includes a transistor 351 including silicon over a silicon substrate 300, transistors 352 and 353 which include an oxide semiconductor and are stacked over the transistor 351, and a photodiode 360 provided in the silicon substrate 300 and including an anode 361 and a cathode 362. The transistors and the photodiode 360 are electrically connected to various plugs 370 and wirings 371. In addition, the anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

Note that in the example of a cross-sectional view in FIG. 43A, a light-receiving surface of the photodiode 360 is provided on the side opposite to a surface of the silicon substrate 300 where the transistor 351 is formed. With the structure, an optical path can be obtained without the influence by the transistors or wirings, and therefore, a pixel with a high aperture ratio can be formed. Note that the light-receiving surface of the photodiode 360 can be the same as the surface where the transistor 351 is formed.

In the case of forming a pixel with the use of transistors including an oxide semiconductor, the layer 310 may include the transistor including an oxide semiconductor. Alternatively, the layer 310 may be omitted, and the pixel may include only transistors including an oxide semiconductor.

In addition, in the cross-sectional view in FIG. 43A, the photodiode 360 in the layer 310 and the transistor in the layer 330 can be formed so as to overlap with each other. Thus, the degree of integration of pixels can be increased. In other words, the resolution of the imaging device can be increased.

An imaging device illustrated in FIG. 43B includes a photodiode 365 in the layer 340 and over the transistor. In FIG. 43B, the layer 310 includes the transistor 351 and a transistor 352 which include silicon, the layer 320 includes the wiring 371, the layer 330 includes the transistors 352 and 353 which include an oxide semiconductor, and the layer 340 includes the photodiode 365. The photodiode 365 includes a semiconductor layer 366, a semiconductor layer 367, and a semiconductor layer 368, and is electrically connected to the wiring 373, and to a wiring 374 through the plug 370.

The element structure illustrated in FIG. 43B can increase the aperture ratio.

Alternatively, a PIN diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. The p-type semiconductor layer 366 and the n-type semiconductor layer 368 can each be formed using amorphous silicon, microcrystalline silicon, or the like which includes a dopant imparting the corresponding conductivity type. The photodiode 365 in which a photoelectric conversion layer is formed using amorphous silicon has high sensitivity in a visible light wavelength region, and therefore can easily sense weak visible light.

This embodiment can be combined as appropriate with any of the other embodiments in this specification.

Embodiment 5

<RF Tag>

In this embodiment, an RF tag that includes the transistor described in the above embodiments or the memory device described in the above embodiment will be described with reference to FIG. 44.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag is described with reference to FIG. 44. FIG. 44 is a block diagram illustrating a configuration example of an RF tag.

Figure 44:
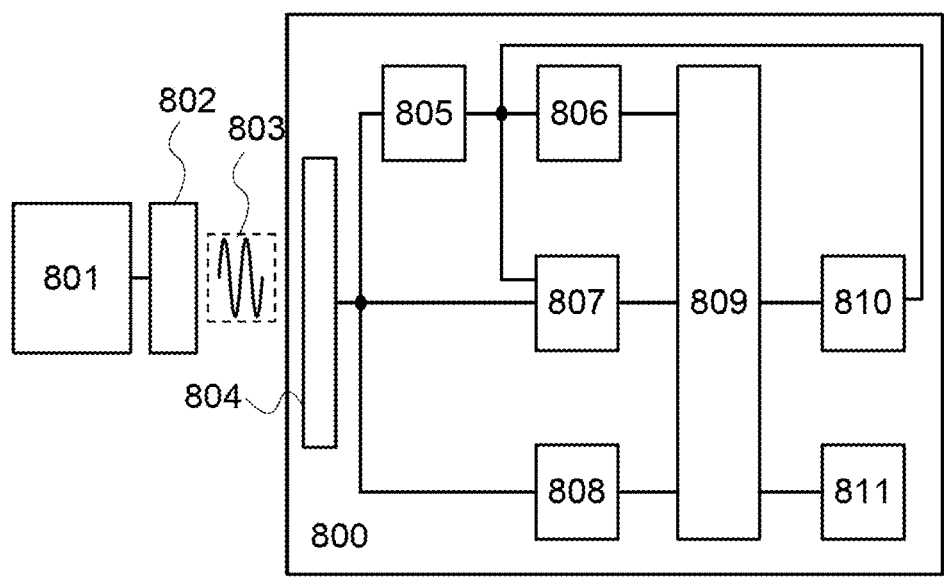
FIG. 44 illustrates a configuration example of an RF tag.

As illustrated in FIG. 44, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit is described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate.

Here, the transistor described in the above embodiment can be used as the memory circuit 810. Since the transistor of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

This embodiment can be combined as appropriate with any of the other embodiments in this specification.

Embodiment 6

In this embodiment, a CPU that includes the memory device described in the above embodiment will be described.

Figure 45:
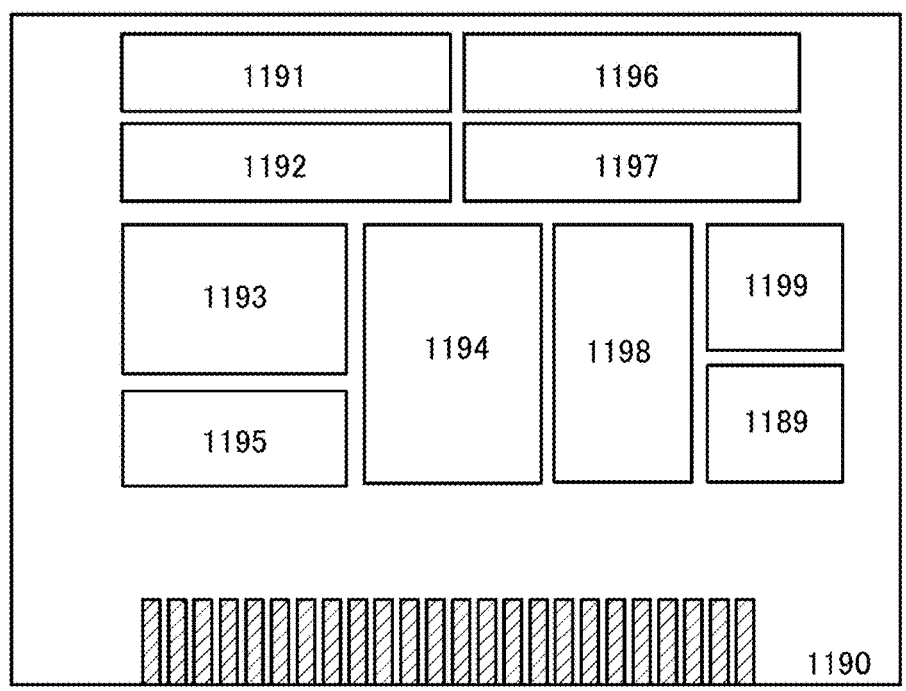
FIG. 45 illustrates a configuration example of a CPU.

FIG. 45 is a block diagram illustrating a configuration example of a CPU at least partly including any of the transistors described in the above embodiments as a component.

<CPU>

The CPU illustrated in FIG. 45 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 45 is just an example in which the configuration is simplified, and an actual CPU may have a variety of configurations depending on the application. For example, the CPU may have the following configuration: a structure including the CPU illustrated in FIG. 45 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 45, a memory cell is provided in the register 1196. For the memory cell of the register 1196, any of the transistors described in Embodiments 1 to 3 can be used.

In the CPU illustrated in FIG. 45, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

<Memory Circuit>

Figure 46:
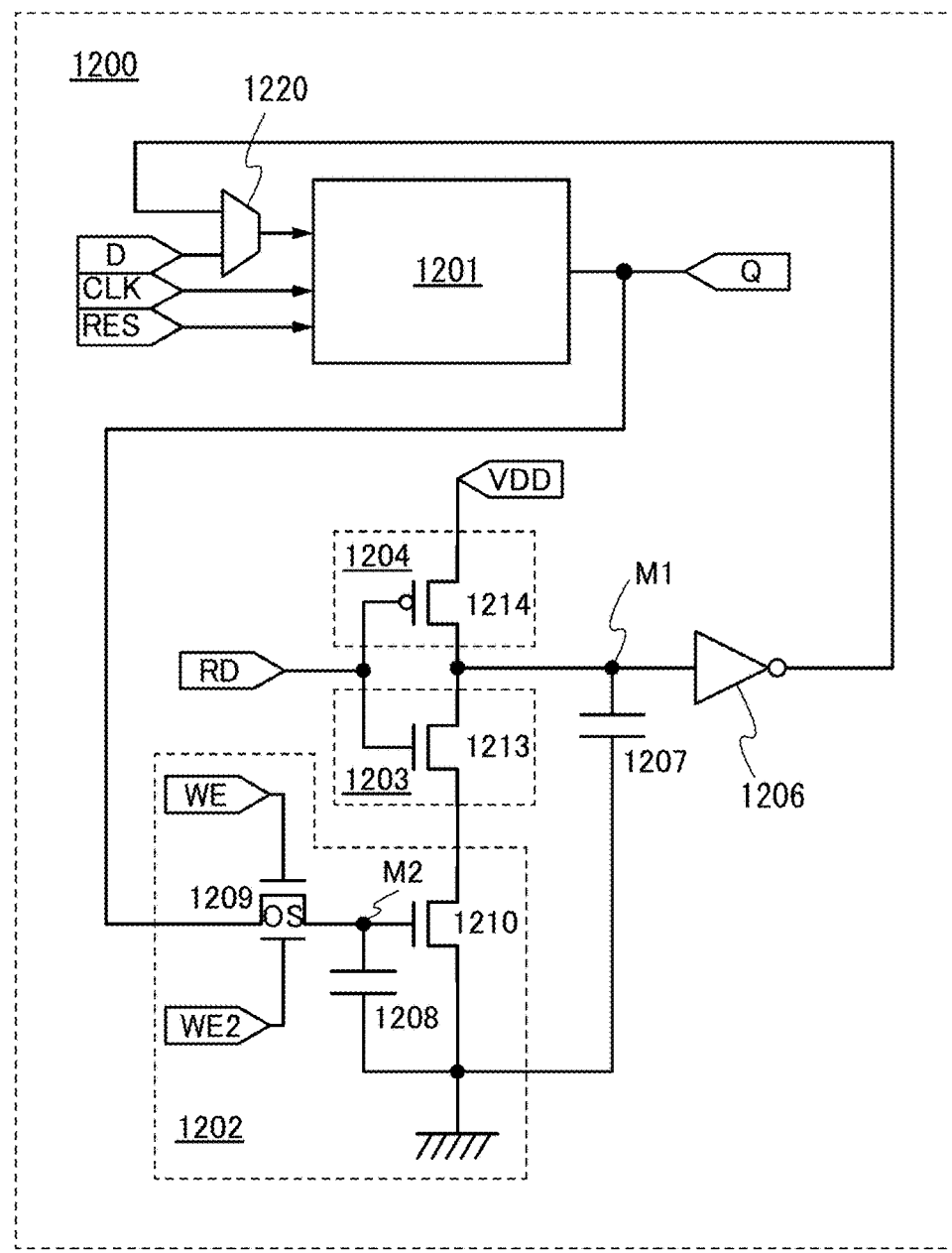
FIG. 46 is a circuit diagram of a memory element.

FIG. 46 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, a first gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source electrode and a drain electrode of the transistor 1213, a second terminal of the switch 1203 corresponds to the other of the source electrode and the drain electrode of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source electrode and a drain electrode of the transistor 1214, a second terminal of the switch 1204 corresponds to the other of the source electrode and the drain electrode of the transistor 1214, and conduction or non-conduction between the first terminal and the second terminal of the switch 1204 (i.e., the on/off state of the transistor 1214) is selected by the control signal RD input to a gate of the transistor 1214.

One of a source electrode and a drain electrode of the transistor 1209 is electrically connected to one of a pair of electrodes of the capacitor 1208 and a gate of the transistor 1210. Here, the connection portion is referred to as a node M2. One of a source electrode and a drain electrode of the transistor 1210 is electrically connected to a line which can supply a low power supply potential (e.g., a GND line), and the other thereof is electrically connected to the first terminal of the switch 1203 (the one of the source electrode and the drain electrode of the transistor 1213). The second terminal of the switch 1203 (the other of the source electrode and the drain electrode of the transistor 1213) is electrically connected to the first terminal of the switch 1204 (the one of the source electrode and the drain electrode of the transistor 1214). The second terminal of the switch 1204 (the other of the source electrode and the drain electrode of the transistor 1214) is electrically connected to a line which can supply a power supply potential VDD. The second terminal of the switch 1203 (the other of the source electrode and the drain electrode of the transistor 1213), the first terminal of the switch 1204 (the one of the source electrode and the drain electrode of the transistor 1214), an input terminal of the logic element 1206, and one of a pair of electrodes of the capacitor 1207 are electrically connected to one another. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 46 has a structure with a second gate (second gate electrode: back gate). The control signal WE can be input to the first gate and the control signal WE2 can be input to the second gate. The control signal WE2 is a signal having a constant potential. As the constant potential, for example, a ground potential GND or a potential lower than a potential of the source electrode of the transistor 1209 is selected. The control signal WE2 is a potential signal for controlling the threshold voltage of the transistor 1209, and a current when a gate voltage is 0 V can be further reduced. The control signal WE2 may be a signal having the same potential as that of the control signal WE. Note that as the transistor 1209, a transistor without a second gate may be used.

A signal corresponding to data retained in the circuit 1201 is input to the other of the source electrode and the drain electrode of the transistor 1209. FIG. 46 illustrates an example in which a signal output from the circuit 1201 is input to the other of the source electrode and the drain electrode of the transistor 1209. The logic value of a signal output from the second terminal of the switch 1203 (the other of the source electrode and the drain electrode of the transistor 1213) is inverted by the logic element 1206, and the inverted signal is input to the circuit 1201 through the circuit 1220.

In the example of FIG. 46, a signal output from the second terminal of the switch 1203 (the other of the source electrode and the drain electrode of the transistor 1213) is input to the circuit 1201 through the logic element 1206 and the circuit 1220; however, one embodiment of the present invention is not limited thereto. The signal output from the second terminal of the switch 1203 (the other of the source electrode and the drain electrode of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source electrode and the drain electrode of the transistor 1213) can be input to the node.

In FIG. 46, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer including a semiconductor other than an oxide semiconductor or in the substrate 1190 can be used for the rest of the transistors.

As the circuit 1201 in FIG. 46, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) tag.

This embodiment can be combined as appropriate with any of the other embodiments in this specification.

Embodiment 7

In this embodiment, configuration examples of a display device using a transistor of one embodiment of the present invention will be described.

<Circuit Configuration Example of Display Device>

Figure 47A:
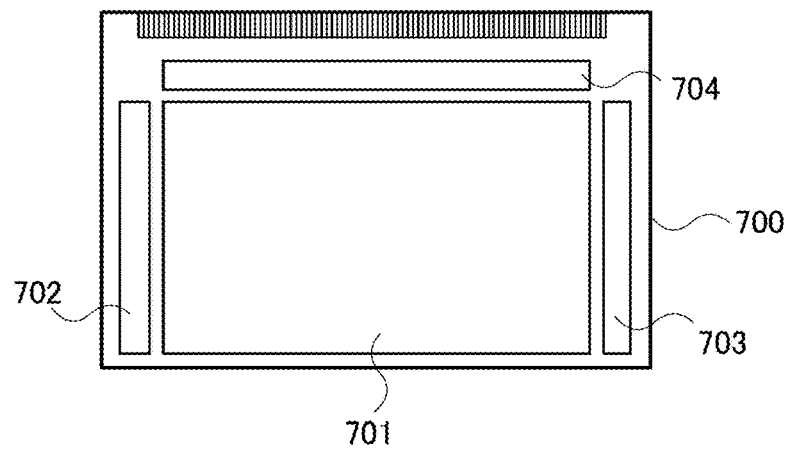
FIGS. 47A to 47C illustrate a configuration example of a display device and circuit diagrams of pixels.
Figure 47B:
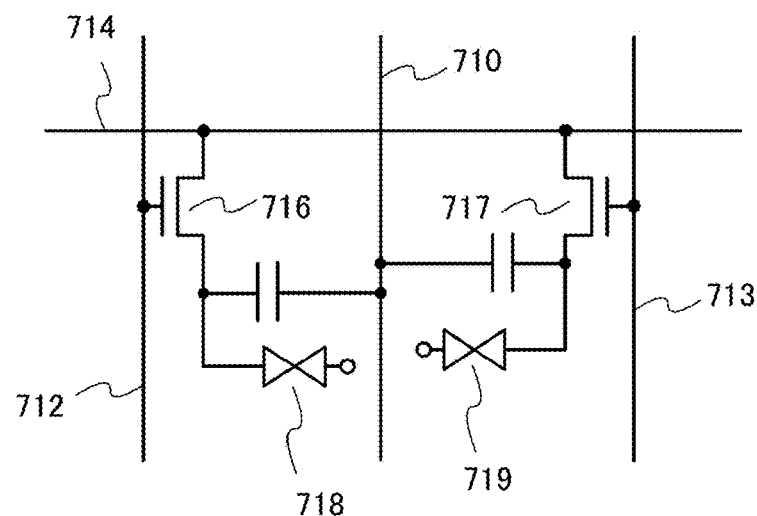
Figure 47C:
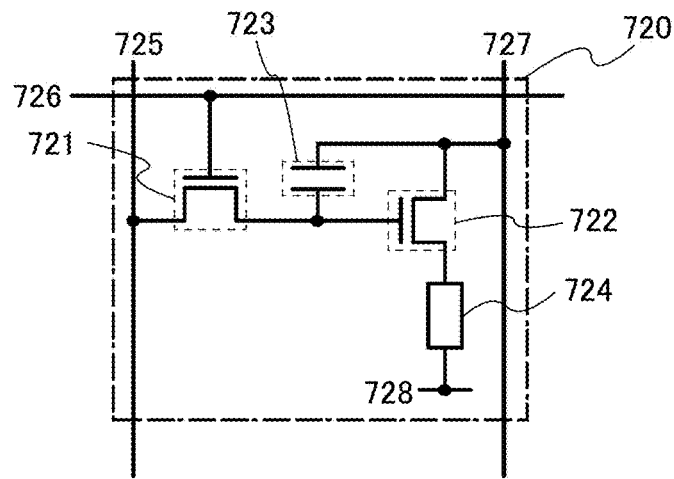

FIG. 47A is a top view of the display device of one embodiment of the present invention. FIG. 47B is a circuit diagram illustrating a pixel circuit that can be used in the case where a liquid crystal element is used in a pixel in the display device of one embodiment of the present invention. FIG. 47C is a circuit diagram illustrating a pixel circuit that can be used in the case where an organic EL element is used in a pixel in the display device of one embodiment of the present invention.

The transistor in the pixel portion can be formed in accordance with Embodiments 1 to 3. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 47A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 47A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved. One or more of the first scan line driver circuit 702, the second scan line driver circuit 703, and the signal line driver circuit 704 may be mounted on the substrate 700 or provided outside the substrate 700.

<Liquid Crystal Display Device>

FIG. 47B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A scan line 712 of a transistor 716 and a scan line 713 of a transistor 717 are separated so that different gate signals can be supplied thereto. In contrast, a signal line 714 is shared by the transistors 716 and 717. The transistor described in any of Embodiments 1 to 3 can be used as appropriate as each of the transistors 716 and 717. Thus, a highly reliable liquid crystal display device can be provided.

A first pixel electrode layer is electrically connected to the transistor 716 and a second pixel electrode layer is electrically connected to the transistor 717. The first pixel electrode layer and the second pixel electrode layer are separated. Shapes of the first pixel electrode layer and the second pixel electrode layer are not particularly limited. For example, the first pixel electrode layer may have a V-like shape.

A gate electrode of the transistor 716 is connected to the scan line 712, and a gate electrode of the transistor 717 is connected to the scan line 713. When different gate signals are supplied to the scan line 712 and the scan line 713, operation timings of the transistor 716 and the transistor 717 can be varied. As a result, alignment of liquid crystals can be controlled.

Further, a storage capacitor may be formed using a capacitor wiring 710, a gate insulating layer functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that illustrated in FIG. 47B. For example, a switch, a resistor, a capacitor, a transistor, a sensor, a logic circuit, or the like may be added to the pixel circuit illustrated in FIG. 47B.

FIGS. 48A and 48B are examples of a top view and a cross-sectional view of a liquid crystal display device. Note that FIG. 48A illustrates a typical structure including a display device 20, a display region 21, a peripheral circuit 22, and a flexible printed circuit (FPC) 42.

FIG. 48B is a cross-sectional view taken along the dashed lines A-A', B-B', and C-C' in FIG. 48A. The cross section taken along the dashed line A-A' illustrates the peripheral circuit portion, the cross section taken along the dashed line B-B' illustrates the display region, and the cross section taken along the dashed line C-C' illustrates a portion connected to the FPC.

The display device 20 includes the following in addition to the transistor 11: a conductive layer 190, a conductive layer 195, an insulating layer 420, a liquid crystal layer 490, a liquid crystal element 80, a capacitor 60, an insulating layer 430, a spacer 440, a coloring layer 460, a bonding layer 470, a conductive layer 480, a light-shielding layer 418, a substrate 400, a bonding layer 473, a bonding layer 474, a bonding layer 475, a bonding layer 476, a polarizing plate 103, a polarizing plate 403, a protective substrate 105, a protective substrate 402, and an anisotropic conductive layer 510.

<Organic EL Display Device>

FIG. 47C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 47C illustrates an applicable example of a pixel circuit. Here, one pixel includes two n-channel transistors. Furthermore, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of Embodiments 1 to 3 can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that illustrated in FIG. 47C. For example, a switch, a resistor, a capacitor, a sensor, a transistor, a logic circuit, or the like may be added to the pixel circuit illustrated in FIG. 47C.

In the case where the transistor shown in any of the above embodiments is used for the circuit shown in FIGS. 47A to 47C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, for example, a potential lower than the potential applied to the source electrode, may be input to the second gate electrode through a wiring that is not illustrated.

Figures 49A, 49B:
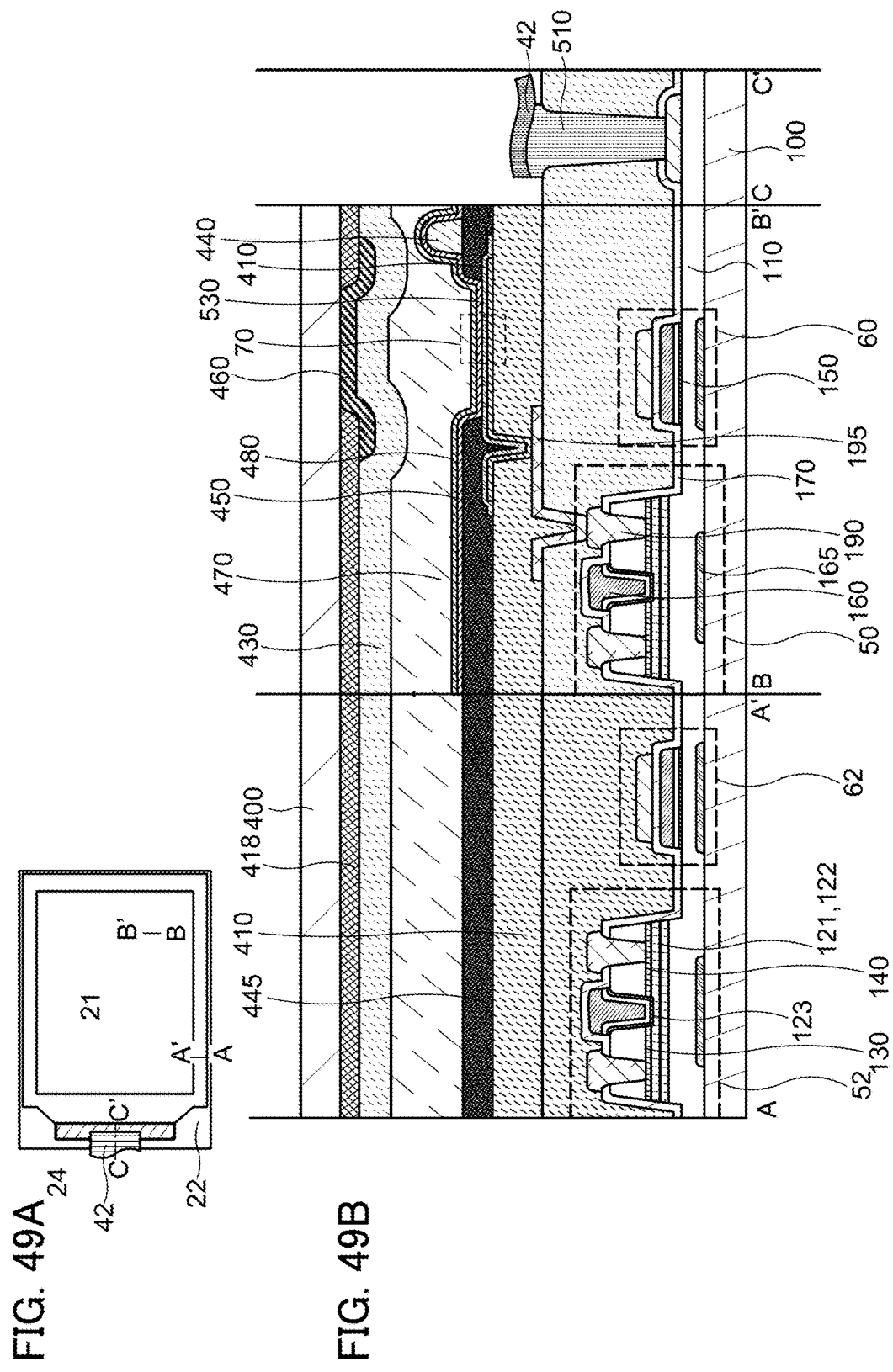
FIGS. 49A and 49B are a top view and a cross-sectional view illustrating a display device.

FIGS. 49A and 49B are examples of a top view and a cross-sectional view of a light-emitting device. Note that FIG. 49A illustrates a typical structure including the light-emitting device 24, the display region 21, the peripheral circuit 22, and the flexible printed circuit (FPC) 42.

FIG. 49B is a cross-sectional view taken along the dashed lines A-A', B-B', and C-C' in FIG. 49A. The cross section taken along the dashed line A-A' illustrates the peripheral circuit portion, the cross section taken along the dashed line B-B' illustrates the display region, and the cross section taken along the dashed line C-C' illustrates a portion connected to the FPC.

A light-emitting device 24 includes the following in addition to the transistor 11: the conductive layer 190, the conductive layer 195, a conductive layer 410, an optical adjustment layer 530, an EL layer 450, a light-emitting element 70, the capacitor 60, the spacer 440, the coloring layer 460, the bonding layer 470, the conductive layer 480, the light-shielding layer 418, the substrate 400, and an anisotropic conductive layer 510.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device include at least one of the following, for example: an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), micro electro mechanical systems (MEMS), a digital micromirror device (DMD), a digital micro shutter (DMS), MIRASOL (registered trademark), an interferometric modulator display (IMOD) element, an electrowetting element, a piezoelectric ceramic display, and a display element using a carbon nanotube. Other than the above, display media whose contrast, luminance, reflectivity, transmittance, or the like is changed by electric or electromagnetic action may be included. Note that examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

This embodiment can be combined as appropriate with any of the other embodiments in this specification.

Embodiment 8

Figure 50:
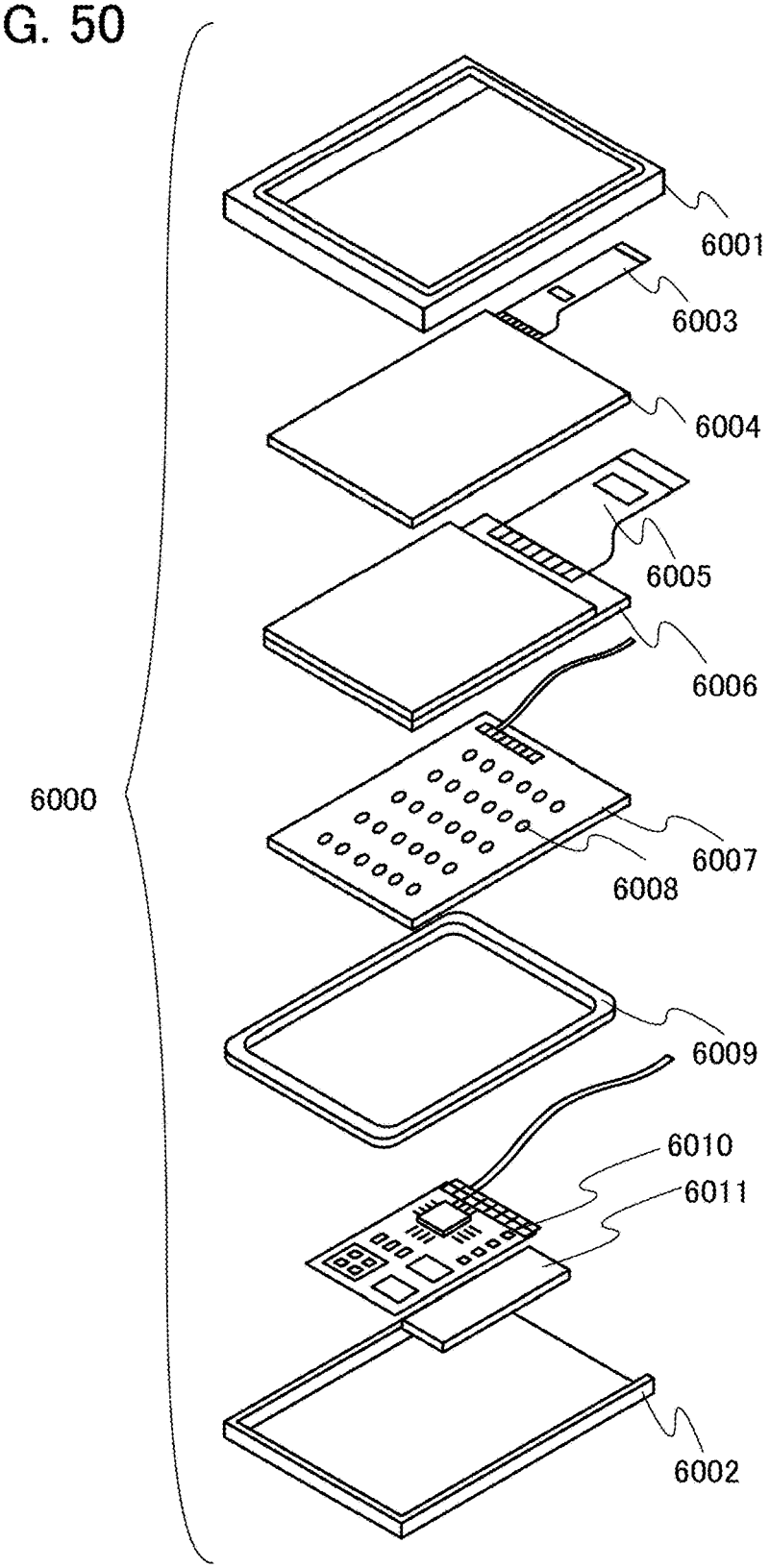
FIG. 50 illustrates a display module.

In this embodiment, a display module using a semiconductor device of one embodiment of the present invention will be described with reference to FIG. 50.
<Display Module>
In a display module 6000 in FIG. 50, a touch panel 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for, for example, the display panel 6006 and an integrated circuit mounted on a printed circuit board.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. A counter substrate (sealing substrate) of the display panel 6006 can have a touch panel function. A photosensor may be provided in each pixel of the display panel 6006 so that an optical touch panel function is added. An electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and also functions as an electromagnetic shield for blocking electromagnetic waves generated from the printed board 6010. The frame 6009 may function as a radiator plate.

The printed board 6010 has a power supply circuit and a signal processing circuit for outputting a video signal and a clock signal. As a power source for supplying power to the power supply circuit, an external commercial power source or the battery 6011 provided separately may be used. Note that the battery 6011 is not necessary in the case where a commercial power source is used.

The display module 6000 can be additionally provided with a member such as a polarizing plate, a retardation plate, or a prism sheet.

This embodiment can be combined as appropriate with any of the other embodiments in this specification.

Embodiment 9

Figure 51A:
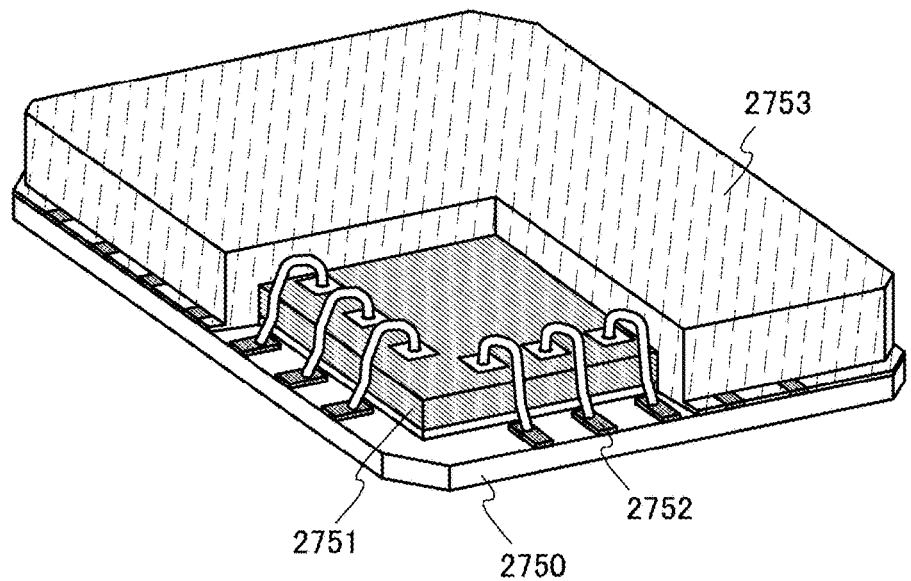
FIG. 51A is a perspective view illustrating a cross-sectional structure of a package using a lead frame interposer.

In this embodiment, application examples of the semiconductor device in one embodiment of the present invention will be described.
<Package Using Lead Frame Interposer>
FIG. 51A is a perspective view illustrating a cross-sectional structure of a package using a lead frame interposer. In the package illustrated in FIG. 51A, a chip 2751 corresponding to the semiconductor device of one embodiment of the present invention is connected to a terminal 2752 over an interposer 2750 by wire bonding. The terminal 2752 is placed on a surface of the interposer 2750 on which the chip 2751 is mounted. The chip 2751 may be sealed by a mold resin 2753, in which case the chip 2751 is sealed such that part of each of the terminals 2752 is exposed.

Figure 51B:
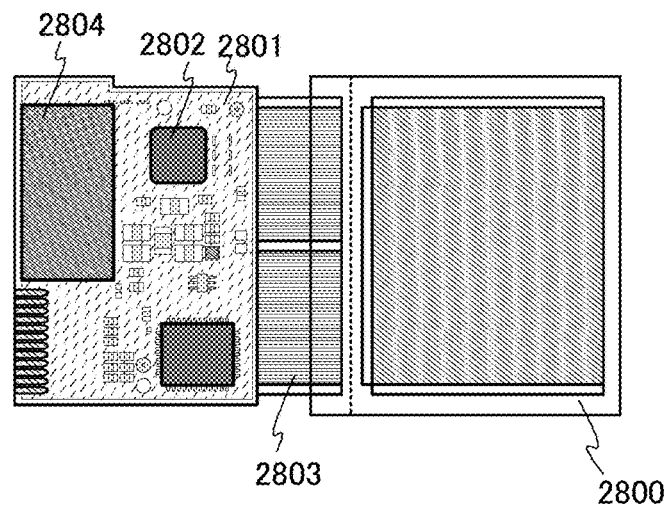
FIG. 51B illustrates a structure of a module.

FIG. 51B illustrates the structure of a module of an electronic device (cellular phone) in which a package is mounted on a circuit board. In the module of the mobile phone in FIG. 51B, a package 2802 and a battery 2804 are mounted on a printed wiring board 2801. The printed wiring board 2801 is mounted on a panel 2800 including a display element by an FPC 2803.

This embodiment can be combined as appropriate with any of the other embodiments in this specification.

Embodiment 10

In this embodiment, electronic devices and lighting devices of one embodiment of the present invention will be described with reference to drawings.
<Electronic Device>
Electronic devices and lighting devices can be manufactured using the semiconductor device of one embodiment of the present invention. In addition, highly reliable electronic devices and lighting devices can be manufactured using the semiconductor device of one embodiment of the present invention. Furthermore, electronic devices and lighting devices including touch sensors with improved detection sensitivity can be manufactured using the semiconductor device of one embodiment of the present invention.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

In the case of having flexibility, the electronic device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 52A:
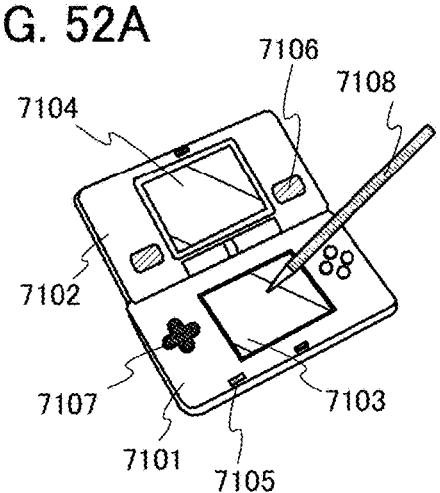
FIGS. 52A to 52E illustrate electronic devices.

FIG. 52A illustrates a portable game machine, which includes a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the display device of one embodiment of the present invention is used as the display portion 7103 or 7104, it is possible to provide a user-friendly portable game machine with quality that hardly deteriorates. Although the portable game machine illustrated in FIG. 52A includes two display portions, the display portion 7103 and the display portion 7104, the number of display portions included in the portable game machine is not limited to two.

Figure 52B:
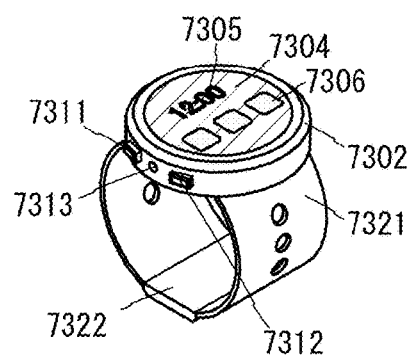

FIG. 52B illustrates a smart watch, which includes a housing 7302, a display portion 7304, operation buttons 7311 and 7312, a connection terminal 7313, a band 7321, a clasp 7322, and the like. The semiconductor device of one embodiment of the present invention can be used for a memory, a CPU, or the like incorporated in the housing 7302.

Figure 52C:
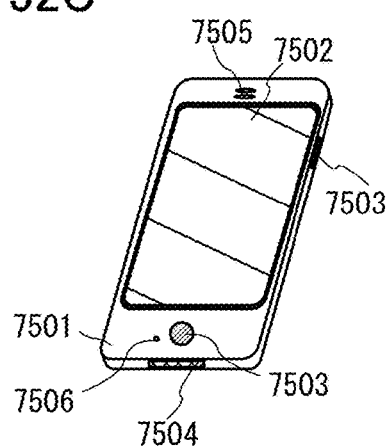

FIG. 52C illustrates a portable information terminal, which includes a display portion 7502 incorporated in a housing 7501, operation buttons 7503, an external connection port 7504, a speaker 7505, a microphone 7506, and the like. The semiconductor device of one embodiment of the present invention can be used for a memory for mobile use, a CPU, or the like incorporated in the housing 7501. Note that the display portion 7502 is small- or medium-sized but can perform full high vision, 4 k, or 8 k display because it has greatly high definition; therefore, a significantly clear image can be obtained.

Figure 52D:
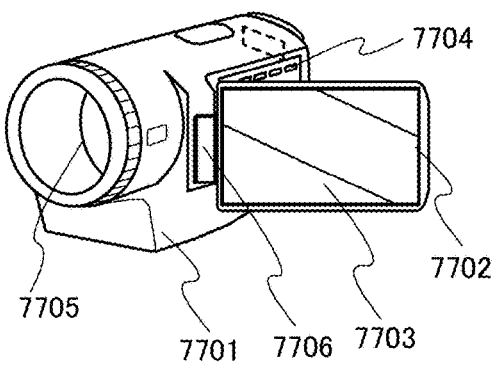

FIG. 52D illustrates a video camera, which includes a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device of one embodiment of the present invention can be used in a portion corresponding to a focus of the lens 7705. The semiconductor device of one embodiment of the present invention can be used for an integrated circuit, a CPU, or the like incorporated in the first housing 7701.

Figure 52E:
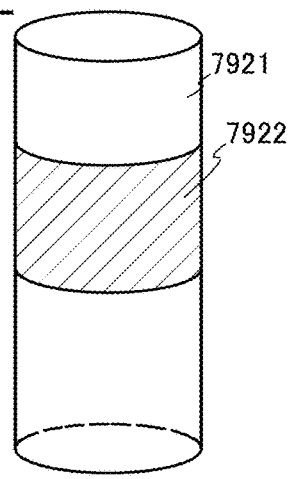

FIG. 52E illustrates a digital signage, which includes a display portion 7922 provided on a utility pole 7921. The semiconductor device of one embodiment of the present invention can be used for a control circuit of the display portion 7922.

Figure 53A:
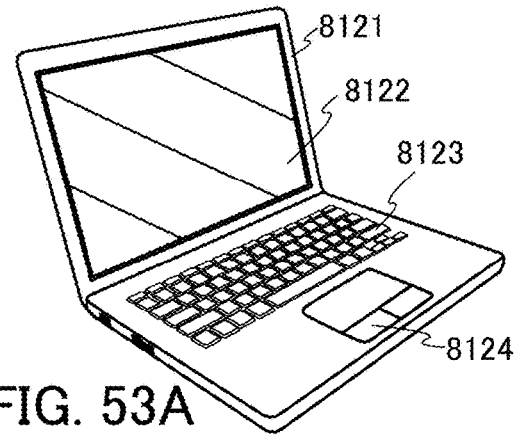
FIGS. 53A to 53D illustrate electronic devices.

FIG. 53A illustrates a laptop personal computer, which includes a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform 8 k display because it has greatly high definition; therefore, a significantly clear image can be obtained.

Figure 53B:
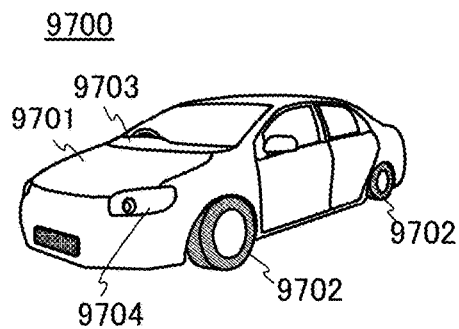
Figure 53C:
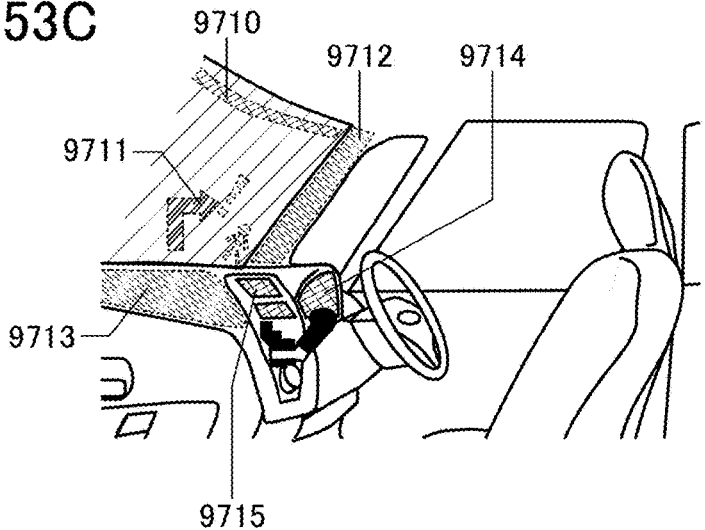

FIG. 53B is an external view of an automobile 9700. FIG. 53C illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the display device or semiconductor device of one embodiment of the present invention can be used in display portions 9710 to 9715 illustrated in FIG. 53C.

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on a dashboard portion. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 53D:
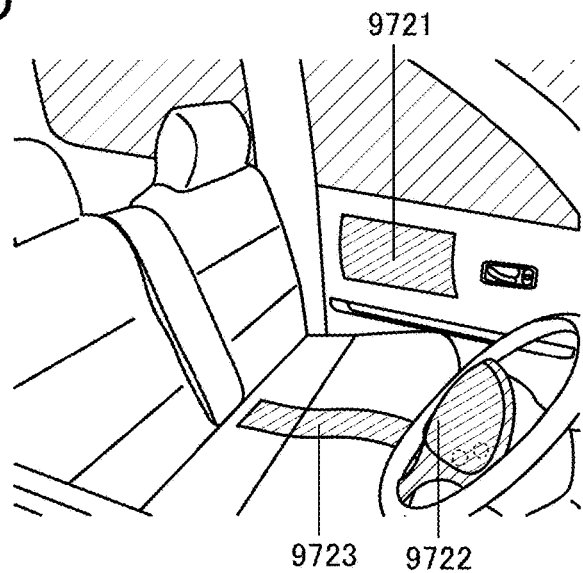

FIG. 53D illustrates the inside of an automobile in which a bench seat is used as a driver seat and a front passenger seat. A display portion 9721 is a display device or input/output device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generated by the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 54A:
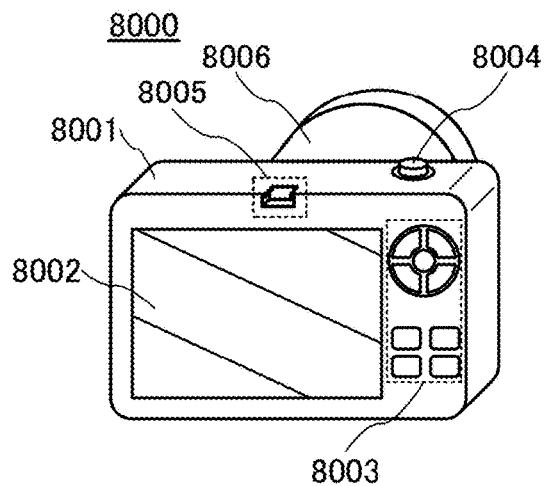
FIGS. 54A to 54C illustrate electronic devices.

FIG. 54A illustrates an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect a finder 8100, which is described below, a stroboscope, or the like.

Although the lens 8006 of the camera 8000 here is detachable from the housing 8001 for replacement, the lens 8006 may be included in the housing 8001.

Images can be taken at the press of the shutter button 8004. In addition, images can be taken at the touch of the display portion 8002 which serves as a touch panel.

The display device or semiconductor device of one embodiment of the present invention can be used in the display portion 8002.

Figure 54B:
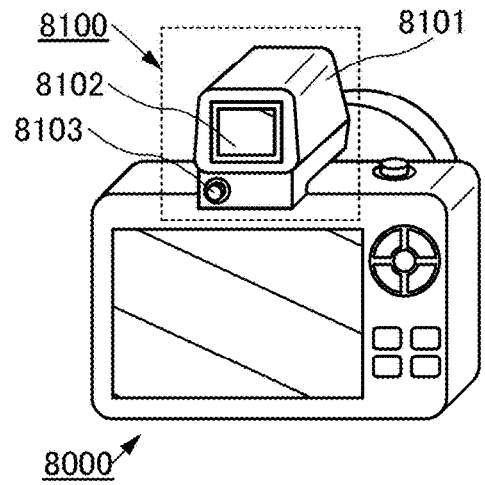

FIG. 54B illustrates the camera 8000 with the finder 8100 connected.

The finder 8100 includes a housing 8101, a display portion 8102, a button 8103, and the like.

The housing 8101 includes a connection portion for engagement with the connection portion 8005 of the camera 8000 so that the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off with the button 8103.

The semiconductor device of one embodiment of the present invention can be used for an integrated circuit and an image sensor included in the housing 8101.

Although the camera 8000 and the finder 8100 are separate and detachable electronic devices in FIGS. 54A and 54B, the housing 8001 of the camera 8000 may include a finder having the display device or input/output device of one embodiment of the present invention.

Figure 54C:
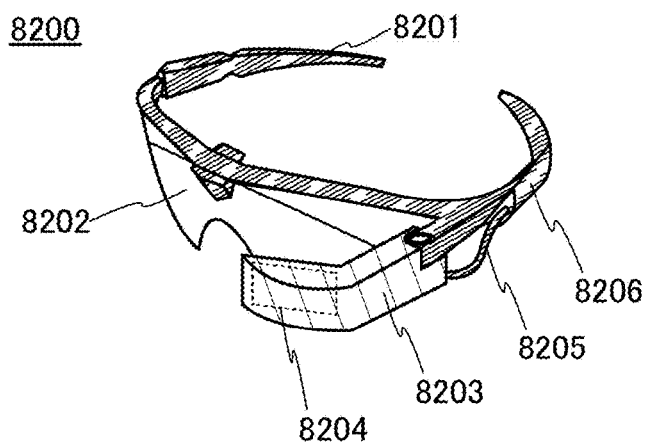

FIG. 54C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user are captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The semiconductor device of one embodiment of the present invention can be used for an integrated circuit included in the main body 8203.

This embodiment can be combined as appropriate with any of the other embodiments in this specification.

Embodiment 11

In this embodiment, application examples of an RF tag using the semiconductor device of one embodiment of the present invention will be described with reference to FIGS. 55A to 55F.

<Application Examples of RF Tag>

Figure 55A:
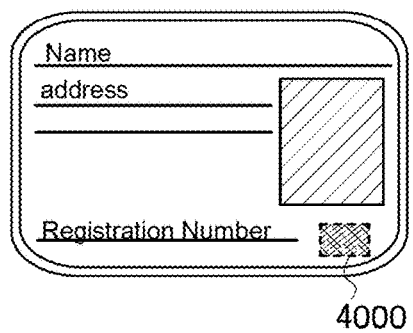
FIGS. 55A to 55F illustrate electronic devices.
Figure 55B:
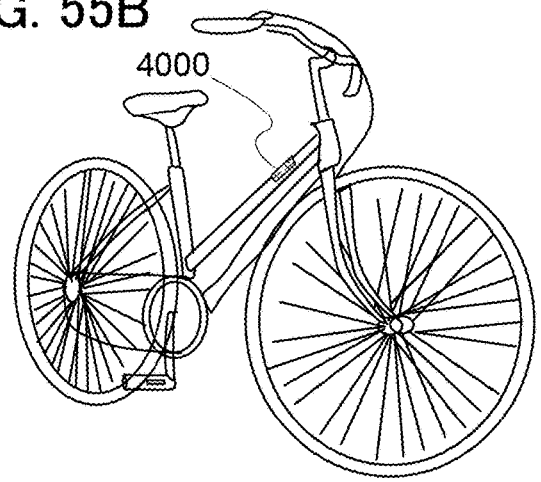
Figure 55C:
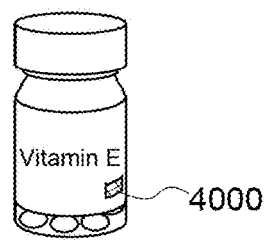
Figure 55D:
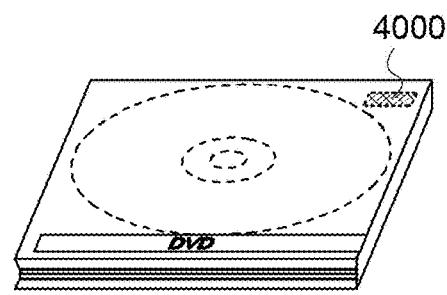
Figure 55E:
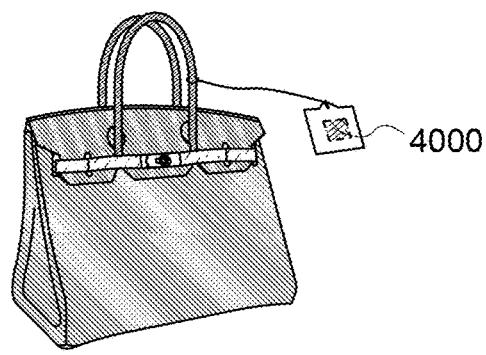
Figure 55F:
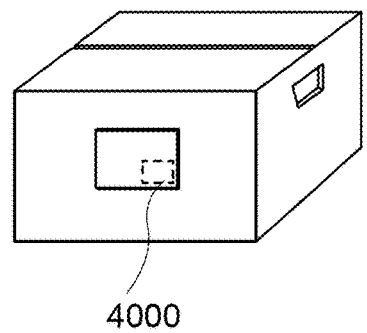

The RF tag is widely used and can be provided for, for example, products such as bills, coins, securities, bearer bonds, documents (e.g., driver's licenses or resident's cards, see FIG. 55A), vehicles (e.g., bicycles, see FIG. 55B), packaging containers (e.g., wrapping paper or bottles, see FIG. 55C), recording media (e.g., DVD or video tapes, see FIG. 55D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 55E and 55F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined as appropriate with any of the other embodiments in this specification.

This application is based on Japanese Patent Application serial no. 2015-032252 filed with Japan Patent Office on Feb. 20, 2015, the entire contents of which are hereby incorporated by reference.

What is claimed is:

1. A semiconductor device comprising:
a first insulating layer;
a first oxide layer over the first insulating layer;
a semiconductor layer over the first oxide layer;
a source electrode layer and a drain electrode layer over the semiconductor layer;
a second insulating layer over the first insulating layer;
a third insulating layer over the second insulating layer, the source electrode layer, and the drain electrode layer;
a second oxide layer over the semiconductor layer;
a gate insulating layer over the second oxide layer;
a gate electrode layer over the gate insulating layer; and
a fourth insulating layer over the third insulating layer, the second oxide layer, the gate insulating layer, and the gate electrode layer,
wherein the second insulating layer includes a region in contact with a first side surface of the first oxide layer, a side surface of the semiconductor layer, a first side surface of the source electrode layer, and a first side surface of the drain electrode layer,
wherein a top surface of the second insulating layer is at the same level as a top surface of the source electrode layer and a top surface of the drain electrode layer, and
wherein the second oxide layer includes a region in contact with a second side surface of the first oxide layer, a second side surface of the source electrode layer, a second side surface of the drain electrode layer, a side surface of the second insulating layer, and a side surface of the third insulating layer.

2. The semiconductor device according to claim 1, wherein one of the first insulating layer, the second insulating layer, the third insulating layer, and the fourth insulating layer contains oxygen.

3. The semiconductor device according to claim 1, wherein one of the first insulating layer, the second insulating layer, the third insulating layer, and the fourth insulating layer comprises silicon oxide.

4. The semiconductor device according claim 1 comprising:
any one of a microphone, a speaker and a housing.

5. The semiconductor device according to claim 1, wherein one of the second insulating film and the third insulating film comprises a low-k material.

6. A method for manufacturing a semiconductor device comprising the steps of:
forming a first insulating layer;
forming a first oxide film over the first insulating layer;
forming a semiconductor film over the first oxide film;
forming a first conductive film over the semiconductor film;
forming a first mask over the first conductive film;
partly etching the first conductive film with the first mask to form a first conductive layer in an island shape;
partly etching the first oxide film and the semiconductor film with the first mask and the first conductive layer serving as a mask to form a first oxide layer and a semiconductor layer in island shapes;
forming a second insulating film over the first insulating layer and the first conductive layer;
performing a chemical mechanical polishing process on the second insulating film until the first conductive layer is exposed to form a second insulating layer;
forming a third insulating film over the first conductive layer and the second insulating layer;
forming a second mask over the third insulating film;
partly etching the third insulating film with the second mask to form a source electrode layer, a drain electrode layer, and a third insulating layer;
forming a second oxide film over the third insulating layer and the semiconductor layer;
forming a fourth insulating film over the second oxide film;
forming a second conductive film over the fourth insulating film; and
performing a chemical mechanical polishing process on the second conductive film, the fourth insulating film, and the second oxide film to form a second oxide layer, a gate insulating layer, and a gate electrode layer.

7. The method for manufacturing a semiconductor device, according to claim 6,
wherein first heat treatment is performed after the semiconductor film is formed,
wherein a fourth insulating layer containing oxygen is formed over the third insulating layer, the second oxide layer, the gate insulating layer, and the gate electrode layer,
wherein a mixed layer of the third insulating layer and the fourth insulating layer is formed when the fourth insulating layer is formed and, at the same time, oxygen is added to the mixed layer or the first insulating layer, and
wherein second heat treatment is performed to diffuse the oxygen added to the mixed layer or the first insulating layer to the semiconductor layer.

8. The method for manufacturing a semiconductor device, according to claim 7,
wherein the third insulating film is an insulating film containing oxygen, and
wherein the fourth insulating layer is formed by a sputtering method with an oxygen gas.

9. The method for manufacturing a semiconductor device, according to claim 7,
wherein the third insulating film is a silicon oxide film, and
wherein the fourth insulating layer is formed by a sputtering method with an oxygen gas of 50 vol % or higher and an aluminum oxide target.

10. The method for manufacturing a semiconductor device, according to claim 7, wherein the second heat treatment is performed at a temperature higher than or equal to 300° C. and lower than or equal to 450° C.

* * * * *